United States Patent
Berry et al.

(10) Patent No.: US 11,463,698 B2
(45) Date of Patent: Oct. 4, 2022

(54) SELECTION OF THE MAXIMUM DYNAMIC RANGE OF TRANSFORMED DATA AND THE DATA PRECISION OF TRANSFORM MATRICES ACCORDING TO THE BIT DEPTH OF INPUT DATA

(71) Applicant: Sony Corporation, Tokyo (JP)

(72) Inventors: David Berry, Surrey (GB); James Alexander Gamei, Surrey (GB); Nicholas Ian Saunders, Hampshire (GB); Karl James Sharman, Newbury (GB)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/130,238

(22) Filed: Sep. 13, 2018

(65) Prior Publication Data

US 2019/0014322 A1     Jan. 10, 2019

Related U.S. Application Data

(63) Continuation of application No. 14/778,445, filed as application No. PCT/GB2014/051064 on Apr. 4, 2014, now Pat. No. 10,097,834.

(30) Foreign Application Priority Data

Apr. 8, 2013  (GB) ...................................... 1306335
Apr. 19, 2013  (GB) ...................................... 1307121
(Continued)

(51) Int. Cl.
*H04N 19/13*     (2014.01)
*H04N 19/93*     (2014.01)
(Continued)

(52) U.S. Cl.
CPC .......... *H04N 19/13* (2014.11); *H03M 7/4037* (2013.01); *H03M 7/4043* (2013.01);
(Continued)

(58) Field of Classification Search
CPC ........ H04N 19/13; H04N 19/93; H04N 19/91; H04N 19/463; H04N 19/124; H04N 19/44;
(Continued)

(56) References Cited

U.S. PATENT DOCUMENTS 5,603,012 A  * 2/1997 Sotheran ............... G06F 9/3867
                                                    712/208
9,473,170 B2    10/2016 George et al.
(Continued)

FOREIGN PATENT DOCUMENTS

CN     102801974 A    11/2012
EP     2 637 405 A1    9/2013
(Continued)

OTHER PUBLICATIONS

Fuldseth, A. et al., "Core transform design for HEVC", Joint Collaborative Team on Video Coding (JCT-VC) of ITU-T SG16 WP3 and ISO/IEC JTC1/SC29/WG11, 6th Meeting, (Jul. 14-22, 2011), 12 Pages, XP030009469.
(Continued)

*Primary Examiner* — Tracy Y. Li
(74) *Attorney, Agent, or Firm* — Oblon, McClelland, Maier & Neustadt, L.L.P.

(57) ABSTRACT

A method of encoding image data, including: frequency-transforming input image data to generate an array of frequency-transformed input image coefficients by a matrix-multiplication process, according to a maximum dynamic range of the transformed data and using transform matrices having a data precision; and selecting the maximum
(Continued)

dynamic range and/or the data precision of the transform matrices according to the bit depth of the input image data.

23 Claims, 24 Drawing Sheets

(30) Foreign Application Priority Data

Jul. 9, 2013 (GB) ..................................... 1312330
Nov. 25, 2013 (GB) ..................................... 1320775

(51) Int. Cl.

| | |
|---|---|
| *H04N 19/91* | (2014.01) |
| *H04N 19/136* | (2014.01) |
| *H04N 19/18* | (2014.01) |
| *H03M 7/40* | (2006.01) |
| *H04N 19/124* | (2014.01) |
| *H04N 19/44* | (2014.01) |
| *H04N 19/463* | (2014.01) |
| *H03M 7/46* | (2006.01) |

(52) U.S. Cl.
CPC ....... *H03M 7/4068* (2013.01); *H03M 7/4087* (2013.01); *H04N 19/124* (2014.11); *H04N 19/136* (2014.11); *H04N 19/18* (2014.11); *H04N 19/44* (2014.11); *H04N 19/463* (2014.11); *H04N 19/91* (2014.11); *H04N 19/93* (2014.11); *H03M 7/40* (2013.01); *H03M 7/46* (2013.01)

(58) Field of Classification Search
CPC ....... H04N 19/18; H04N 19/136; H03M 7/40; H03M 7/46
See application file for complete search history.

(56) References Cited

U.S. PATENT DOCUMENTS

| | | | |
|---|---|---|---|
| 2003/0093452 A1 | 5/2003 | Zhou | |
| 2003/0156652 A1* | 8/2003 | Wise ..................... | G06F 9/3867 375/240.26 |
| 2004/0008769 A1 | 1/2004 | Winger | |
| 2004/0221143 A1 | 11/2004 | Wise | |
| 2011/0229048 A1 | 9/2011 | Ikeda | |
| 2011/0243219 A1* | 10/2011 | Hong ................... | H04N 19/184 375/240.02 |
| 2011/0243232 A1* | 10/2011 | Alshina ................. | H04N 19/98 375/240.16 |
| 2011/0280302 A1* | 11/2011 | Alshina ................. | H04N 19/42 375/240.03 |
| 2013/0003834 A1 | 1/2013 | Rojals et al. | |
| 2013/0223531 A1* | 8/2013 | Garbas ................. | H04N 19/105 375/240.14 |
| 2014/0177707 A1 | 6/2014 | George et al. | |
| 2014/0241418 A1* | 8/2014 | Garbas ................. | H04N 19/176 375/240.02 |
| 2014/0301450 A1* | 10/2014 | Alshina ............... | H04N 19/176 375/240.03 |
| 2015/0172661 A1 | 6/2015 | Dong | |

FOREIGN PATENT DOCUMENTS

| | | |
|---|---|---|
| GB | 2 360 915 A | 10/2001 |
| WO | WO 2010/147436 A2 | 12/2010 |
| WO | WO-2011126283 A2 | 10/2011 |
| WO | WO 2012/172113 A1 | 12/2012 |
| WO | WO 2013/108639 A1 | 7/2013 |

OTHER PUBLICATIONS

Joshi, R.L. et al., "Elimination of clipping before dequantization", Joint Collaborative Team on Video Coding (JCT-VC) of ITU-T SG16 WP3 and ISO/IEC JTC1/SC29/WG11, 9th Meeting, (Apr. 27-May 7, 2012), 5 Pages, XP030112048.
Kerofsky, L., "Dynamic Range Analysis of HEVC/H.265 Inverse Transform Operations", Joint Collaborative Team on Video Coding (JCT-VC) of ITU-T SG16 WP3 and ISO/IEC JTC1/SC29/WG11, 12th Meeting, (Jan. 14-23, 2013), XP030113820.
Sharman, K. et al., "AHG5: Range Extensions and High Bit Depths", Joint Collaborative Team on Video Coding (JCT-VC) of ITU-T SG16 WP3 and ISO/IEC JTC1/SC29/WG11, 13th Meeting, (Apr. 18-26, 2013), XP030114135.
Chen, J. et al., "Image Coding Based on Wavelet Transform and Uniform Scalar Dead Zone Quantizer", Sciencedirect, Signal Processing: Image Communication, vol. 21, (2006), pp. 562-572.
Office Action dated Nov. 29, 2016 in Japanese Patent Application No. 2016-507050 (submitting English translation only).
Benjamin Bross, et al., High Efficiency Video Coding (HEVC) text specification draft 10 (for FDIS & Last Call), Joint Collaborative Team on Video Coding (JCT-VC) of ITU-T SG 16 WP 3 and ISO/IEC JTC 1/SC 29/WG 11, Jan. 14-23, 2013, 310 pages.
Office Action dated Dec. 27, 2016 in Japanese Patent Application No. 2016-507049 (submitting English language translation only).
Pankaj Topiwala, et al., "14-Bit Support in the Advanced 4:4:4 Profile(s)" JVT of ISO/IEC MPEG & ITU-T VCEG (ISO/IEC JTC1/SC29/WG11 and ITU-TSG16 Q.6), VCEG JVT-Q037, Oct. 14-21, 2005, pp. 1-7.
Antti Hallapuro, et al., "Low Complexity Transform and Quantization— Part II: Extensions" JVT of ISO/IEC MPEG & ITU-T VCEG (ISO/IEC JTC1/SC29/WG11 and ITU-T SG16 Q.6), JVT-B039, Jan. 29-Feb. 1, 2002, pp. 1-15.
Joel Sole, et al., "Transform Coefficient Coding in HEVC" IEEE Transactions on Circuits and Systems for Video Technology, vol. 22, No. 12, Dec. 2012, pp. 1765-1777.
Jianle Chen, et al., "Non-CE1: throughput improvement on CABAC coefficients level coding" Joint Collaborative Team on Video Coding (JCT-VC) of ITU-T SG16 WP3 and ISO/IEC JTC1/SC29/WG11, JCTVC-H0554, Feb. 1-10, 2012, pp. 1-13.
Vadim Seregin, et al., "Binarisation modification for last position coding" Joint Collaborative Team on Video Coding (JCT-VC) of ITU-T SG16 WP3 and ISO/IEC JTC1/SC29/WG11, JCTVC-F375, Jul. 14-22, 2011, pp. 1-8.
K. Sharman, et al., "CABAC Packet-based Stream" Joint Collaborative Team on Video Coding (JCT-VC) of ITU-T SG16 WP3 and ISO/IEC JTC1/SC29/WG11, JCTVC-G494, Nov. 21-30, 2011, pp. 1-6.
A. Fuldseth, et al., "CE10: Core transform design for HEVC" Joint Collaborative Team on Video Coding (JCT-VC) of ITU-T SG16 WP3 and ISO/IEC JTC1/SC29/WG11, JCTVC-G495, Nov. 21-30, 2011, pp. 1-10.
K. Sharman, et al., "CABAC with Arithmetic Context Variables" Joint Collaborative Team on Video Coding (JCT-VC) of ITU-TSG16 WP3 and ISO/IEC JTC1/SC29/WG11, JCTVC-G501, Nov. 21-30, 2011, pp. 1-8.
K. Sharman, et al., "CABAC Stream Termination" Joint Collaborative Team on Video Coding (JCT-VC) of ITU-T SG16 WP3 and ISO/IEC JTC1/SC29/WG11, JCTVC-G493, Nov. 21-30, 2011, pp. 1-4.
Office Action dated Apr. 25, 2017 in European Patent Application No. 14 716 391.9.
K. Sharman et al., "AHG5: Range Extensions and High Bit Depths", Joint Collaborative Team on Video Coding (JCT-VC) of ITU-T SG 16 WP 3 and ISO/IEC JTC 1/SC 29/WG 11, 13th Meeting, XP030114135, Apr. 2013, pp. 1-21.
K. Misra et al., "AHG7: New Results for guaranteeing 16-bit inverse transform dynamic range", Joint Collaborative Team on Video Coding (JCT-VC) of ITU-T SG16 WP3 and ISO/IEC JTC1/SC29/WG11, 7th Meeting, XP030110849, Nov. 2011, pp. 1-6.
Office Action dated Nov. 24, 2017 in corresponding Japanese Patent Application No. 2016-507049 (English Translation only), citing document AX therein, 7 pages.
Minhua Zhou, "AHG22: Sample-based Angular Prediction (SAP) for HEVC Lossless Coding", Joint Collaborative Team on Video

(56) References Cited

OTHER PUBLICATIONS

Coding (JCT-VC) of ITU-T SG16 WP3 and ISO/IEC JTC1/SC29/WG11, JCTVC-G093, Nov. 19-30, 2011, pp. 1-12.

J. Sole et al., "CE11: Parallel Context Processing for the Significance Map in High Coding Efficiency", Document: JCTVC-E338, Joint Collaborative Team on Video Coding (JCT-VC) of ITU-T SG16 WP3 and ISO/IEC JTC1/SC29/WG11, 5th Meeting: Geneva, CH, Mar. 16-23, 2011, 4 pages.

Kazuo Sugimoto et al., "AHGS: Max Exponential Golomb Code for Reducing Number of Bins", Document: JCTVC-J0194, Joint Collaborative Team on Video Coding (JCT-VC) of ITU-T SG 16 WP 3 and ISO/IEC JTC 1/SC 29/WG 11, 10th Meeting: Stockholm, SE, Jul. 11-20, 2012, 7 pages.

IEEE international Symposium on Broadband Multimedia Systems and Broadcasting,Jun. 29, 2012,Jongbin Park, Byeungwoo Jeon, "Parallel Transform Domain Wyner-Ziv Video Encoding Scheme for Standard Definition Video", Full Text.

Opto-Electronic Engineering,Jun. 15, 2012,Li Qi-hui; Ren Guo-qiang; Wu Qin-zhang; Xu Yong-gang; "High-resolution Aerial Image Compression Based on Technology of the Rate Pre-allocation", Full Text.

\* cited by examiner

| Profile | Chroma Formats | | | | Maximum bitDepth | Prediction | | Transform Matrix Precision | MAX_TR_DYNAMIC_RANGE | ENTROPY_CODING_DYNAMIC_RANGE | CABAC Fixed Bits and Bit Alignment | Profiles Also Supported |
|---|---|---|---|---|---|---|---|---|---|---|---|---|
| | 4:0:0 | 4:2:0 | 4:2:2 | 4:4:4 | | Intra | Inter | | | | | |
| Main* | ✗ | ✓ | ✗ | ✗ | 8 | ✓ | ✓ | 6 | 15 | 15 | ✗ | None |
| Main10* | ✗ | ✓ | ✗ | ✗ | 10 | ✓ | ✓ | 6 | 15 | 15 | ✗ | Main |
| Main10 4:0:0 | ✓ | ✗ | ✗ | ✗ | 10 | ✓ | ✓ | 6 | 15 | 15 | ✗ | None |
| Main10 4:2:2 | ✓ | ✓ | ✓ | ✗ | 10 | ✓ | ✓ | 6 | 15 | 15 | ✗ | Main10, Main 10 4:0:0 |
| Main10 4:4:4 | ✓ | ✓ | ✓ | ✓ | 10 | ✓ | ✓ | 6 | 15 | 15 | ✗ | Main10 4:2:2 |
| Extended 4:2:2 | ✓ | ✓ | ✓ | ✗ | 12 | ✓ | ✓ | 10 | 17 | 18 | ✓ | Main10 4:2:2 |
| Extended 4:4:4 | ✓ | ✓ | ✓ | ✓ | 12 | ✓ | ✓ | 10 | 17 | 18 | ✓ | Extended 4:2:2, Main 10 4:4:4 |
| High Intra 4:0:0 | ✓ | ✗ | ✗ | ✗ | 16 | ✓ | ✗ | 14 | 21 | 22 | ✓ | None |
| High Intra 4:4:4 | ✓ | ✓ | ✓ | ✓ | 16 | ✓ | ✗ | 14 | 21 | 22 | ✓ | High Intra 4:0:0 |
| High 4:0:0 | ✓ | ✗ | ✗ | ✗ | 16 | ✓ | ✓ | 14 | 21 | 22 | ✓ | Main10 4:0:0, High Intra 4:0:0 |
| High 4:4:4 | ✓ | ✓ | ✓ | ✓ | 16 | ✓ | ✓ | 14 | 21 | 22 | ✓ | Extended 4:4:4, High Intra 4:4:4 |

FIG. 28

SELECTION OF THE MAXIMUM DYNAMIC RANGE OF TRANSFORMED DATA AND THE DATA PRECISION OF TRANSFORM MATRICES ACCORDING TO THE BIT DEPTH OF INPUT DATA

CROSS REFERENCE TO RELATED APPLICATIONS

This application is a Continuation of U.S. application Ser. No. 14/778,445, filed Sep. 18, 2015, which is a National Stage of PCT/GB2014/051064, filed Apr. 4, 2014, and claims the benefit of priority under 35 U.S.C. § 119 of British Application Nos. 1306335.9, filed Apr. 8, 2013, 1307121.2, filed Apr. 19, 2013, 1312330.2, filed Jul. 9, 2013, 1320775.8, filed Nov. 25, 2013. The entire contents of each of the above applications are incorporated herein by reference.

FIELD OF THE INVENTION

This disclosure relates to data encoding and decoding.

DESCRIPTION OF THE RELATED ART

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present disclosure.

There are several video data compression and decompression systems which involve transforming video data into a frequency domain representation, quantising the frequency domain coefficients and then applying some form of entropy encoding to the quantised coefficients.

Entropy, in the present context, can be considered as representing the information content of a data symbol or series of symbols. The aim of entropy encoding is to encode a series of data symbols in a lossless manner using (ideally) the smallest number of encoded data bits which are necessary to represent the information content of that series of data symbols. In practice, entropy encoding is used to encode the quantised coefficients such that the encoded data is smaller (in terms of its number of bits) than the data size of the original quantised coefficients. A more efficient entropy encoding process gives a smaller output data size for the same input data size.

One technique for entropy encoding video data is the so-called CABAC (context adaptive binary arithmetic coding) technique.

SUMMARY

This disclosure provides a data encoding method according to claim 1.

Further respective aspects and features are defined in the appended claims.

It is to be understood that both the foregoing general description and the following detailed description are exemplary, but not restrictive of, the present disclosure.

BRIEF DESCRIPTION OF THE DRAWINGS

A more complete appreciation of the disclosure and many of the attendant advantages thereof will be readily obtained as the same becomes better understood by reference to the following detailed description of embodiments, when considered in connection with the accompanying drawings, wherein:

FIG. 28 is a table providing examples of encoding profiles;

DESCRIPTION OF THE EMBODIMENTS

Figure 1:
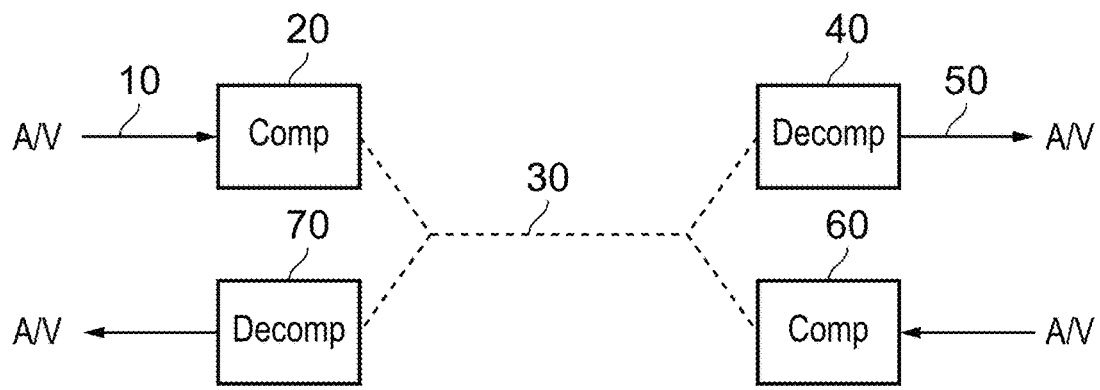
FIG. 1 schematically illustrates an audio/video (A/V) data transmission and reception system using video data compression and decompression.

Referring now to the drawings, FIGS. 1-4 are provided to give schematic illustrations of apparatus or systems making use of the compression and/or decompression apparatus to be described below in connection with embodiments.

All of the data compression and/or decompression apparatus is to be described below may be implemented in hardware, in software running on a general-purpose data processing apparatus such as a general-purpose computer, as programmable hardware such as an application specific integrated circuit (ASIC) or field programmable gate array (FPGA) or as combinations of these. In cases where the embodiments are implemented by software and/or firmware, it will be appreciated that such software and/or firmware, and non-transitory machine-readable data storage media by which such software and/or firmware are stored or otherwise provided, are considered as embodiments.

FIG. 1 schematically illustrates an audio/video data transmission and reception system using video data compression and decompression.

An input audio/video signal 10 is supplied to a video data compression apparatus 20 which compresses at least the video component of the audio/video signal 10 for transmission along a transmission route 30 such as a cable, an optical fibre, a wireless link or the like. The compressed signal is processed by a decompression apparatus 40 to provide an output audio/video signal 50. For the return path, a compression apparatus 60 compresses an audio/video signal for transmission along the transmission route 30 to a decompression apparatus 70.

The compression apparatus 20 and decompression apparatus 70 can therefore form one node of a transmission link. The decompression apparatus 40 and decompression apparatus 60 can form another node of the transmission link. Of course, in instances where the transmission link is uni-directional, only one of the nodes would require a compression apparatus and the other node would only require a decompression apparatus.

Figure 2:
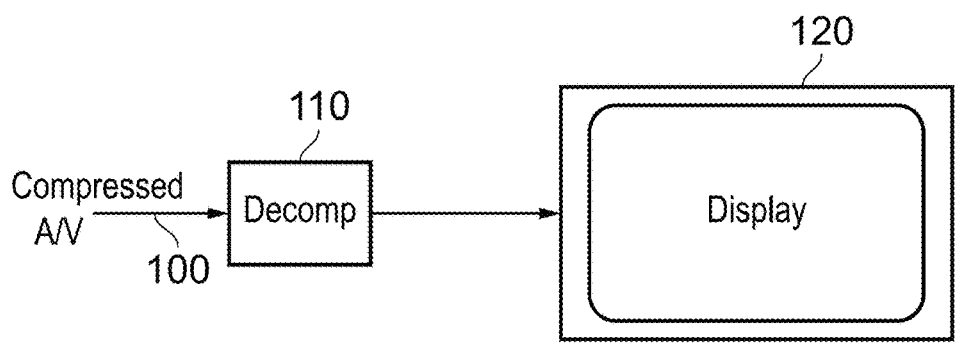
FIG. 2 schematically illustrates a video display system using video data decompression.

FIG. 2 schematically illustrates a video display system using video data decompression. In particular, a compressed audio/video signal 100 is processed by a decompression apparatus 110 to provide a decompressed signal which can be displayed on a display 120. The decompression apparatus 110 could be implemented as an integral part of the display 120, for example being provided within the same casing as the display device. Alternatively, the decompression apparatus 110 might be provided as (for example) a so-called set top box (STB), noting that the expression "set-top" does not imply a requirement for the box to be sited in any particular orientation or position with respect to the display 120; it is simply a term used in the art to indicate a device which is connectable to a display as a peripheral device.

Figure 3:
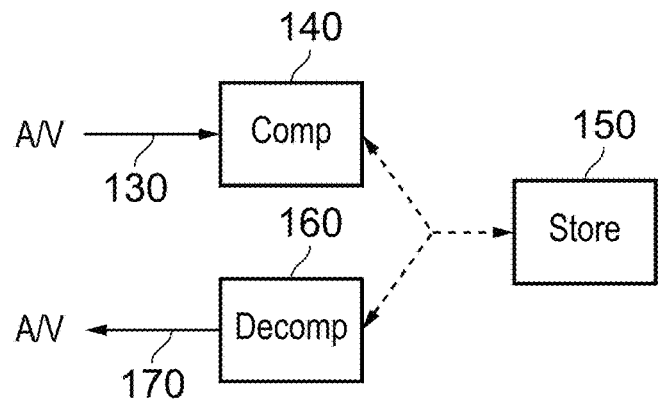
FIG. 3 schematically illustrates an audio/video storage system using video data compression and decompression.

FIG. 3 schematically illustrates an audio/video storage system using video data compression and decompression. An input audio/video signal 130 is supplied to a compression apparatus 140 which generates a compressed signal for storing by a store device 150 such as a magnetic disk device, an optical disk device, a magnetic tape device, a solid state storage device such as a semiconductor memory or other storage device. For replay, compressed data is read from the store device 150 and passed to a decompression apparatus 160 for decompression to provide an output audio/video signal 170.

It will be appreciated that the compressed or encoded signal, and a storage medium or data carrier storing that signal, are considered as embodiments.

Figure 4:
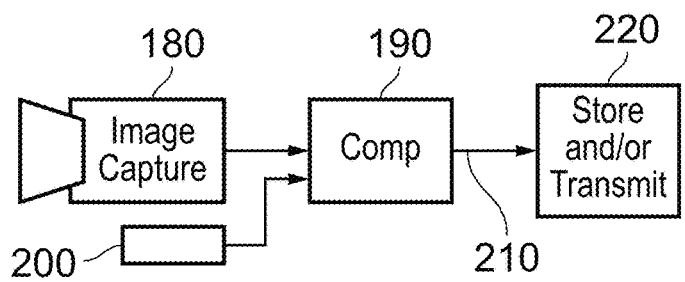
FIG. 4 schematically illustrates a video camera using video data compression.

FIG. 4 schematically illustrates a video camera using video data compression. In FIG. 4, and image capture device 180, such as a charge coupled device (CCD) image sensor and associated control and read-out electronics, generates a video signal which is passed to a compression apparatus 190. A microphone (or plural microphones) 200 generates an audio signal to be passed to the compression apparatus 190. The compression apparatus 190 generates a compressed audio/video signal 210 to be stored and/or transmitted (shown generically as a schematic stage 220).

The techniques to be described below relate primarily to video data compression. It will be appreciated that many existing techniques may be used for audio data compression in conjunction with the video data compression techniques which will be described, to generate a compressed audio/video signal. Accordingly, a separate discussion of audio data compression will not be provided. It will also be appreciated that the data rate associated with video data, in particular broadcast quality video data, is generally very much higher than the data rate associated with audio data (whether compressed or uncompressed). It will therefore be appreciated that uncompressed audio data could accompany compressed video data to form a compressed audio/video signal. It will further be appreciated that although the present examples (shown in FIGS. 1-4) relate to audio/video data, the techniques to be described below can find use in a system which simply deals with (that is to say, compresses, decompresses, stores, displays and/or transmits) video data. That is to say, the embodiments can apply to video data compression without necessarily having any associated audio data handling at all.

Figure 5:
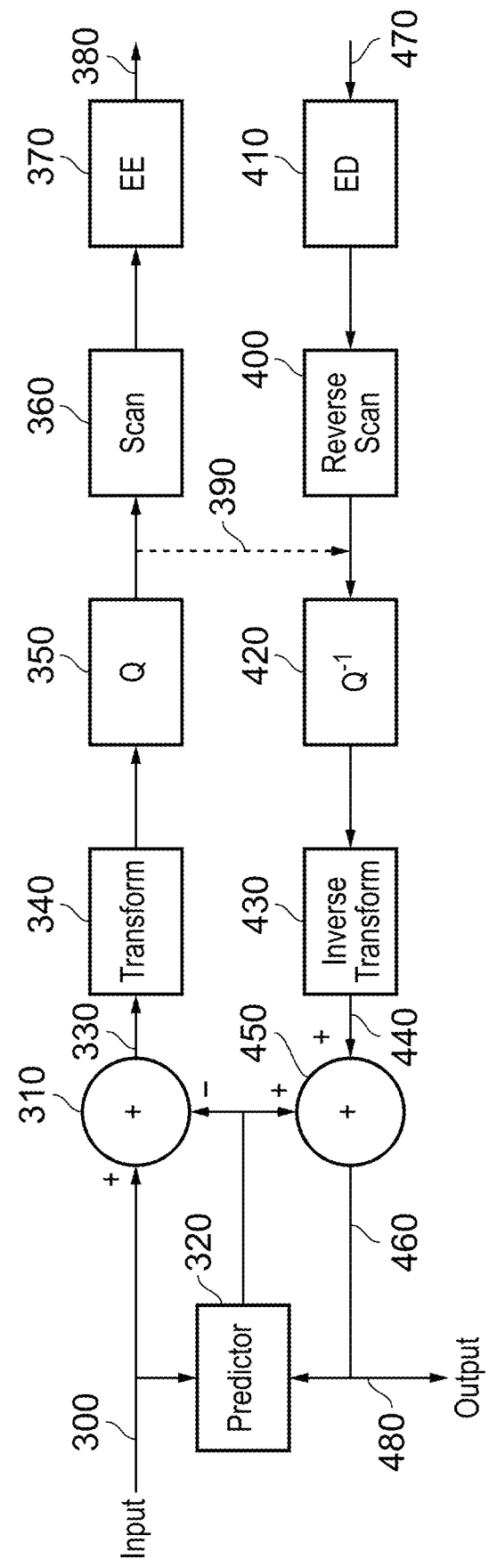
FIG. 5 provides a schematic overview of a video data compression and decompression apparatus.

FIG. 5 provides a schematic overview of a video data compression and decompression apparatus.

Successive images of an input video signal 300 are supplied to an adder 310 and to an image predictor 320. The image predictor 320 will be described below in more detail with reference to FIG. 6. The adder 310 in fact performs a subtraction (negative addition) operation, in that it receives the input video signal 300 on a "+" input and the output of the image predictor 320 on a "−" input, so that the predicted image is subtracted from the input image. The result is to generate a so-called residual image signal 330 representing the difference between the actual and projected images.

One reason why a residual image signal is generated is as follows. The data coding techniques to be described, that is to say the techniques which will be applied to the residual image signal, tends to work more efficiently when there is less "energy" in the image to be encoded. Here, the term "efficiently" refers to the generation of a small amount of encoded data; for a particular image quality level, it is desirable (and considered "efficient") to generate as little data as is practicably possible. The reference to "energy" in the residual image relates to the amount of information contained in the residual image. If the predicted image were to be identical to the real image, the difference between the two (that is to say, the residual image) would contain zero information (zero energy) and would be very easy to encode into a small amount of encoded data. In general, if the prediction process can be made to work reasonably well, the expectation is that the residual image data will contain less information (less energy) than the input image and so will be easier to encode into a small amount of encoded data.

The residual image data 330 is supplied to a transform unit 340 which generates a discrete cosine transform (DCT) representation of the residual image data. The DCT technique itself is well known and will not be described in detail here. There are however aspects of the techniques used in the present apparatus which will be described in more detail below, in particular relating to the selection of different blocks of data to which the DCT operation is applied. These will be discussed with reference to FIGS. 7-12 below.

Note that in some embodiments, a discrete sine transform (DST) is used instead of a DCT. In other embodiments, no transform might be used. This can be done selectively, so that the transform stage is, in effect, bypassed, for example under the control of a "transform skip" command or mode.

The output of the transform unit 340, which is to say, a set of transform coefficients for each transformed block of image data, is supplied to a quantiser 350. Various quantisation techniques are known in the field of video data compression, ranging from a simple multiplication by a quantisation scaling factor through to the application of complicated lookup tables under the control of a quantisation parameter. The general aim is twofold. Firstly, the quantisation process reduces the number of possible values of the transformed data. Secondly, the quantisation process can increase the likelihood that values of the transformed data are zero. Both of these can make the entropy encoding process, to be described below, work more efficiently in generating small amounts of compressed video data.

A data scanning process is applied by a scan unit 360. The purpose of the scanning process is to reorder the quantised transformed data so as to gather as many as possible of the non-zero quantised transformed coefficients together, and of course therefore to gather as many as possible of the zero-valued coefficients together. These features can allow so-called run-length coding or similar techniques to be applied efficiently. So, the scanning process involves selecting coefficients from the quantised transformed data, and in particular from a block of coefficients corresponding to a block of image data which has been transformed and quantised, according to a "scanning order" so that (a) all of the coefficients are selected once as part of the scan, and (b) the scan tends to provide the desired reordering. Techniques for selecting a scanning order will be described below. One example scanning order which can tend to give useful results is a so-called zigzag scanning order.

The scanned coefficients are then passed to an entropy encoder (EE) 370. Again, various types of entropy encoding may be used. Two examples which will be described below are variants of the so-called CABAC (Context Adaptive Binary Arithmetic Coding) system and variants of the so-called CAVLC (Context Adaptive Variable-Length Coding) system. In general terms, CABAC is considered to provide a better efficiency, and in some studies has been shown to provide a 10-20% reduction in the quantity of encoded output data for a comparable image quality compared to CAVLC. However, CAVLC is considered to represent a much lower level of complexity (in terms of its implementation) than CABAC. The CABAC technique will be discussed with reference to FIG. 17 below, and the CAVLC technique will be discussed with reference to FIGS. 18 and 19 below.

Note that the scanning process and the entropy encoding process are shown as separate processes, but in fact can be combined or treated together. That is to say, the reading of data into the entropy encoder can take place in the scan order. Corresponding considerations apply to the respective inverse processes to be described below.

The output of the entropy encoder 370, along with additional data (mentioned above and/or discussed below), for example defining the manner in which the predictor 320 generated the predicted image, provides a compressed output video signal 380.

However, a return path is also provided because the operation of the predictor 320 itself depends upon a decompressed version of the compressed output data.

The reason for this feature is as follows. At the appropriate stage in the decompression process (to be described below) a decompressed version of the residual data is generated. This decompressed residual data has to be added to a predicted image to generate an output image (because the original residual data was the difference between the input image and a predicted image). In order that this process is comparable, as between the compression side and the decompression side, the predicted images generated by the predictor 320 should be the same during the compression process and during the decompression process. Of course, at decompression, the apparatus does not have access to the original input images, but only to the decompressed images. Therefore, at compression, the predictor 320 bases its prediction (at least, for inter-image encoding) on decompressed versions of the compressed images.

The entropy encoding process carried out by the entropy encoder 370 is considered to be "lossless", which is to say that it can be reversed to arrive at exactly the same data which was first supplied to the entropy encoder 370. So, the return path can be implemented before the entropy encoding stage. Indeed, the scanning process carried out by the scan unit 360 is also considered lossless, but in the present embodiment the return path 390 is from the output of the quantiser 350 to the input of a complimentary inverse quantiser 420.

In general terms, an entropy decoder 410, the reverse scan unit 400, an inverse quantiser 420 and an inverse transform unit 430 provide the respective inverse functions of the entropy encoder 370, the scan unit 360, the quantiser 350 and the transform unit 340. For now, the discussion will continue through the compression process; the process to decompress an input compressed video signal will be discussed separately below.

In the compression process, the scanned coefficients are passed by the return path 390 from the quantiser 350 to the inverse quantiser 420 which carries out the inverse operation of the scan unit 360. An inverse quantisation and inverse transformation process are carried out by the units 420, 430 to generate a compressed-decompressed residual image signal 440.

The image signal 440 is added, at an adder 450, to the output of the predictor 320 to generate a reconstructed output image 460. This forms one input to the image predictor 320, as will be described below.

Turning now to the process applied to a received compressed video signal 470, the signal is supplied to the entropy decoder 410 and from there to the chain of the reverse scan unit 400, the inverse quantiser 420 and the inverse transform unit 430 before being added to the output of the image predictor 320 by the adder 450. In straightforward terms, the output 460 of the adder 450 forms the output decompressed video signal 480. In practice, further filtering may be applied before the signal is output.

Figure 6:
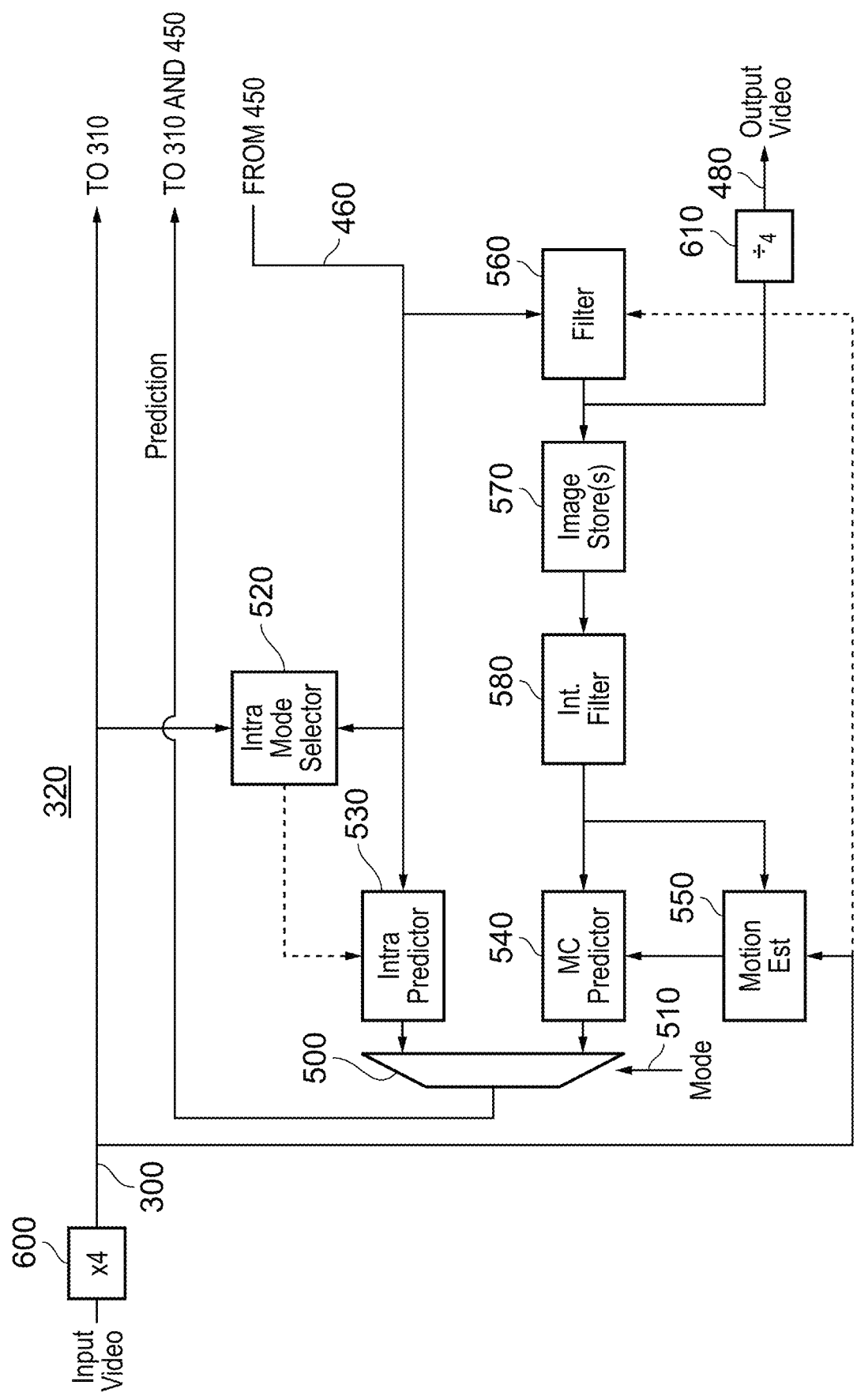
FIG. 6 schematically illustrates the generation of predicted images.
Figure 7:
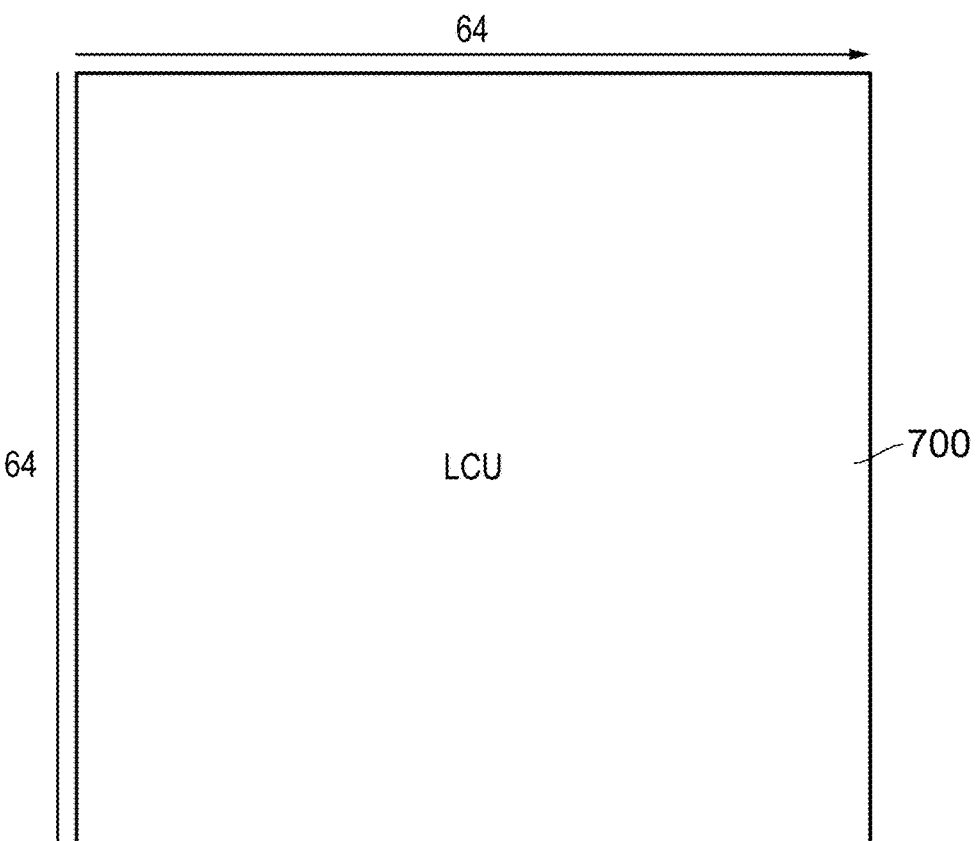
FIG. 7 schematically illustrates a largest coding unit (LCU)

FIG. 6 schematically illustrates the generation of predicted images, and in particular the operation of the image predictor 320.

There are two basic modes of prediction: so-called intra-image prediction and so-called inter-image, or motion-compensated (MC), prediction.

Intra-image prediction bases a prediction of the content of a block of the image on data from within the same image. This corresponds to so-called I-frame encoding in other video compression techniques. In contrast to I-frame encoding, where the whole image is intra-encoded, in the present embodiments the choice between intra- and inter-encoding can be made on a block-by-block basis, though in other embodiments the choice is still made on an image-by-image basis.

Motion-compensated prediction makes use of motion information which attempts to define the source, in another adjacent or nearby image, of image detail to be encoded in the current image. Accordingly, in an ideal example, the contents of a block of image data in the predicted image can be encoded very simply as a reference (a motion vector) pointing to a corresponding block at the same or a slightly different position in an adjacent image.

Returning to FIG. 6, two image prediction arrangements (corresponding to intra- and inter-image prediction) are shown, the results of which are selected by a multiplexer 500 under the control of a mode signal 510 so as to provide blocks of the predicted image for supply to the adders 310 and 450. The choice is made in dependence upon which selection gives the lowest "energy" (which, as discussed above, may be considered as information content requiring encoding), and the choice is signalled to the encoder within the encoded output datastream. Image energy, in this context, can be detected, for example, by carrying out a trial subtraction of an area of the two versions of the predicted image from the input image, squaring each pixel value of the difference image, summing the squared values, and identifying which of the two versions gives rise to the lower mean squared value of the difference image relating to that image area.

The actual prediction, in the intra-encoding system, is made on the basis of image blocks received as part of the signal 460, which is to say, the prediction is based upon encoded-decoded image blocks in order that exactly the same prediction can be made at a decompression apparatus. However, data can be derived from the input video signal 300 by an intra-mode selector 520 to control the operation of the intra-image predictor 530.

For inter-image prediction, a motion compensated (MC) predictor 540 uses motion information such as motion vectors derived by a motion estimator 550 from the input video signal 300. Those motion vectors are applied to a processed version of the reconstructed image 460 by the motion compensated predictor 540 to generate blocks of the inter-image prediction.

The processing applied to the signal 460 will now be described. Firstly, the signal is filtered by a filter unit 560. This involves applying a "deblocking" filter to remove or at least tend to reduce the effects of the block-based processing carried out by the transform unit 340 and subsequent operations. Also, an adaptive loop filter is applied using coefficients derived by processing the reconstructed signal 460 and the input video signal 300. The adaptive loop filter is a type of filter which, using known techniques, applies adaptive filter coefficients to the data to be filtered. That is to say, the filter coefficients can vary in dependence upon various factors. Data defining which filter coefficients to use is included as part of the encoded output datastream.

The filtered output from the filter unit 560 in fact forms the output video signal 480. It is also buffered in one or more image stores 570; the storage of successive images is a requirement of motion compensated prediction processing, and in particular the generation of motion vectors. To save on storage requirements, the stored images in the image stores 570 may be held in a compressed form and then decompressed for use in generating motion vectors. For this particular purpose, any known compression/decompression system may be used. The stored images are passed to an interpolation filter 580 which generates a higher resolution version of the stored images; in this example, intermediate samples (sub-samples) are generated such that the resolution of the interpolated image is output by the interpolation filter 580 is 8 times (in each dimension) that of the images stored in the image stores 570. The interpolated images are passed as an input to the motion estimator 550 and also to the motion compensated predictor 540.

In embodiments, a further optional stage is provided, which is to multiply the data values of the input video signal by a factor of four using a multiplier 600 (effectively just shifting the data values left by two bits), and to apply a corresponding divide operation (shift right by two bits) at the output of the apparatus using a divider or right-shifter 610. So, the shifting left and shifting right changes the data purely for the internal operation of the apparatus. This measure can provide for higher calculation accuracy within the apparatus, as the effect of any data rounding errors is reduced.

The way in which an image is partitioned for compression processing will now be described. At a basic level, and image to be compressed is considered as an array of blocks of samples. For the purposes of the present discussion, the largest such block under consideration is a so-called largest coding unit (LCU) 700 (FIG. 7), which represents a square array of 64×64 samples. Here, the discussion relates to luminance samples. Depending on the chrominance mode, such as 4:4:4, 4:2:2, 4:2:0 or 4:4:4:4 (GBR plus key data), there will be differing numbers of corresponding chrominance samples corresponding to the luminance block.

Three basic types of blocks will be described: coding units, prediction units and transform units. In general terms, the recursive subdividing of the LCUs allows an input picture to be partitioned in such a way that both the block sizes and the block coding parameters (such as prediction or residual coding modes) can be set according to the specific characteristics of the image to be encoded.

Figure 8:
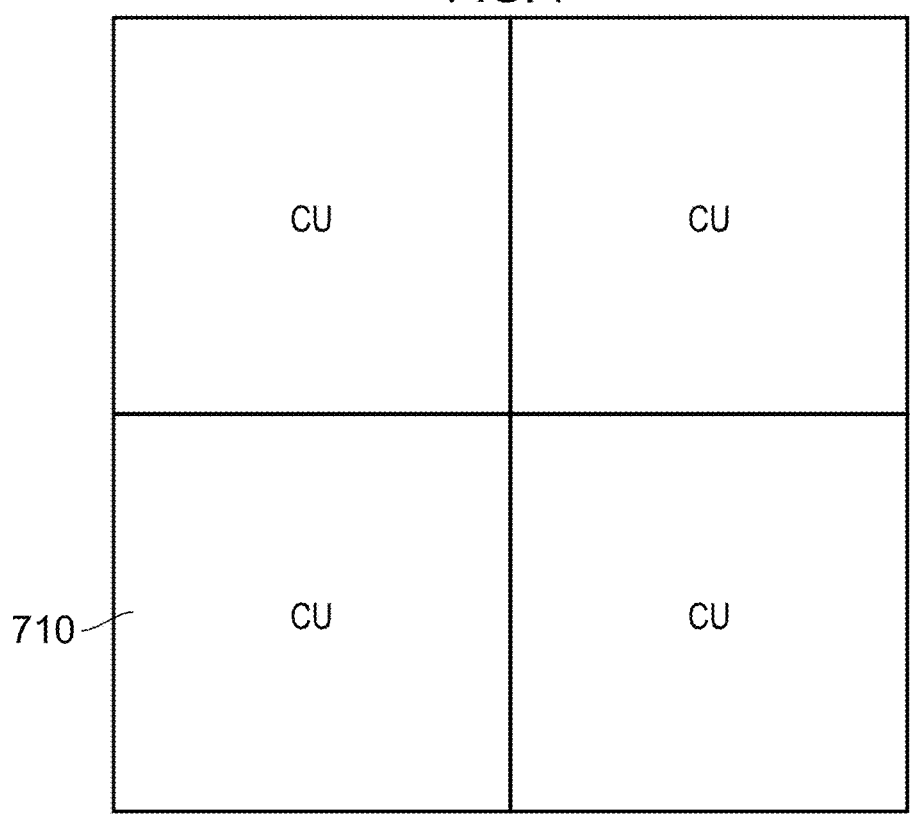
FIG. 8 schematically illustrates a set of four coding units (CU)
Figure 9:
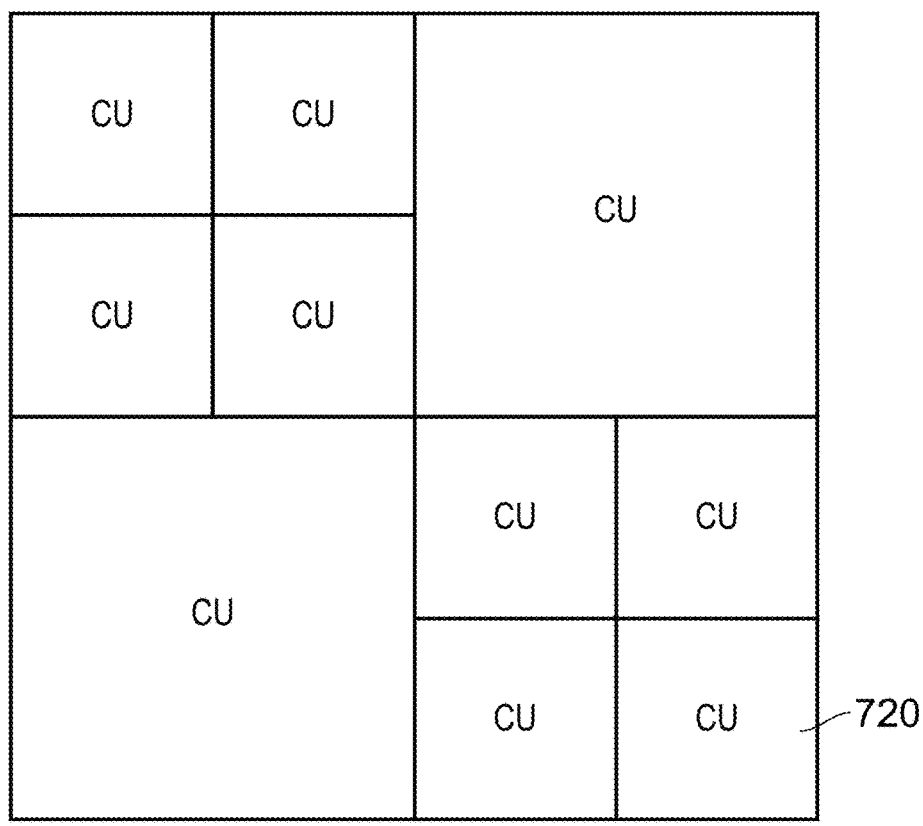
FIGS. 9 and 10 schematically illustrate the coding units of FIG. 8 sub-divided into smaller coding units.
Figure 10:
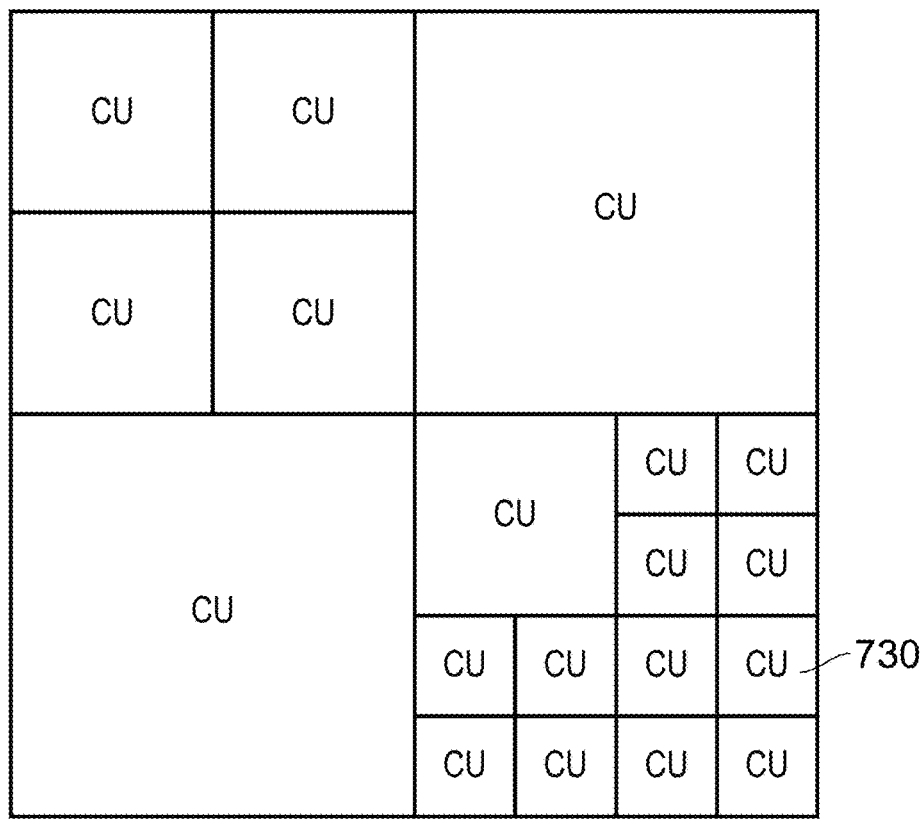

The LCU may be subdivided into so-called coding units (CU). Coding units are always square and have a size between 8×8 samples and the full size of the LCU 700. The coding units can be arranged as a kind of tree structure, so that a first subdivision may take place as shown in FIG. 8, giving coding units 710 of 32×32 samples; subsequent subdivisions may then take place on a selective basis so as to give some coding units 720 of 16×16 samples (FIG. 9) and potentially some coding units 730 of 8×8 samples (FIG. 10). Overall, this process can provide a content-adapting coding tree structure of CU blocks, each of which may be as large as the LCU or as small as 8×8 samples. Encoding of the output video data takes place on the basis of the coding unit structure.

Figure 11:
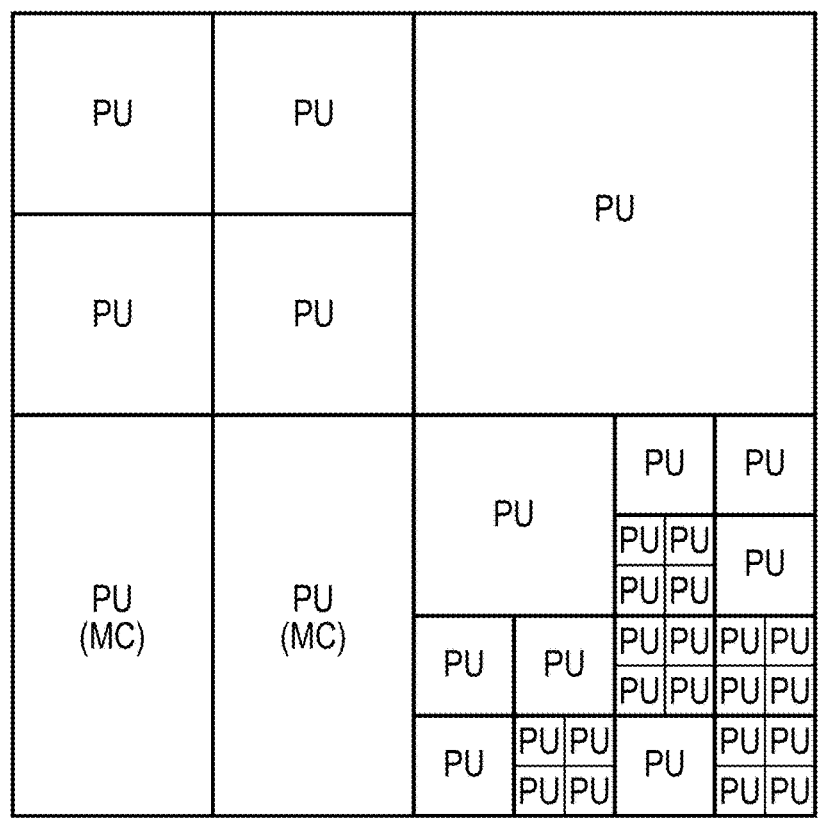
FIG. 11 schematically illustrates an array of prediction units (PU)

FIG. 11 schematically illustrates an array of prediction units (PU). A prediction unit is a basic unit for carrying information relating to the image prediction processes, or in other words the additional data added to the entropy encoded residual image data to form the output video signal from the apparatus of FIG. 5. In general, prediction units are not restricted to being square in shape. They can take other shapes, in particular rectangular shapes forming half of one of the square coding units, as long as the coding unit is greater than the minimum (8×8) size. The aim is to allow the boundary of adjacent prediction units to match (as closely as possible) the boundary of real objects in the picture, so that different prediction parameters can be applied to different real objects. Each coding unit may contain one or more prediction units.

Figure 12:
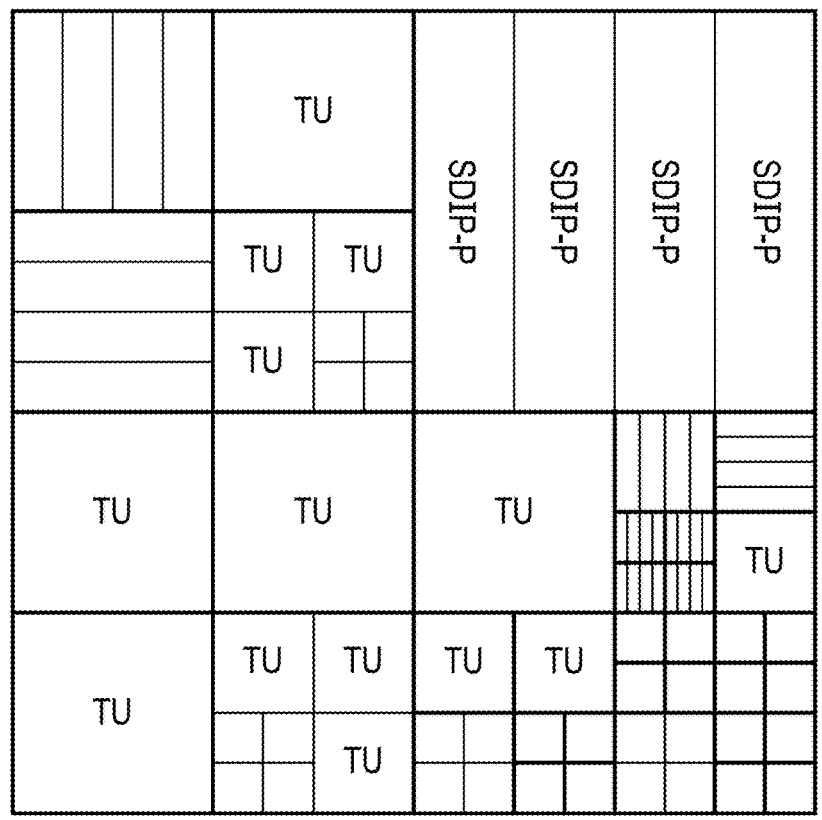
FIG. 12 schematically illustrates an array of transform units (TU)

FIG. 12 schematically illustrates an array of transform units (TU). A transform unit is a basic unit of the transform and quantisation process. Transform units are always square and can take a size from 4×4 up to 32×32 samples. Each coding unit can contain one or more transform units. The acronym SDIP-P in FIG. 12 signifies a so-called short distance intra-prediction partition. In this arrangement only one dimensional transforms are used, so a 4×N block is passed through N transforms with input data to the transforms being based upon the previously decoded neighbouring blocks and the previously decoded neighbouring lines within the current SDIP-P.

Figure 13:
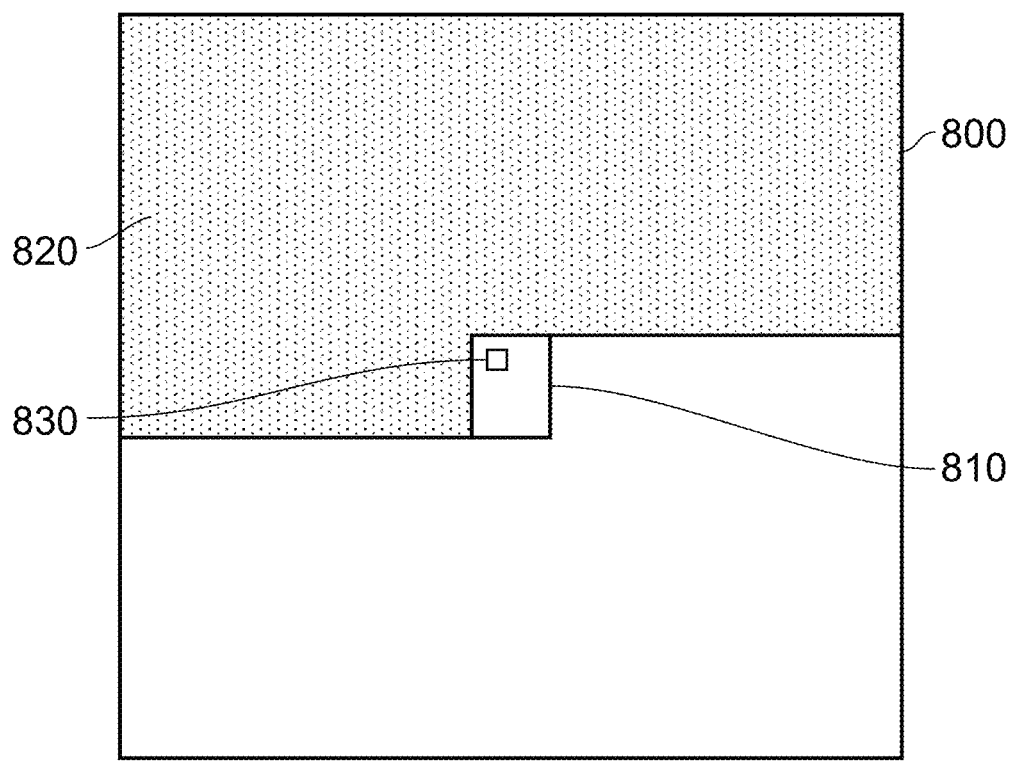
FIG. 13 schematically illustrates a partially-encoded image.

The intra-prediction process will now be discussed. In general terms, intra-prediction involves generating a prediction of a current block (a prediction unit) of samples from previously-encoded and decoded samples in the same image. FIG. 13 schematically illustrates a partially encoded image 800. Here, the image is being encoded from top-left to bottom-right on an LCU basis. An example LCU encoded partway through the handling of the whole image is shown as a block 810. A shaded region 820 above and to the left of the block 810 has already been encoded. The intra-image prediction of the contents of the block 810 can make use of any of the shaded area 820 but cannot make use of the unshaded area below that.

The block 810 represents an LCU; as discussed above, for the purposes of intra-image prediction processing, this may be subdivided into a set of smaller prediction units. An example of a prediction unit 830 is shown within the LCU 810.

The intra-image prediction takes into account samples above and/or to the left of the current LCU 810. Source samples, from which the required samples are predicted, may be located at different positions or directions relative to a current prediction unit within the LCU 810. To decide which direction is appropriate for a current prediction unit, the results of a trial prediction based upon each candidate direction are compared in order to see which candidate direction gives an outcome which is closest to the corresponding block of the input image. The candidate direction giving the closest outcome is selected as the prediction direction for that prediction unit.

The picture may also be encoded on a "slice" basis. In one example, a slice is a horizontally adjacent group of LCUs. But in more general terms, the entire residual image could form a slice, or a slice could be a single LCU, or a slice could be a row of LCUs, and so on. Slices can give some resilience to errors as they are encoded as independent units. The encoder and decoder states are completely reset at a slice boundary. For example, intra-prediction is not carried out across slice boundaries; slice boundaries are treated as image boundaries for this purpose.

Figure 14:
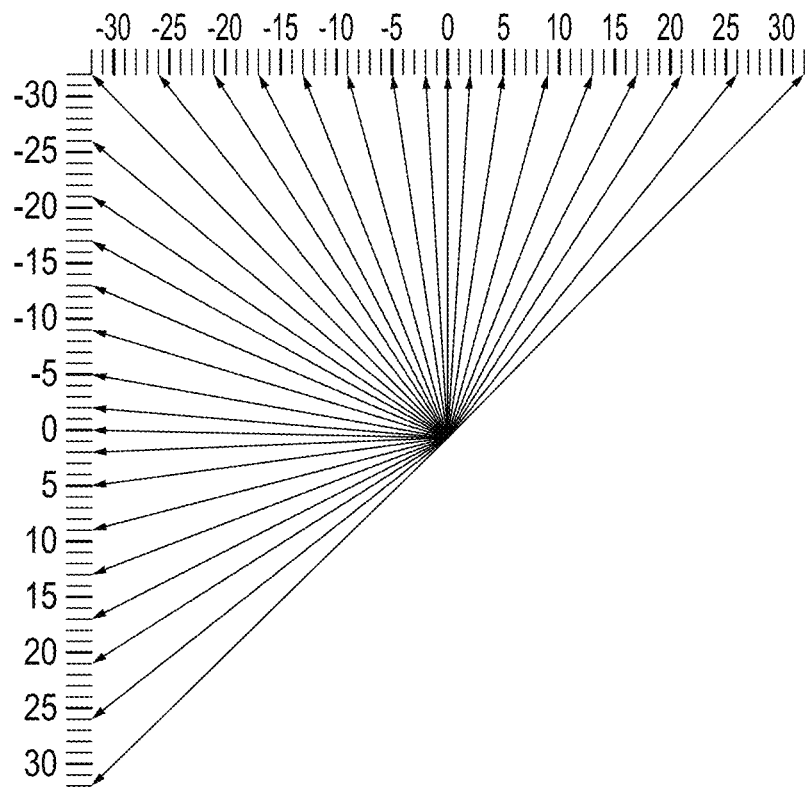
FIG. 14 schematically illustrates a set of possible prediction directions.
Figure 15:
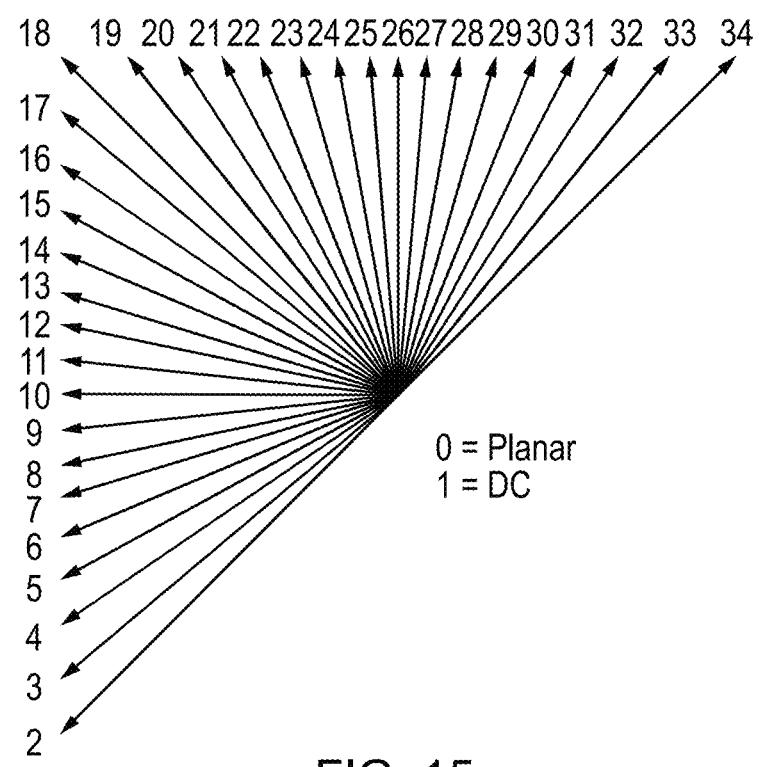
FIG. 15 schematically illustrates a set of prediction modes.

FIG. 14 schematically illustrates a set of possible (candidate) prediction directions. The full set of 34 candidate directions is available to a prediction unit of 8×8, 16×16 or 32×32 samples. The special cases of prediction unit sizes of 4×4 and 64×64 samples have a reduced set of candidate directions available to them (17 candidate directions and 5 candidate directions respectively). The directions are determined by horizontal and vertical displacement relative to a current block position, but are encoded as prediction "modes", a set of which is shown in FIG. 15. Note that the so-called DC mode represents a simple arithmetic mean of the surrounding upper and left-hand samples.

Figure 16:
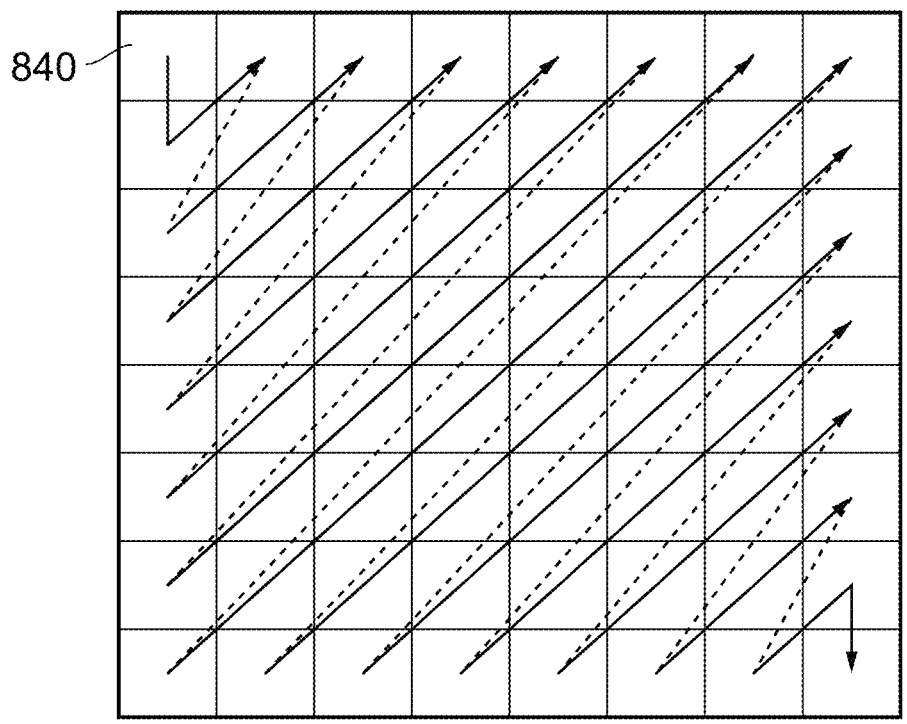
FIG. 16 schematically illustrates a zigzag scan.

FIG. 16 schematically illustrates a zigzag scan, being a scan pattern which may be applied by the scan unit 360. In FIG. 16, the pattern is shown for an example block of 8×8 transform coefficients, with the DC coefficient being positioned at the top left position 840 of the block, and increasing horizontal and vertical spatial frequencies being represented by coefficients at increasing distances downwards and to the right of the top-left position 840.

Note that in some embodiments, the coefficients may be scanned in a reverse order (bottom right to top left using the ordering notation of FIG. 16). Also it should be noted that in some embodiments, the scan may pass from left to right across a few (for example between one and three) uppermost horizontal rows, before carrying out a zig-zag of the remaining coefficients.

Figure 17:
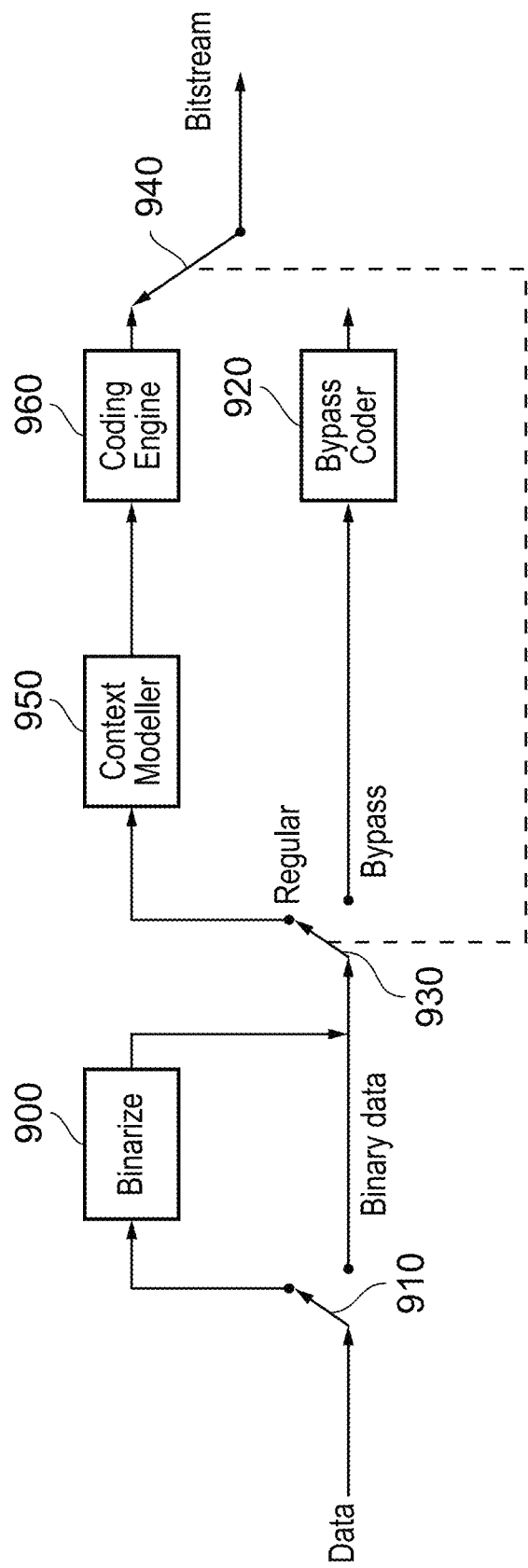
FIG. 17 schematically illustrates a CABAC entropy encoder.

FIG. 17 schematically illustrates the operation of a CABAC entropy encoder.

In context adaptive encoding of this nature and according to embodiments, a bit of data may be encoded with respect to a probability model, or context, representing an expectation or prediction of how likely it is that the data bit will be a one or a zero. To do this, an input data bit is assigned a code value within a selected one of two (or more generally, a plurality of) complementary sub-ranges of a range of code values, with the respective sizes of the sub-ranges (in embodiments, the respective proportions of the sub-ranges relative to the set of code values) being defined by the context (which in turn is defined by a context variable associated with or otherwise relevant to that input value). A next step is to modify the overall range, which is to say, the set of code values, (for use in respect of a next input data bit or value) in response to the assigned code value and the current size of the selected sub-range. If the modified range is then smaller than a threshold representing a predetermined minimum size (for example, one half of an original range size) then it is increased in size, for example by doubling (shifting left) the modified range, which doubling process can be carried out successively (more than once) if required, until the range has at least the predetermined minimum size. At this point, an output encoded data bit is generated to indicate that a (or each, if more than one) doubling or size-increasing operation took place. A further step is to modify the context (that is, in embodiments, to modify the context variable) for use with or in respect of the next input data bit or value (or, in some embodiments, in respect of a next group of data bits or values to be encoded). This may be carried out by using the current context and the identity of the current "most probable symbol" (either one or zero, whichever is indicated by the context to currently have a greater than 0.5 probability) as an index into a look-up table of new context values, or as inputs to an appropriate mathematical formula from which a new context variable may be derived. The modification of the context variable may, in embodiments, increase the proportion of the set of code values in the sub-range which was selected for the current data value.

The CABAC encoder operates in respect of binary data, that is to say, data represented by only the two symbols 0 and 1. The encoder makes use of a so-called context modelling process which selects a "context" or probability model for subsequent data on the basis of previously encoded data. The selection of the context is carried out in a deterministic way so that the same determination, on the basis of previously decoded data, can be performed at the decoder without the need for further data (specifying the context) to be added to the encoded datastream passed to the decoder.

Referring to FIG. 17, input data to be encoded may be passed to a binary converter 900 if it is not already in a binary form; if the data is already in binary form, the converter 900 is bypassed (by a schematic switch 910). In the present embodiments, conversion to a binary form is actually carried out by expressing the quantised transform coefficient data as a series of binary "maps", which will be described further below.

The binary data may then be handled by one of two processing paths, a "regular" and a "bypass" path (which are shown schematically as separate paths but which, in embodiments discussed below, could in fact be implemented by the same processing stages, just using slightly different parameters). The bypass path employs a so-called bypass coder 920 which does not necessarily make use of context modelling in the same form as the regular path. In some examples of CABAC coding, this bypass path can be selected if there is a need for particularly rapid processing of a batch of data, but in the present embodiments two features of so-called "bypass" data are noted: firstly, the bypass data is handled by the CABAC encoder (950, 960), just using a fixed context model representing a 50% probability; and secondly, the bypass data relates to certain categories of data, one particular example being coefficient sign data. Otherwise, the regular path is selected by schematic switches 930, 940. This involves the data being processed by a context modeller 950 followed by a coding engine 960.

The entropy encoder shown in FIG. 17 encodes a block of data (that is, for example, data corresponding to a block of coefficients relating to a block of the residual image) as a single value if the block is formed entirely of zero-valued data. For each block that does not fall into this category, that is to say a block that contains at least some non-zero data, a "significance map" is prepared. The significance map indicates whether, for each position in a block of data to be encoded, the corresponding coefficient in the block is non-zero. The significance map data, being in binary form, is itself CABAC encoded. The use of the significance map assists with compression because no data needs to be encoded for a coefficient with a magnitude that the significance map indicates to be zero. Also, the significance map can include a special code to indicate the final non-zero coefficient in the block, so that all of the final high frequency/trailing zero coefficients can be omitted from the encoding. The significance map is followed, in the encoded bitstream, by data defining the values of the non-zero coefficients specified by the significance map.

Further levels of map data are also prepared and are CABAC encoded. An example is a map which defines, as a binary value (1=yes, 0=no) whether the coefficient data at a map position which the significance map has indicated to be "non-zero" actually has the value of "one". Another map specifies whether the coefficient data at a map position which the significance map has indicated to be "non-zero" actually has the value of "two". A further map indicates, for those map positions where the significance map has indicated that the coefficient data is "non-zero", whether the data has a value of "greater than two". Another map indicates, again for data identified as "non-zero", the sign of the data value (using a predetermined binary notation such as 1 for +, 0 for −, or of course the other way around).

In embodiments, the significance map and other maps are generated from the quantised transform coefficients, for example by the scan unit 360, and is subjected to a zigzag scanning process (or a scanning process selected from zigzag, horizontal raster and vertical raster scanning according to the intra-prediction mode) before being subjected to CABAC encoding.

In some embodiments, the HEVC CABAC entropy coder codes syntax elements using the following processes:

The location of the last significant coefficient (in scan order) in the TU is coded.

For each 4×4 coefficient group (groups are processed in reverse scan order), a significant-coefficient-group flag is coded, indicating whether or not the group contains non-zero coefficients. This is not required for the group containing the last significant coefficient and is assumed to be 1 for the top-left group (containing the DC coefficient). If the flag is 1, then the following syntax elements pertaining to the group are coded immediately following it:

Significance Map:

For each coefficient in the group, a flag is coded indicating whether or not the coefficient is significant (has a non-zero value). No flag is necessary for the coefficient indicated by the last-significant position.

Greater-Than-One Map:

For up to eight coefficients with significance map value 1 (counted backwards from the end of the group), this indicates whether the magnitude is greater than 1.

Greater-Than-Two Flag:

For up to one coefficient with greater-than-one map value 1 (the one nearest the end of the group), this indicates whether the magnitude is greater than 2.

Sign Bits:

For all non-zero coefficients, sign bits are coded as equiprobable CABAC bins, with the last sign bit (in reverse scan order) possibly being instead inferred from parity when sign bit hiding is used.

Escape Codes:

For any coefficient whose magnitude was not completely described by an earlier syntax element, the remainder is coded as an escape code.

In general terms, CABAC encoding involves predicting a context, or a probability model, for a next bit to be encoded, based upon other previously encoded data. If the next bit is the same as the bit identified as "most likely" by the probability model, then the encoding of the information that "the next bit agrees with the probability model" can be encoded with great efficiency. It is less efficient to encode that "the next bit does not agree with the probability model", so the derivation of the context data is important to good operation of the encoder. The term "adaptive" means that the context or probability models are adapted, or varied during encoding, in an attempt to provide a good match to the (as yet uncoded) next data.

Using a simple analogy, in the written English language, the letter "U" is relatively uncommon. But in a letter position immediately after the letter "Q", it is very common indeed. So, a probability model might set the probability of a "U" as a very low value, but if the current letter is a "Q", the probability model for a "U" as the next letter could be set to a very high probability value.

CABAC encoding is used, in the present arrangements, for at least the significance map and the maps indicating whether the non-zero values are one or two. Bypass processing—which in these embodiments is identical to CABAC encoding but for the fact that the probability model is fixed at an equal (0.5:0.5) probability distribution of 1s and 0s, is used for at least the sign data and the map indicating whether a value is >2. For those data positions identified as >2, a separate so-called escape data encoding can be used to encode the actual value of the data. This may include a Golomb-Rice encoding technique.

The CABAC context modelling and encoding process is described in more detail in WD4: Working Draft 4 of High-Efficiency Video Coding, JCTVC-F803_d5, Draft ISO/IEC 23008-HEVC; 201x(E) 2011-10-28.

The CABAC process will now be described in a little more detail.

CABAC, at least as far as it is used in the proposed HEVC system, involves deriving a "context" or probability model in respect of a next bit to be encoded. The context, defined by a context variable or CV, then influences how the bit is encoded. In general terms, if the next bit is the same as the value which the CV defines as the expected more probable value, then there are advantages in terms of reducing the number of output bits needed to define that data bit.

The encoding process involves mapping a bit to be encoded onto a position within a range of code values. The range of code values is shown schematically in FIG. 18A as a series of adjacent integer numbers extending from a lower limit, m_Low, to an upper limit, m_high. The difference between these two limits is m_range, where m_range=m_high−m_Low. By various techniques to be described below, in a basic CABAC system m_range is constrained to lie between 128 and 254; in another embodiment using a larger number of bits to represent m_range, m_range may lie between 256 and 510. m_Low can be any value. It can start at (say) zero, but can vary as part of the encoding process to be described.

The range of code values, m_range, is divided into two sub-ranges, by a boundary 1100 defined with respect to the context variable as:

boundary=$m$_Low+($CV$*$m$_range)

So, the context variable divides the total range into two complementary sub-ranges or sub-portions of the set of code values, the proportions of the set assigned to each sub-range being determined by the variable CV, one sub-range being associated with a value (of a next data bit) of zero, and the other being associated with a value (of the next data bit) of one. The division of the range represents the probabilities assumed by the generation of the CV of the two bit values for the next bit to be encoded. So, if the sub-range associated with the value zero is less than half of the total range, this signifies that a zero is considered less probable, as the next symbol, than a one.

Various different possibilities exist for defining which way round the sub-ranges apply to the possible data bit values. In one example, a lower region of the range (that is, from m_Low to the boundary) is by convention defined as being associated with the data bit value of zero.

If more than one bit was being encoded at a single operation, more than two sub-ranges could be provided so as to give a sub-range corresponding to each possible value of the input data to be encoded.

The encoder and decoder maintain a record of which data bit value is the less probable (often termed the "least probable symbol" or LPS). The CV refers to the LPS, so the CV always represents a value of between 0 and 0.5.

A next bit is now mapped to the range m_range, as divided by the boundary. This is carried out deterministically at both the encoder and the decoder using a technique to be described in more detail below. If the next bit is a 0, a particular code value, representing a position within the sub-range from m_Low to the boundary, is assigned to that bit. If the next bit is a 1, a particular code value in the sub-range from the boundary 1100 to m_high is assigned to that bit. This represents an example of a technique by which embodiments may select one of the plurality of sub-ranges of the set of code values according to the value of the current input data bit, and also an example of a technique by which embodiments may assign the current input data value to a code value within the selected sub-range.

The lower limit m_Low and the range m_range are then redefined so as to modify the set of code values in dependence upon the assigned code value (for example, which sub-range the assigned code value fell into) and the size of the selected sub-range. If the just-encoded bit is a zero, then m_Low is unchanged but m_range is redefined to equal m_range*CV. If the just-encoded bit is a one then m_Low is moved to the boundary position (m_Low+(CV*m_range)) and m_range is redefined as the difference between the boundary and m_high (that is, (1−CV)*m_range).

After such modification, a detection is made as to whether the set of code values is less than a predetermined minimum size (for example, is m_range at least 128). These alternatives are illustrated schematically in FIGS. 18B and 18C.

Figure 18A:
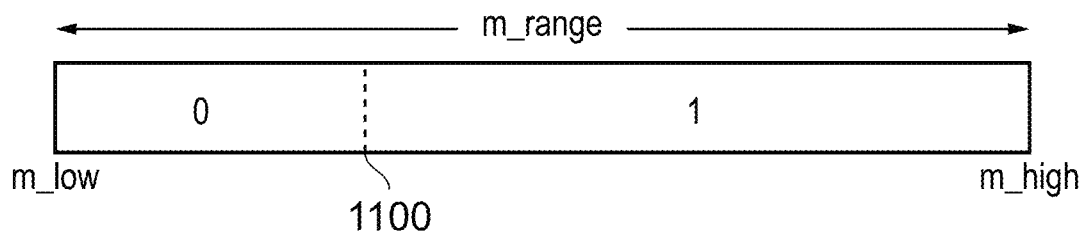
FIGS. 18A to 18D schematically illustrate aspects of a CABAC encoding and decoding operation.
Figure 18B:
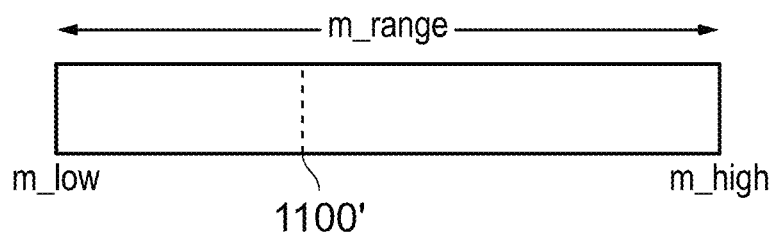

In FIG. 18B, the data bit was a 1 and so m_Low was moved up to the previous boundary position. This provides a revised or modified set of code values for use in a next bit encoding sequence. Note that in some embodiments, the value of CV is changed for the next bit encoding, at least in part on the value of the just-encoded bit. This is why the technique refers to "adaptive" contexts. The revised value of CV is used to generate a new boundary 1100'.

Figure 18C:
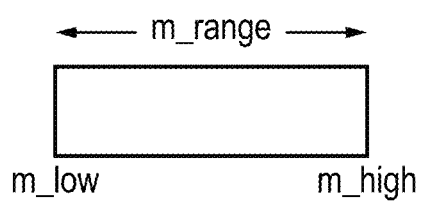

In FIG. 18C, a value of 0 was encoded, and so m_Low remained unchanged but m_high was moved to the previous boundary position. The value m_range is redefined or modified as the new values of m_high−m_Low.

Figure 18D:
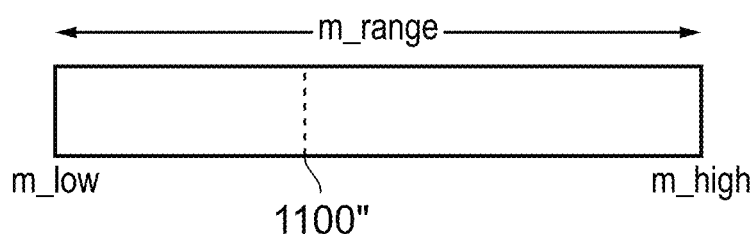

In this example, this has resulted in m_range falling below its minimum allowable value (such as 128). When this outcome is detected, the value m_range is renormalized or size-increased—which in the present embodiments is represented by m_range being doubled, that is, shifted left by one bit, as many times as are necessary to restore m_range to the required range of 128 to 256. An example of this is illustrated in FIG. 18D, which represents the range of FIG. 18C, doubled so as to comply with the required constraints. A new boundary 1100" is derived from the next value of CV and the revised m_range. Note that m_Low is similarly renormalized or size-increased whenever m_range is renormalized. This is done in order to maintain the same ratio between m_Low and m_range.

Whenever the range has to be multiplied by two in this way, an output encoded data bit is generated, one for each renormalizing stage.

In this way, the interval m_range and the lower limit m_Low are successively modified and renormalized in dependence upon the adaptation of the CV values (which can be reproduced at the decoder) and the encoded bit stream. After a series of bits has been encoded, the resulting interval and the number of renormalizing stage uniquely defines the encoded bitstream. A decoder which knows such a final interval would in principle be able to reconstruct the encoded data. However, the underlying mathematics demonstrate that it is not actually necessary to define the interval to the decoder, but just to define one position within that interval. This is the purpose of the assigned code value, which is maintained at the encoder and passed to the decoder at the termination of encoding the data.

To give a simplified example, consider a probability space divided into 100 intervals. In this case, m_Low would represent the bottom of a probability space, and 0 and m_Range would represent its size, (100). Assume for the purposes of this example that the context variable is set at 0.5 (as it is in respect of the bypass path), so the probability space is to be used to encode binary bits with fixed probability of 50%. However, the same principles apply if adaptive values of the context variable are used, such that the same adaptation process takes place at the encoder and the decoder.

For the first bit, each symbol (0 or 1) would have a symbol range of 50, with the input symbol 0 being assigned (say) the values 0 to 49 inclusive and the input symbol 1 being assigned (say) the values 50 to 99 inclusive. If a 1 is to be the first bit to be encoded, then the final value of the stream must lie in the 50 to 99 range, hence m_Low becomes 50 and m_Range becomes 50.

To encode the second bit, the range is further subdivided into symbol ranges of 25, with an input symbol of 0 taking the values 50 to 74 and an input symbol of 1 taking the values 75 to 99. As can be seen, whichever symbol is encoded as the second bit, the final value is still between 50 and 99, preserving the first bit, but now a second bit has been encoded into the same number. Likewise if the second bit were to use a different probability model to the first, it still wouldn't affect the encoding of the first bit because the range being subdivided is still 50 to 99.

This process continues at the encoder side for each input bit, renormalizing (for example, doubling) m_Range and m_Low wherever necessary, for example in response to m_Range dropping below 50. By the end of the encoding process (when the stream is terminated) the final value has been written to the stream.

At the decoder side, the final value is read from the stream (hence the name m_Value)—say for example, the value is 68. The decoder applies the same symbol range split to the initial probability space and compares its value to see which symbol range it lies in. Seeing that 68 lies in the 50 to 99 range, it decodes a 1 as the symbol for its first bit. Applying the second range split in the same way as the encoder, it sees that 68 lies in the 50 to 74 range and decodes 0 as the second bit, and so on.

In an actual implementation, the decoder may avoid having to maintain m_Low as the encoder does by subtracting the bottom value of each decoded symbol's range from m_Value (in this case, 50 is subtracted from m_Value to leave 18). The symbol ranges are then always subdivisions of the 0 to (m_range−1) range (so the 50 to 74 range becomes 0 to 24).

It is important to note that, if only two bits were to be encoded this way, the encoder could pick any final value within the 50 to 74 range and they would all decode to the same two bits "10" (one followed by zero). More precision is only needed if further bits are to be encoded and in practice, the HEVC encoder would always pick 50, the bottom of the range. The embodiments discussed in the present application seek to make use of that unused range by finding certain bits that, when set appropriately, guarantee the final value will decode correctly regardless of what the values of the remaining bits are, freeing those remaining bits for carrying other information. For example, in the sample encode given above, if the first digit were set to 6 (or 5), then the final value would always be in the 50 to 74 range regardless of the value of the second digit; hence the second digit can be used to carry other information.

As can be seen, an endless stream of bits can be coded using the same probability range (given infinite-precision fractions) by repeatedly subdividing it. In practice however, infinite precision is impossible and non-integer numbers are to be avoided. For this purpose, renormalisation is used. If the 50 to 74 range were to be used to encode a third bit, the symbol ranges would ordinarily have to be 12.5 intervals each, but instead, m_Range and m_Low can be doubled (or otherwise multiplied by a common factor) to 50 and 100 respectively and the symbol ranges would now be subdivisions of the range of 100 to 149 i.e. 25 intervals each. This operation is equivalent to retroactively doubling the size of the initial probability space from 100 to 200. Since the decoder maintains the same m_Range, it can apply renormalisation at the same times as the encoder.

The context variable CV is defined as having (in an example embodiment) 64 possible states which successively indicate different probabilities from a lower limit (such as 1%) at CV=63 through to a 50% probability at CV=0.

In an adaptive system CV is changed or modified from one bit to the next according to various known factors, which may be different depending on the block size of data to be encoded. In some instances, the state of neighbouring and previous image blocks may be taken into account. So, the techniques described here are examples of modifying the context variable, for use in respect of a next input data value, so as to increase the proportion of the set of code values in the sub-range which was selected for the current data value.

The functions of selecting a sub-range, assigning the current bit to a code value, modifying the set of code values, detecting whether the set is less than a minimum size, and modifying the context variable may all be carried out by the context modeller 950 and the coding engine 960, acting together. So, although they are drawn as separate items in FIG. 17 for clarity of the explanation, they act together to provide a context modelling and coding function. However, for further clarity, reference is made to FIG. 19 which illustrates these operations and functionalities in more detail.

The assigned code value is generated from a table which defines, for each possible value of CV and each possible value of bits 6 and 7 of m_range (noting that bit 8 of m_range is always 1 because of the constraint on the size of m_range), a position or group of positions at which a newly encoded bit should be allocated a code value in the relevant sub-range.

Figure 19:
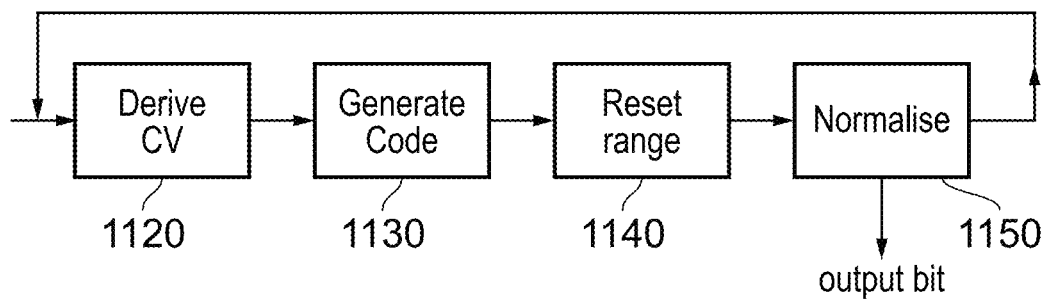
FIG. 19 schematically illustrates a CABAC encoder.

FIG. 19 schematically illustrates a CABAC encoder using the techniques described above.

The CV is initiated (in the case of the first CV) or modified (in the case of subsequent CVs) by a CV derivation unit 1120. A code generator 1130 divides the current m_range according to CV, selects a sub-range and generates an assigned data code within the appropriate sub_range, for example using the table mentioned above. A range reset unit 1140 resets m_range to that of the selected sub-range so as to modify the set of code values as described above. A normaliser 1150 detects whether the resulting value of m_range is below the minimum allowable value and, if necessary, renormalises the m_range one or more times, outputting an output encoded data bit for each such renormalisation operation. As mentioned, at the end of the process, the assigned code value is also output.

Figure 20:
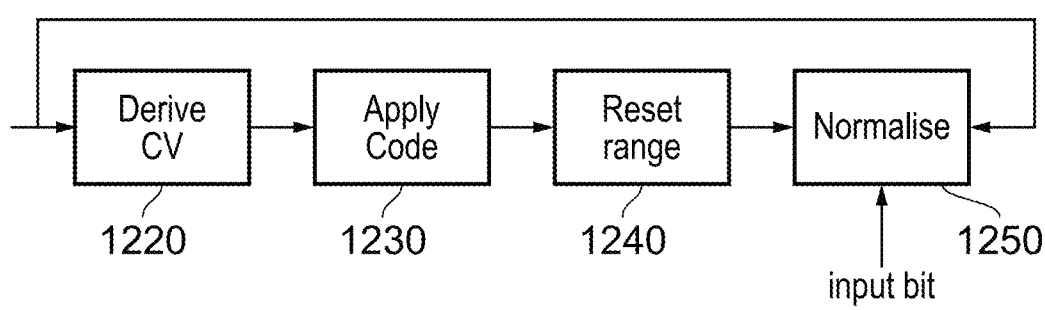
FIG. 20 schematically illustrates a CABAC decoder.

In a decoder, shown schematically in FIG. 20, the CV is initiated (in the case of the first CV) or modified (in the case of subsequent CVs) by a CV derivation unit 1220 which operates in the same way as the unit 1120 in the encoder. A code application unit 1230 divides the current m_range according to CV and detects in which sub-range the data code lies. A range reset unit 1240 resets m_range to that of the selected sub-range so as to modify the set of code values in dependence upon the assigned code value and the size of the selected sub-range. If necessary, a normaliser 1250 renormalises the m_range in response to a received data bit.

Embodiments provide a technique to terminate a CABAC stream. The embodiments will be described in the context of an example system in which the code value range has a maximum value of 512 (instead of 128 as described above) and so is constrained to lie in the upper half of this range, that is, from 256 to 510.

The technique can produce a loss of on average 1.5 bits (which is to say, a much smaller loss than previous stream termination techniques caused). A second alternative method is also presented which can produce an average loss of 1 bit. Applications of these techniques have been suggested to include termination of the CABAC stream prior to sending IPCM (non-frequency separated) data, and termination of the stream for row-per-slice. The technique is based on the recognition that the CABAC variable can be set to any value within the correct range at the time of termination. So the CABAC variable is set to a value which has a number of trailing (least significant bit) zeros, so that when the value is flushed to the data stream, the zeros can effectively be ignored.

In current techniques, terminating a CABAC stream causes 8 bits to be flushed to the data stream (that is, lost or wasted) The technique is illustrated with an example where intra frames are terminated after each LCU or image slice (that is, after encoding a group of data values representing data values relating to a particular respective image sub-area), allowing the coefficient bypass data (sign bits/escape codes) to be placed into the bit-stream in a raw format.

A process to terminate the CABAC stream is applied at the end of each slice and prior to IPCM data. In embodiments this process assumes (for the purposes of this discussion) that the probability that the stream is to be terminated is fixed at on average 0.54%. (When a data value (1 or 0) is encoded, the current m_range is subdivided into two symbol ranges, representing the probability of 1 or 0 respectively. For the special "end-of-stream flag" value, the symbol range for 1 is always 2. Hence the probability of the data value being 1 is dependent on the value of the current m_range. In some embodiments, as discussed above, m_range may vary between 256 and 510, so the termination probability therefore varies between 2/510=0.3922% and 2/256=0.7813%).

For the encoder, this process is:
if the stream is not to be terminated, the CABAC range m_range is decremented by 2, and the CABAC engine is renormalized by 1 place if required (which is to say that m_Low and m_range are renormalized); processing on the current CABAC stream continues.
if the stream is to be terminated, the CABAC 'm_Low' is incremented by 'the range less 2', the range is set to 2, and the CABAC engine is renormalized by 7 places, followed by outputting a further binary '1'. This process is equivalent to a renormalization of 8 places, where the value being renormalized has been forced to be an odd number.

There may be occasions where the above process is not ideal—i.e. where the probability of the stream is variable, or fixed at a higher percentage, or even a certainty (probability of 1).

Embodiments can provide a method whereby the CABAC stream can be immediately terminated with just 2 renormalizations, with a loss of (on average) 1.5 bits and negligible impact on the decoder and encoder complexity. An alternative method is also indicated that can reduce the overhead to just 1 bit, but at the expense of an increase in CABAC decoder complexity. Both methods can then be used in conjunction with a standard adaptive context variable if there is a variable probability of termination, or in conjunction with a fixed percentage mechanism (akin to a non-adaptive context variable).

Note that as discussed above, m_Low and m_Range are renormalised together.

1 Algorithm
1.1 Method
The steps of the encoder are as follows:

--- m_Low=(m_Low+128) &~127
{or m_Low= (m_Low+127) &~127}
Force 2 stages of renormalization of m_Low and call test_write_out ( )
[write the value to the stream]
Prior to encoding next CABAC stream, set m_Range=510, m_Low=0.

---

Notation: & is an AND operation, and ~ signifies the binary inverse (so ~127 is the binary inverse of the binary value corresponding to decimal 127, so that an AND operation with the binary inverse of a number such as decimal 127 (which has a plurality of least significant bits or LSBs equal to 1) is equivalent to setting that number of LSBs of the resulting value to zero). The function test_write_out ( ) checks whether any bits at the top (MSB end) of m_Low are eligible to be sent to the output stream, writing them if so. In the context of the pseudo-code shown above, the new bits created by the "forced renormalisation" will be written by this operation.

The steps of the decoder are as follows:

---

Rewind input stream by 7 bits (i.e. move read position back by 7 bits).
Prior to decoding next CABAC stream, set m_Range=0, and read m_value from bit-stream.

---

This method has a low processing impact on the decoder and encoder.

In respect of m_Low, note that the encoder generates a stream by repeatedly adding to m_Low. The decoder reads that stream by starting with the encoder's final result and repeatedly subtracting from it. The decoder calls the bits read from the stream "m_uiValue" (or m_value in the notation of this description) rather than m_Low and it is this that should be read from the bit stream. This is relevant in this case where some embodiments require that the decoder maintain m_Low as well as m_uiValue so it knows what the encoder is doing. In that case, m_Low is generated at the decoder in exactly the same way as the encoder's m_Low.

Alternative Method

This method increases the complexity of current decoders as it requires that the decoder maintains m_Low. If maintenance of m_Low is required by other proposals, then this additional complexity is again minimal.

The steps of the encoder are as follows:

---

Let test256= (m_Low+255) &~255
If (test256+256 < m_Low+m_Range)
  m_Low=m_test256
  Force 1 stage of renormalization of m_Low and call test_write_out( ).
Else (as before)
  m_Low= (m_Low+128) &~127  { or m_Low= (m_Low+127) &~127 }
  Force 2 stages of renormalization of m_Low and call test_write_out( ).
Prior to encoding next CABAC stream, set m_Range=510, m_Low=0.

The steps of the decoder are as follows:

```
Let test256= (m_Low+255) &~255
If (test256+256 < m_Low+m_Range)
   Rewind stream by 8 bits
Else (as before)
   Rewind stream by 7 bits
Prior to decoding next CABAC stream, set m_Range=0, set m_Low = 0
and read m_value from bit-stream.
```

Theory

For the CABAC encoder, the data written to the stream (or buffered) is concatenated with m_Low is an n-bit value low indicating the lowest value that the final output can be. The highest value, high, is the sum of low and m_Range, a variable maintained by the encoder to be within the range 256 (inclusive) to 511 (exclusive). At the end of the stream, any value between low (inclusive) and high (exclusive) can be selected as the final output value, without affecting the decode. If the decode could occur without being dependent on the n LSBs of the value, then the n LSBs could be replaced with data from the next section of the bit-stream.

Let v be a value between low and high where n LSBs are 0, and where if the last n LSBs were 1, the resulting value V would still be less than high. Since "high−low" is at least 256, then there will always be a value v between low and high that has at least 7 LSBs that are 0. i.e. the value v is the first value between low and high that is divisible by 128 without a remainder.

The simplest manner to achieve this is a standard power-of-2 alignment routine, namely:

$$v=(low+127)\&\sim 127$$

However, since range is at least 256, then:

$$v=(low+128)\&\sim 127$$

is also sufficient (and results in a slightly smaller encoder).

For the current part of the bit-stream, the encoder would output the value 'v', except for the bottom 7 bits, this is achieved by renormalizing m_Low by 2 places. At the end of the bit-stream, the decoder would have read 7 bits from the next section of the bit stream, and therefore would have to 'rewind' the bit-stream by 7 bits.

There are cases where the bottom 8 bits are not required to fully decode the stream, with the simplest illustration being where "m_Low=0", and these are explored by the alternative algorithm. In this alternative algorithm, the value v between low and high with 8 LSBs of 0 is calculated, and then a test is applied to check if there is a corresponding value V. The decision process requires tests on low and high, and since the decoder must also make the same decision, the decoder would need to track m_Low.

In both versions of the encoder algorithm, there is a choice for the 7-bit path, which will result in a different bit-stream, but will be decodable by the same decoder.

With reference to FIG. 19 described above, the units 1120 and 1130 represent embodiments of a selector to select one of a plurality of complementary sub-ranges of a set of code values, and a data assigning unit to assign the current input value to a code value. he unit 1140 represents an embodiment of a data modifying unit. The unit 1150 represents an embodiment of a detector for detecting whether the set of code values is less than a minimum size and to carry out the other functions of that detector accordingly. The unit 1150 also represents an embodiment of a data terminator by carrying out the data termination functionality described above and that described below, and in particular by making the decision as to when to terminate the stream.

With reference to FIG. 20 described above, the units 1220, 1230, 1240 and 1250 collectively represent embodiments of a pointer controller and a setting unit, in that they are operable to carry out the functionality described above in respect of these units.

Applications

Possible applications for this include:

1. Termination for the last encoded LCU for a slice, especially in a 'row-per-slice' style configuration, where the probability may be significantly higher than 0.54%; in this arrangement, embodiments can provide a data encoding method for encoding successive input data values representing video data, the method comprising the steps of: selecting one of a plurality of complementary sub-ranges of a set of code values according to the value of a current input data value, the proportions of the sub-ranges relative to the set of code values being defined by a context variable associated with that input data value; assigning the current input data value to a code value within the selected sub-range; modifying the set of code values in dependence upon the assigned code value and the size of the selected sub-range; detecting whether the set of code values is less than a predetermined minimum size and if so, successively increasing the size of the set of code values until it has at least the predetermined minimum size; and outputting an encoded data bit in response to each such size-increasing operation; modifying the context variable, for use in respect of a next input data bit or value, so as to increase the proportion of the set of code values in the sub-range which was selected for the current data value; and after encoding a group of input data values corresponding to a set of blocks of video data within a slice of the video data which is encoded without reference to other video data, terminating the output data by: setting a value defining an end of the set of code values to a value having a plurality of least significant bits equal to zero; increasing the size of the set of code values; and writing the value defining the end of the set of code values to the output data.

2. Termination for the last possible LCU for a slice, as termination after the last possible LCU of a slice is a certainty; in this arrangement, embodiments can provide a data encoding method for encoding successive input data values representing video data, the method comprising the steps of: selecting one of a plurality of complementary sub-ranges of a set of code values according to the value of a current input data value, the proportions of the sub-ranges relative to the set of code values being defined by a context variable associated with that input data value; assigning the current input data value to a code value within the selected sub-range; modifying the set of code values in dependence upon the assigned code value and the size of the selected sub-range; detecting whether the set of code values is less than a predetermined minimum size and if so, successively increasing the size of the set of code values until it has at least the predetermined minimum size; and outputting an encoded data bit in response to each such size-increasing operation; modifying the context variable, for use in respect of a next input data bit or value, so as to increase the proportion of the set of code values in the sub-range which was selected for the current data value; and after encoding a group of input data values representing the whole of a slice of video data which is encoded without reference to other video data, terminating the output data by: setting a value defining an end of the set of code values to a value having a plurality of least significant bits equal to zero; increasing the size of the set of code values; and writing the value defining the end of the set of code values to the output data.

3. Termination prior to IPCM data, possibly in conjunction with a context variable; in this arrangement, embodiments can provide a data encoding method for encoding successive input data values representing frequency separated video data, the method comprising the steps of: selecting one of a plurality of complementary sub-ranges of a set of code values according to the value of a current input data value, the proportions of the sub-ranges relative to the set of code values being defined by a context variable associated with that input data value; assigning the current input data value to a code value within the selected sub-range; modifying the set of code values in dependence upon the assigned code value and the size of the selected sub-range; detecting whether the set of code values is less than a predetermined minimum size and if so, successively increasing the size of the set of code values until it has at least the predetermined minimum size; and outputting an encoded data bit in response to each such size-increasing operation; modifying the context variable, for use in respect of a next input data bit or value, so as to increase the proportion of the set of code values in the sub-range which was selected for the current data value; and after encoding a group of input data values such that a next group of data values to be encoded represent non-frequency-separated video data, terminating the output data by: setting a value defining an end of the set of code values to a value having a plurality of least significant bits equal to zero; increasing the size of the set of code values; and writing the value defining the end of the set of code values to the output data.

4. Termination of the stream to prevent the "bits outstanding" mechanism getting too long; in this arrangement, embodiments can provide a data encoding method for encoding successive input data values, the method comprising the steps of: selecting one of a plurality of complementary sub-ranges of a set of code values according to the value of a current input data value, the proportions of the sub-ranges relative to the set of code values being defined by a context variable associated with that input data value; assigning the current input data value to a code value within the selected sub-range; modifying the set of code values in dependence upon the assigned code value and the size of the selected sub-range; detecting whether the set of code values is less than a predetermined minimum size and if so, successively increasing the size of the set of code values until it has at least the predetermined minimum size; and outputting an encoded data bit in response to each such size-increasing operation; modifying the context variable, for use in respect of a next input data bit or value, so as to increase the proportion of the set of code values in the sub-range which was selected for the current data value; detecting whether a set of data values to be encoded by a different encoding technique exceeds a predetermined size, and if so, terminating the output data by: setting a value defining an end of the set of code values to a value having a plurality of least significant bits equal to zero; increasing the size of the set of code values; and writing the value defining the end of the set of code values to the output data.

The following part of the description is concerned with extending the operation of encoders and decoders such as those described above to operation at higher video resolutions and correspondingly low (including negative) QPs. Low operating QPs may be needed if the codec is to truly support high bit depths. Possible sources of errors that may be caused by internal accuracy limitations present in encoders and decoders such as those defined by HEVC will be discussed. Some changes to those accuracies can mitigate the errors and thereby extend the operating range of HEVC. In addition, changes to the entropy coding are presented.

At the time of filing the present application, HEVC Version 1 describes an 8 and 10 bit codec; Version 2 is to include 12 and 14 bit operation. Although the test or demonstration software has been written to allow input data bit depths up to 14, the ability of the codec to code 14 bits does not necessarily correspond to the way that the codec handles 8 or 10 bit resolution data. In some instances the internal processing may introduce noise, which can lead to an effective loss of resolution. For example, if the peak signal to noise ratio (PSNR) for 14-bit input data is so low that the least-significant two bits are effectively reduced to noise, then the codec is effectively only operating at 12-bit resolution. It is therefore appropriate to aim towards a system having internal operating functions which allow higher resolution input data to be used (for example, 12 or 14 bit resolution input data) without introducing so much noise, errors or other artefacts as to reduce the effective (useful) resolution of the output data by a significant amount.

The term "bit depth" and the variable bitDepth are used here to indicate the resolution of the input data and/or (according to the textual context) of the data processing carried out within the codec (the latter being also known as "internal bit depth" using HEVC software demonstration model terminology). For example, for 14-bit data processing, bitDepth=14.

In the context of the 8 and 10 bit codec, quantisation parameters (QPs) in the positive range (QP>0) are discussed. However, for each additional bit (over 8 bits) in the resolution of the input data, the minimum allowable QP (minQP) can be 6 lower than 0, or in other words:

$$\text{minQP}=-6*(\text{bitDepth}-8)$$

The variable "PSNR", or peak SNR, is defined as a function of mean-square error (MSE) and bit depth:

$$\text{PSNR}=10*\log_{10}(((2^{bitDepth})-1)^2/\text{MSE})$$

Figure 23:
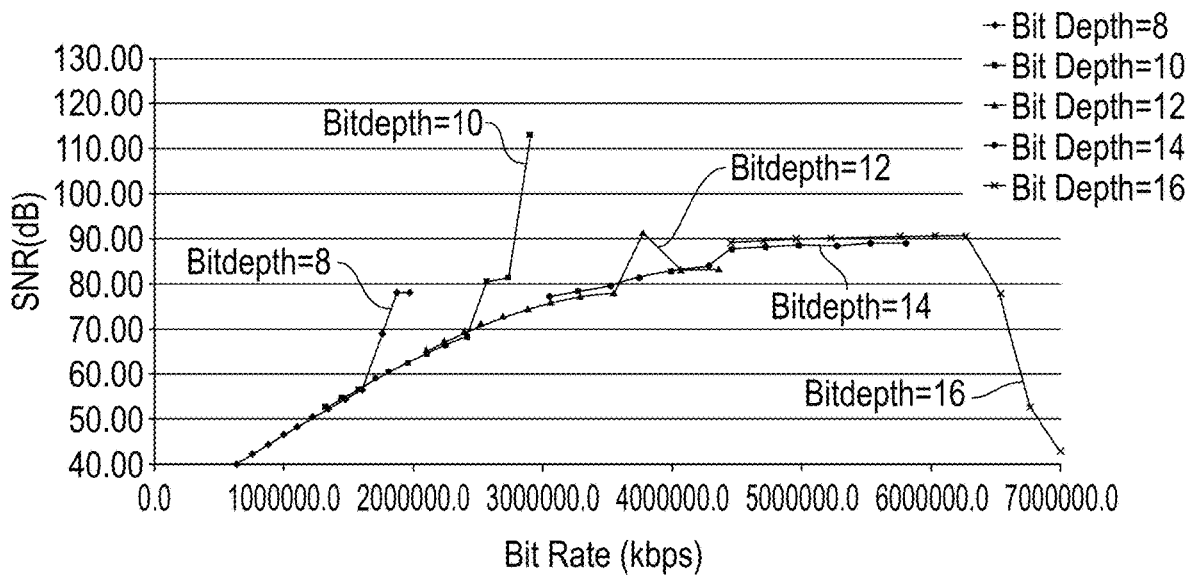
FIG. 23 is a graph of bit rate against green channel PSNR for six test bit depths, with a transform skip mode enabled.

As can be seen in FIG. 23, to be discussed below, no matter what value of the internal processing bit depth of the example codec implementation, the general trend is that the PSNR curves peak at around 90 dB; for more negative QPs (than the QP corresponding to the peak of the PSNR curve), the PSNR performance actually degrades.

Using the equation for PSNR, the following table of PSNRs for given bit depths and MSE can be derived:

| MSE | Bit depth | | | | | | | | |
|---|---|---|---|---|---|---|---|---|---|
| | 8 | 9 | 10 | 11 | 12 | 13 | 14 | 15 | 16 |
| 0.25 | 54.2 | 60.2 | 66.2 | 72.2 | 78.3 | 84.3 | 90.3 | 96.3 | 102.4 |
| 0.5 | 51.1 | 57.2 | 63.2 | 69.2 | 75.3 | 81.3 | 87.3 | 93.3 | 99.3 |
| 1 | 48.1 | 54.2 | 60.2 | 66.2 | 72.2 | 78.3 | 84.3 | 90.3 | 96.3 |
| 1.5 | 46.4 | 52.4 | 58.4 | 64.5 | 70.5 | 76.5 | 82.5 | 88.5 | 94.6 |
| 2 | 45.1 | 51.2 | 57.2 | 63.2 | 69.2 | 75.3 | 81.3 | 87.3 | 93.3 |
| 4 | 42.1 | 48.1 | 54.2 | 60.2 | 66.2 | 72.2 | 78.3 | 84.3 | 90.3 |
| 5.5 | 40.7 | 46.8 | 52.8 | 58.8 | 64.8 | 70.9 | 76.9 | 82.9 | 88.9 |
| 8 | 39.1 | 45.1 | 51.2 | 57.2 | 63.2 | 69.2 | 75.3 | 81.3 | 87.3 |
| 16 | 36.1 | 42.1 | 48.2 | 54.2 | 60.2 | 66.2 | 72.2 | 78.3 | 84.3 |
| 21.5 | 34.8 | 40.8 | 46.9 | 52.9 | 58.9 | 64.9 | 71.0 | 77.0 | 83.0 |
| 32 | 33.1 | 39.1 | 45.1 | 51.2 | 57.2 | 63.2 | 69.2 | 75.3 | 81.3 |
| 64 | 30.1 | 36.1 | 42.1 | 48.2 | 54.2 | 60.2 | 66.2 | 72.2 | 78.3 |

If a 14-bit codec is only able to achieve a PSNR of 72.2 dB, then each output value is only accurate to within the range of ±4 of the corresponding original value. The two least significant bits are therefore effectively noise, so the codec is really equivalent to a 12-bit codec with two additional random bits added at the output. (It is important to note that this analysis is based upon averages, and that actually in some parts of the picture, better or worse quality than this average may be achieved).

Extending this argument, when comparing PSNRs in this purely numerical fashion, it could be thought that the best system would therefore in fact be an 8-bit system with lossless encoding, achieving an infinite PSNR (MSE=0). However, this does not take into account the loss in initially rounding or truncating the video from n bits (where n is originally higher than 8) down to 8 bits. This approach can be generalised according to the following examples:

If a lossless (n−1)-bit system were available to encode the n-bit data, then at the output, the n-bit MSE observed would be $(0+1^2)/2=0.5$.

If a lossless (n−2)-bit system were available to encode the n-bit data, then at the output, the n-bit MSE observed would be $(0+1^2+2^2+1^2)/4=1.5$.

If a lossless (n−3)-bit system were available to encode the n-bit data, then at the output, the n-bit MSE observed would be $(0+1^2+2^2+3^2+4^2+3^2+2^2+1^2)/8=5.5$.

If a lossless (n−4)-bit system were available to encode the n-bit data, then at the output, the n-bit MSE observed would be: $(0+1^2+2^2+3^2+4^2+5^2+6^2+7^2+8^2+7^2+6^2+5^2+4^2+3^2+2^2+1^2)/16=21.5$.

Therefore, returning to the specific example, if the 14-bit system does not achieve an MSE of 21.5 or less (equivalent to 71.0 dB) and if the bit rate of a lossless 10-bit system were similar, then numerically speaking, only 10 bits are effectively being coded.

Consider a lossy, low bit depth (n−r)-bit system with MSE of 'm'. If this system is used to code higher bit depth n-bit data, its MSE will therefore be given by $(2^r)^2m$.

For example, for a lossy (n−1)-bit system, MSE in an n-bit system would be 4m; for a lossy (n−2)-bit system, MSE in an n-bit system would be 16m; for a lossy (n−3)-bit system, MSE in an n-bit system would be 64m; and for a lossy (n−4)-bit system, MSE in an n-bit system would be 256m.

Therefore for the case where lossy lower bit depth systems encode higher (n-bit) bit depth data, their loss is generally the main contributor for the MSE observed in the n-bit domain, so simple PSNR figures can be used as straight comparisons of quality.

An implementation of a HEVC encoder (at the time of filing the application) peaks at 90 dB (as shown in FIG. 23); this may be considered suitable for encoding 11-bit data, but at this operating point, the matter of whether any further improvement can be gained will be discussed below.

First, the potential sources of error will be discussed.

The core HEVC system (version 1) has been designed for 8 and 10 bit operation. As the number of bits increases, the internal accuracies of parts of the system may become relevant as potential sources of error, noise or artefacts leading to an effective loss of overall resolution.

Figure 21:
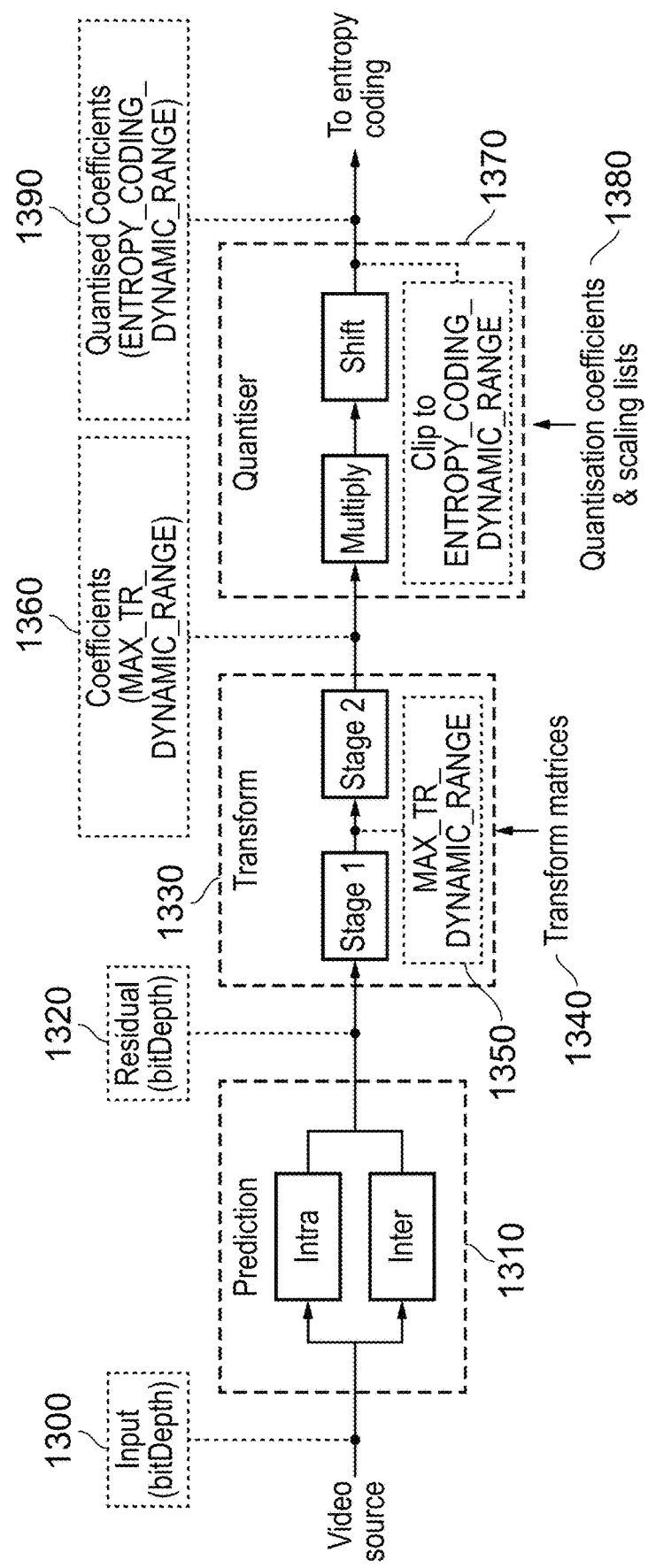
FIG. 21 is a schematic diagram showing an overview of an encoding system.

A simplified schematic diagram illustrating a flow of data through an encoder of the types discussed above, such as a HEVC encoder, is shown in FIG. 21. A purpose of summarising the process in the form shown in FIG. 21 is to indicate the potential limitations on operating resolution within the system. Note that for this reason, not all of the encoder functionality is shown in FIG. 21. Note also that FIG. 21 provides an example of an apparatus for encoding input data values of a data set (which may be video data values). Further, note that (as discussed above) techniques used in a forward encoding path such as that shown in FIG. 21 may also be used in the complementary reverse decoding path of the encoder and may also be used in a forward decoding path of a decoder.

Input data 1300 of a certain bit depth is supplied to a prediction stage 1310 which performs either intra- or inter-prediction and subtracts the predicted version from the actual input image, generating residual data 1320 of a certain bit depth. So, the stage 1300 generally corresponds to the items 320 and 310 of FIG. 5.

The residual data 1320 is frequency-transformed by a transform stage 1330 which involves multiple stages of transform processing (labelled as stage 1 and stage 2), corresponding to left and right matric multiplications in the 2D transform equation, and operates according to one or more sets of transform matrices 1340 (the transforms can be implemented by a matrix multiplication process) having a certain resolution. A maximum dynamic range 1350 of the transform process, referred to as MAX_TR_DYNAMIC_RANGE, applies to the calculations used in this process. The output of the transform stage is a set of transform coefficients 1360 according to the MAX_TR_DYNAMIC_RANGE. The transform stage 1330 corresponds generally to the transform unit 340 of FIG. 5.

The coefficients 1360 are then passed to a quantising stage 1370 generally corresponding to the quantiser 350 of FIG. 5. The quantising stage may use a multiply-shift mechanism under the control of quantisation coefficients and scaling lists 1380, including clipping to the maximum dynamic range ENTROPY_CODING_DYNAMIC_RANGE (which is, in embodiments, the same as MAX_TR_DYNAMIC_RANGE). The output of the quantising stage is a set 1390 of quantised coefficients according to ENTROPY_CODING_DYNAMIC_RANGE which is then (in the full encoder, not shown here) passed to an entropy encoding stage such as that represented by the scan unit 360 and entropy encoder 370 of FIG. 5.

Using the notation introduced in respect of FIG. 21, the main sources of calculation noise, ignoring (for the purposes of this discussion) noise shaping caused by the various predictions and the RQT (residual quad-tree) and RDOQ (rate distortion optimized quantisation) decision processes, in HEVC are discussed below:

Transform Matrix Coefficient Values

Ideally, the inverse transform applied to transformed coefficients will reproduce the original input values. However, this is limited by the integer nature of the calculations. In HEVC, the transform matrix coefficients have 6 fractional bits (i.e. they have an inherent left-shift of 6).

Shifting Results to MAX_TR_DYNAMIC_RANGE After Each Stage of the Transform

The forward transform will result in values that are bitDepth+$\log_2$(size) bits in size. After the first stage of the transform, the coefficients' width in bits should be at least bitDepth+$\log_2$(size) (though additional bits will help maintain more accuracy). However, in HEVC, these intermediates are shifted in the forward (encoder only) transform so that they never exceed MAX_TR_DYNAMIC_RANGE; similarly for the second stage. In the inverse transform, the values at the output of each stage are clipped to MAX_TR_DYNAMIC_RANGE.

If MAX_TR_DYNAMIC_RANGE is less than bitDepth+$\log_2$(size), then the values out of the forward transform will actually be shifted left (instead of right) in the quantising stage, and then clipped to 15-bit (ENTROPY_CODING_DYNAMIC_RANGE). Actually, if ENTROPY_CODING- _DYNAMIC_RANGE is less than bitDepth+log 2(size)+1, clipping will occur when QP is less than (4−(6*(bitDepth−8))).

In HEVC, MAX_TR_DYNAMIC_RANGE (and ENTROPY_CODING_DYNAMIC_RANGE of 15 is used for up to 10 bit operation, although coefficients in 32×32 blocks may be clipped for QP<−8. In addition, the lack of headroom for internal accuracy may also introduce errors for low QPs.

Noise Added During Quantisation

Although the quantiser and inverse quantiser of an encoder and decoder will add noise when quantising, additional noise may be inadvertently added when the scaling lists are applied, and because the quantisation coefficients defined in the arrays 'quantScales' and 'invQuantScales' are not necessarily perfect reciprocals.

The effects of transform matrix precision and MAX_TR_DYNAMIC_RANGE are discussed below.

Empirical data was obtained by analysis (under the so-called intra coding profile) of the coding of five video sequences from the so-called SVT test set (1920×1080 50p at 16 bit, scaled down from 4K video). Of these sequences, only the first 150 frames have been used in the tests. A sixth sequence, referred to as Traffic_RGB (2560×1600 30p at 12 bit) is defined by the standard Range Extension test conditions applicable to HEVC at the time of filing the present application.

In the empirical tests, if the file (input data) bit depth was less than the internal bit depth being tested (the codec's input bit depth), then the samples were padded (with the LSBs set to 0); if the file bit depth was more than the internal bit depth, the samples were scaled and rounded.

In the discussion below, bitDepth is used to describe the internal bit depth rather than the bit depth of the input data. Systems with internal bit depth (bitDepth) up to 16 are considered.

Figure 22:
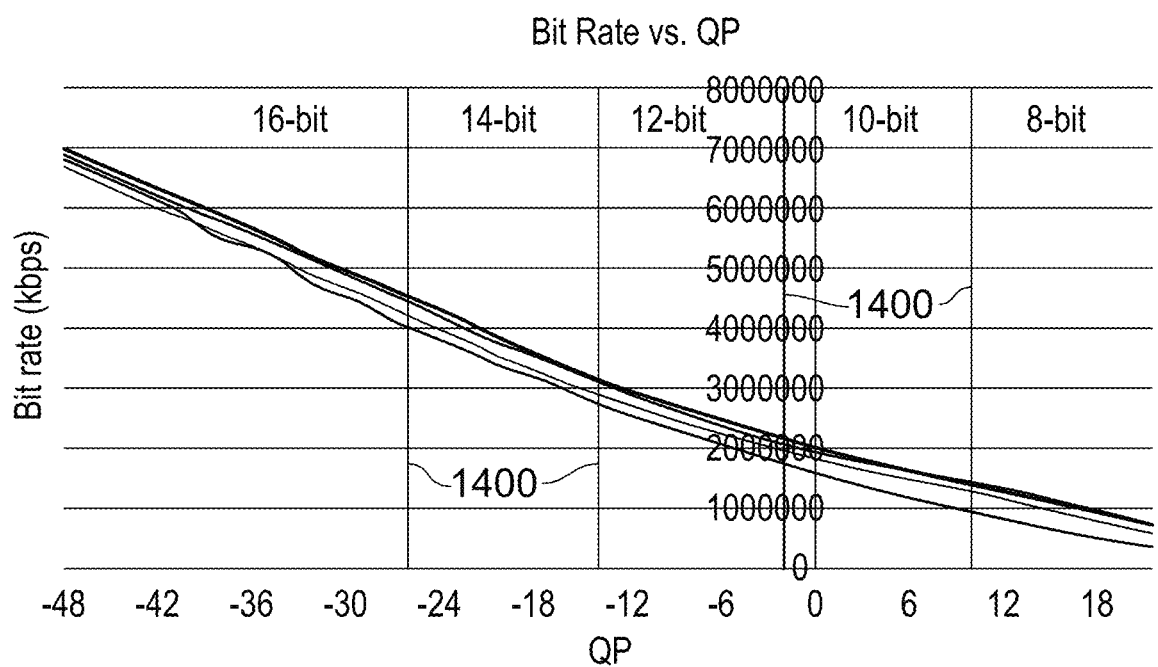
FIG. 22 is a graph of bit rate against quantisation parameter (QP)

FIG. 22 is a graph of bit rate against quantisation parameter (QP) which schematically illustrates the empirical performance of the encoder system of FIG. 21 at a number of internal bit depths. FIG. 23 is a graph of PSNR for the green channel (on the basis that it is easier to obtain empirical data for one channel, and green is the channel which contributes the most to the viewer's perception of the output video), against QP. The graphs of FIG. 22 are formed from a composite of data for 16-bit (QP −48 to −26), 14-bit (QP −24 to −14), 12-bit (QP −12 to −2), 10-bit (QP 0 to 10) and 8-bit (QP 12 to 22) processing. Vertical lines 1400 schematically indicate the points at which the bit depth changes. The multiple curves in FIG. 22 correspond to results obtained with different respective test sequences.

FIG. 22 shows that the bit rate changes generally monotonically with QP.

Figure 24:
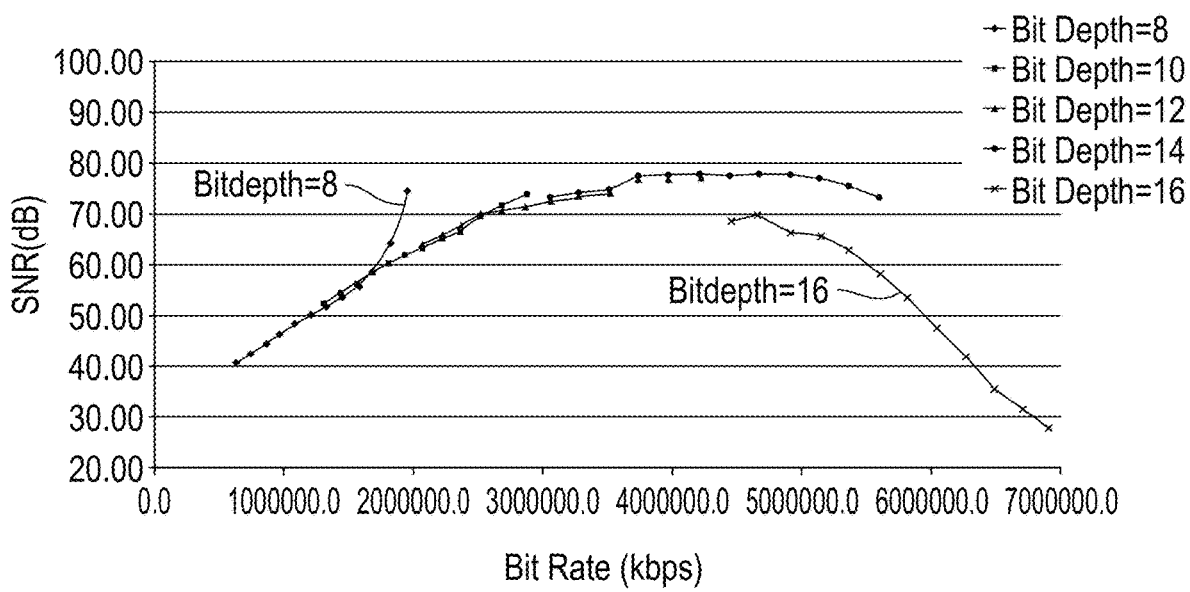
FIG. 24 is a graph of bit rate against green channel PSNR for six test bit depths, with a transform skip mode disabled.

Referring to FIG. 23, the PSNR for bitDepth=8 and bitDepth=10 increases sharply at QPs of 4 and below (rightmost three data points on each curve). At QP 4, the quantisation divisor for 8-bit is 1 (QP −8 for 10 bit), leaving the mismatch between the DCT and IDCT and between the quantisation and dequantisation coefficients as the only probable sources of error. As the system tends towards lossless processing, the MSE approaches zero and the SNR spikes upward FIG. 24 is a graph of PSNR against bit rate for one test sequence at a series of different internal bit depths (8, 10, 12, 14, 16). The five curves overlie one another almost exactly for most of their range and so cannot easily be distinguished.

A 10-bit system at the same operating point has errors mainly in the two least significant bits, meaning it also approaches lossless processing when considering only 8-bit accuracy, but as indicated elsewhere in this description, the act of converting 10-bit video to 8-bit video must also be considered. This will add a MSE of 1.5, which is hidden (that is to say, not shown explicitly as a result in these empirical tests but still resulting in a higher overall SNR) when considering a lower accuracy.

Figure 25:
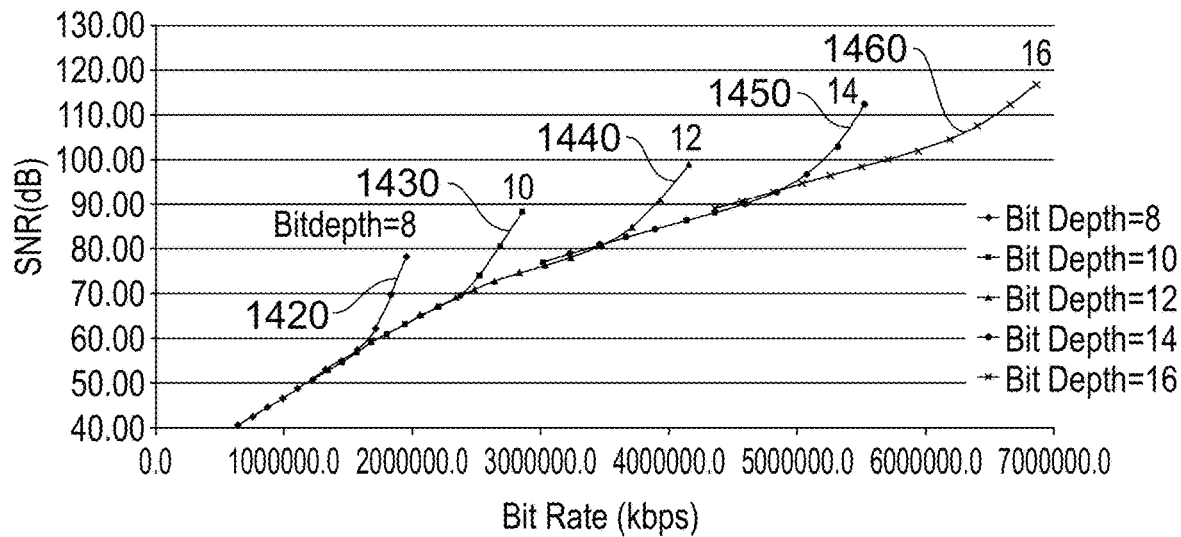
FIG. 25 is a graph of bit rate against green channel PSNR for six test bit depths, with 14 bit transform matrices.

In systems that are not limited by internal accuracy to a peak SNR, this increase towards lossless processing can be seen for each bitDepth as QP drops below (4−(6*(bitDepth−8))). This is shown in FIG. 25, which is a graph of green channel PSNR against bit rate for a range of bit depths (8, 10, 12, 14, 16) with MAX_TR_DYNAMIC_RANGE=21, ENTROIPY_CODING_DYNAMIC_RANGE=21 and 14 bit transform matrices, with RDOQ disabled and transform skip disabled. The five curves overlie one another except for portions 1420 (of the 8 bit curve), 1430 (of the 10 bit curve), 1440 (of the 12 bit curve), 1450 (of the 14 bit curve) and 1460 (of the 16 bit curve). It can be seen that, for the same number of bits, significantly higher SNRs are achievable than those shown in FIG. 24.

Figure 26:
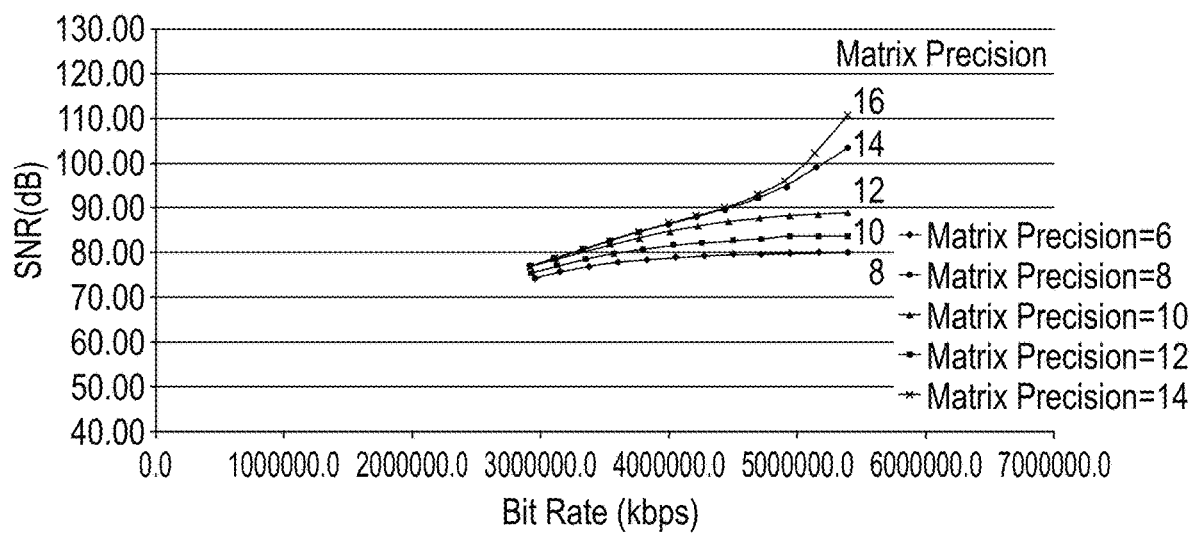
FIG. 26 is a graph of PSNR against bit rate for one test sequence comparing various precision DCT matrices.

The empirical results have shown that in embodiments of the present disclosure, the transform matrix precision should be at least bitDepth-2. FIG. 26 is a graph of PSNR against bit rate for the green channel of one test sequence with bitDepth=10 and MAX_TR_DYNAMIC_RANGE=17, comparing various precision DCT matrices.

In embodiments, MAX_TR_DYNAMIC_RANGE should be at least 5 (which is the minimum value of $\log_2(\text{size})$) more than bitDepth. Additional accuracy has been shown to further improve coding efficiency.

In embodiments, ENTROPY_CODING_DYNAMIC_RANGE should be at least 6 more than the bitDepth (1 for the "quantisation" factor applied by QPs less than (4−(6*(bitDepth−8))) plus 5 for the maximum value of $\log_2(\text{size})$). In other embodiments, where the clipping for the lowest QP values is not a concern, then the ENTROPY_CODING_DYNAMIC_RANGE should be at least 5 (the minimum value of $\log_2(\text{size})$) more than bitDepth.

For the 16-bit system, the transform matrix precision should be set to 14, MAX_TR_DYNAMIC_RANGE should be set to 21, and ENTROPY_CODING_DYNAMIC_RANGE should be set to 22. Since having more internal accuracy is rarely considered harmful, these parameters have also been tested at different bitDepths, producing results which demonstrate that, for the same number of bits, significantly higher SNRs are achievable, and that the increased-accuracy system has PSNR/MSE operating points that are suitable for bitDepths of up to 16.

If Range Extensions is intended to produce a single new profile for all bit depths, then the system described above is suitable. However, if different profiles are to be described for different maximum bitDepths, then having different parameter values may be useful for reducing hardware complexity in systems that do not require the highest profiles. In some embodiments, the different profiles may define different values for transform matrix precision, MAX_TR_DYNAMIC_RANGE and ENTROPY_CODING_DYNAMIC_RANGE.

In other embodiments, the profile would allow the values of some or all of transform matrix precision, MAX_TR_DYNAMIC_RANGE and ENTROPY_CODING_DYNAMIC_RANGE to be chosen from a list of permissible values by the encoder (with the cost of implementation being a selection criterion), or a function of side information such as the bitDepth. However, this may require multiple sets of transform matrices if the transform matrix precision is to be varied and for this reason, in further embodiments only one transform matrix precision is defined for a profile, with that transform matrix precision corresponding to the recommended value for the maximum bit depth for which the profile is designed. A set of possible profiles is proposed below with reference to FIG. 28.

Examples values of transform matrix precision, MAX_TR_DYNAMIC_RANGE, ENTROPY_CODING_DYNAMIC_RANGE and bitDepth are shown in the following table:

| bitDepth | 16 | 15 | 14 | 13 | 12 | 11 | 10 | 9 | 8 |
|---|---|---|---|---|---|---|---|---|---|
| Transform Matrix Precision | 14 | 13 | 12 | 11 | 10 | 9 | 8‡ | 7‡ | 6 |
| MAX_TR_DYNAMIC_RANGE | 21 | 20 | 19 | 18 | 17 | 16 | 15 | 15* | 15* |
| ENTROPY_CODING_DYNAMIC_RANGE | 22 | 21 | 20 | 19 | 18 | 17 | 16† | 15 | 15* |

In the table, values marked with a '*' are clipped to a minimum of 15, in line with the current description of HEVC. The values marked with '†' and '‡' are greater than those specified for the current description of HEVC, those being 15 and 6 respectively.

If different profiles are to be used, then in embodiments of the disclosure these specifications may be used as minima (noting that the HEVC version 1 10-bit system does not quite meet these targets). Using values less than these indicated minima is possible, although this will degrade the PSNR for higher bit rates (lower QPs).

Accordingly, the table above gives an example of an arrangement in which the precision and/or dynamic range of one or more coding (and complementary decoding) stages is set according to the bit depth of the video data.

In some embodiments, however, the luma and chroma data can have different bit depths.

Accordingly, in such situations, although the precision and/or dynamic range values could be set differently (as between luma and chroma data), so that one set of values is adopted for luma data and another, potentially different set of values is adopted for chroma data, embodiments of the present disclosure handle this matter in a different way.

Some embodiments recognise that it can be advantageous, from the point of view of implementational efficiency, to use the same precision and/or dynamic range values for both luma and chroma data, while still maintaining the ability to vary those values according to bit depth. The use of the same parameters between the luma and chroma data allows a single encoding path to be established for luma and chroma data, avoiding the need to set up (in either a software or a hardware implementation) two different, separately programmable or controllable, paths.

The selection of which set of parameters to use can be according to a predetermined rule. For example, the parameters relating to the luma data can be selected. Alternatively, and giving improved flexibility of operation, the parameters according to that video component (for example, luma, chroma) having the greatest bit depth of the video components can be selected. So, for example, using the table above, if the luma bit depth were (say) 16 and the chroma bit depth were (say) 14, then the column of parameters relating to a bit depth of 16 would be used for luma and for chroma processing.

The bit depth and/or the relationship of the bit depth to the parameters discussed above and/or an index into a table of parameters such as that shown above can be defined by one or more "parameter sets" of the video data. At the highest level is a video parameter set (VPS), followed by (in decreasing level, corresponding to more granularity) a sequence parameter set (SPS), where a sequence contains one or more pictures, a picture parameter set (PPS), and a slice parameter set, where a picture contains one or more slices. The relationships or bit depths or precision and/or dynamic range values can be defined by any of these, but in some embodiments they are defined by the SPS.

Accordingly, in the embodiments just described, the precision and/or dynamic range values for one or more coding stages are arranged to vary according to the video bit depth, such that if the bit depth differs between video components (for example, between luma and chroma data) then a predetermined rule is used to select a single set of precision and/or dynamic range values for use with all of the video components. Similar considerations apply in respect of image data (rather than video data). Similar principles apply at the encoder and decoder. Accordingly, these arrangements can also provide an example of an arrangement in which, for input or output image data having image components of different bit depths, a single set of the maximum dynamic range and/or the data precision of the transform matrices is selected for use with all of the image components.

In some embodiments, the single set of the maximum dynamic range and/or the data precision of the transform matrices is selected as those values relating to that one of the image components having the greatest bit depth.

Note that at the decoder side, and in the inverse path of the encoder, in some embodiments the same (or one or both of the same) maximum dynamic range and/or the data precision of the transform matrices may be used as those used at the encoder side. In other embodiments, the data precision of the inverse (decoder side) transform matrices is set to a predetermined value such as 6.

Examples of these arrangements will be described further below with respect to FIGS. 38 and 39.

Turning now to the CABAC system, as discussed above this provides an example of an encoding technique involving selecting one of a plurality of complementary sub-ranges of a set of code values according to the value of a current input data value, the set of code values being defined by a range variable, assigning the current input data value to a code value within the selected sub-range, modifying the set of code values in dependence upon the assigned code value and the size of the selected sub-range, and detecting whether the range variable defining the set of code values is less than a predetermined minimum size and if so, successively increasing the range variable so as to increase the size of the set of code values until it has at least the predetermined minimum size; and outputting an encoded data bit in response to each such size-increasing operation. In embodiments, the proportions of the sub-ranges relative to the set of code values are defined by a context variable associated with the input data value. Embodiments of the CABAC arrangement involve: following the coding of an input data value, modifying the context variable, for use in respect of a next input data value, so as to increase the proportion of the set of code values in the sub-range that was selected for the current input data value.

Also as discussed above, in some embodiments the HEVC CABAC entropy coder codes syntax elements using the following processes:

The location of the last significant coefficient (in scan order) in the TU is coded.

For each 4×4 coefficient group (groups are processed in reverse scan order), a significant-coefficient-group flag is coded, indicating whether or not the group contains non-zero coefficients. This is not required for the group containing the last significant coefficient and is assumed to be 1 for the top-left group (containing the DC coefficient). If the flag is 1, then the following syntax elements pertaining to the group are coded immediately following it: Significance map; Greater-than-one map; Greater-than-two flag; Sign bits; and Escape codes.

Figure 29:
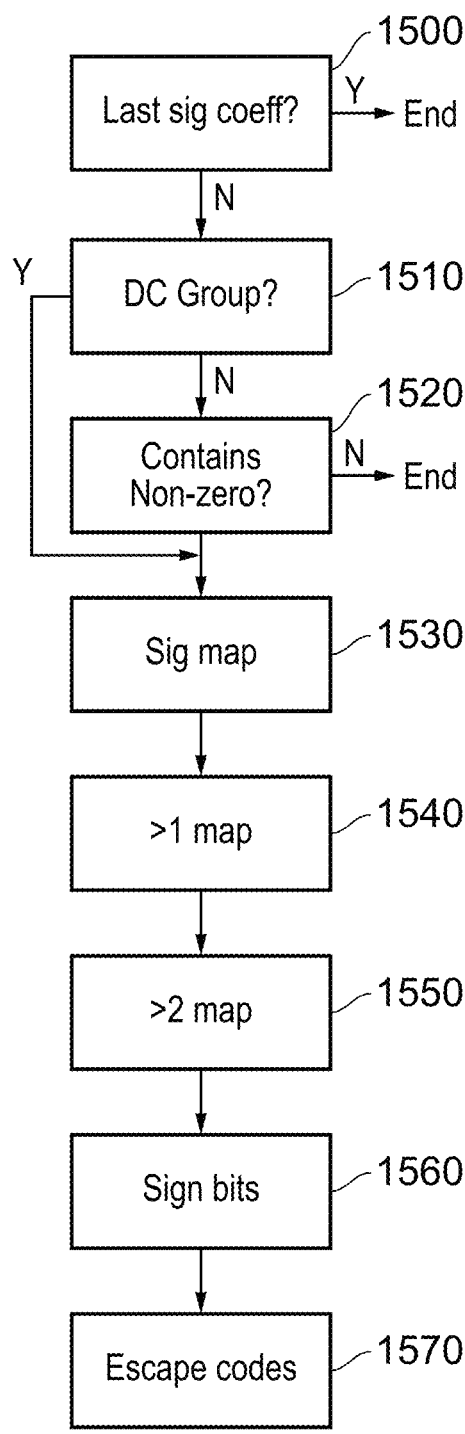
FIGS. 29 to 31 are schematic flowcharts respectively illustrating versions of part of a CABAC process.

This arrangement is illustrated schematically in FIG. 29. At a step 1500, the CABAC encoder checks whether a current group contains the last significant coefficient. If so, the process ends. If not, the process proceeds to a step 1510 at which the encoder checks whether the current group is the top-left group containing the DC coefficient. If so, control passes to a step 1530. If not, at a step 1520, the encoder detects whether the current group contains non-zero coefficients. If not, the process ends. If so, then at the step 1530 a significance map is generated. At a step 1540, a >1 map is generated which indicates, for up to 8 coefficients with significance map value 1, counted backwards from the end of the group, whether the magnitude is greater than 1. At a step 1550, a >2 map is generated. For up to 1 coefficient with >1 map value of 1 (the one nearest the end of the group), this indicates whether the magnitude is greater than 2. At a step 1560, sign bits are generated and ante step 1570, escape codes are generated for any coefficient whose magnitude was not completely described by an earlier syntax element (that is to say, data generated in any of the steps 1530-1560).

For a 16-bit, 14-bit or even 12-bit system at the operating point where the MSE is less than 1 (typically at QPs −34, −22 and −10 respectively), the system typically yields very little compression (for 16-bit, it actually inflates the source data). The coefficients are generally large numbers, and therefore are almost always escape-coded. For that reason, two proposed changes have been made to the entropy coder to allow for higher bit depths by placing a fixed number of LSBs, $B_F$, in the bit stream for each coefficient. In essence the schemes permit the current HEVC CABAC entropy coder, which was developed for 8 and 10-bit operation, to operate at the original bitDepth for which it was designed, by effectively converting a higher-bit system, such as 16-bit, into a lower-bit system, such as 10-bit, with an alternative path for the additional accuracy. The effectiveness of the splitting method employed is aided since the lower-bit system values are significantly more predictable and therefore suitable for encoding with more complex encoding schemes, whereas the additional accuracy required by the higher-bit system is less predictable and therefore less compressible and complex encoding schemes are less effective. For example a 16-bit system could configure $B_F$ to be 8.

The use of the fixed bits schemes is indicated in the bit-stream by the encoder, and when a scheme is used, the means to determine the number of fixed bits would indicated by the encoder to the decoder. Those means would be either encoding the number directly, or indicating how to derive the value $B_F$ from parameters present in the bit-stream (including QP, bit depth, and/or profile) already coded in the bit-stream, or a combination thereof. The encoder would also have the option to indicate different $B_F$ values for different Pictures, Slices and CUs, using the same means, or by indicating delta values to the $B_F$ value derived for the sequence, picture, slice or preceding CU. The value of $B_F$ may also be configured to be different for the different transform unit block sizes, the different prediction types (inter/intra), and different colour channel, where the nature of the source video would steer the encoder in choosing different parameters.

An example derivation for $B_F$ based on QP is as follows:

$$B_F = \max(0, \text{int}(QP/-6))$$

An example derivation for $B_F$ based on the bit depth is as follows:

$$B_F = \text{bitDepth} - 8$$

An example derivation for $B_F$ based on the transform unit block size and QP:

$$B_F = \max(0, \text{int}(QP/-6) + 2 - \log_2(\text{size}))$$

The various values of $B_F$ could be determined in an encoder using a pre-coder (trial) arrangement, or could be configured to follow pre-determined rules.

Entropy Coding Embodiment 1

To allow for processing at higher bit depths, the process of the HEVC entropy coder is changed to the following for a number of fixed bits $B_F$ less than bitDepth:

The location of the last significant coefficient (in scan order) in the TU is coded.

For each 4×4 coefficient group (groups are processed in reverse scan order), each coefficient C is split into a most-significant part $C_{MSB}$ and a least-significant part $C_{LSB}$, where $$C_{MSB} = \text{abs}(C) >> B_F$$

$$C_{LSB} = \text{abs}(C) - (C_{MSB} << B_F)$$

and $B_F$ is the number of fixed bits to use, as determined from the bit stream.

The generation of $C_{MSB}$ and $C_{LSB}$ as discussed provide an example (in respect of a technique for encoding a sequence of data values) of generating, from the input data values, respective complementary most-significant data portions and least-significant data portions, such that the most-significant data portion of a value represents a plurality of most significant bits of that value, and the respective least-significant data portion represents the remaining least significant bits of that value.

A significant-coefficient-group flag is coded, indicating whether or not the group contains non-zero values of $C_{MSB}$. This is required for the group containing the last significant coefficient and is assumed to be 1 for the top-left group (containing the DC coefficient). If the flag is 1, then the following syntax elements pertaining to the group are coded immediately following it:

Significance Map:

For each coefficient in the group, a flag is coded indicating whether or not the value of $C_{MSB}$ is significant (has a non-zero value). The flag is coded for the coefficient indicated by the last-significant position.

Greater-Than-One Map:

For up to eight coefficients with significance map value 1 (counted backwards from the end of the group), this indicates whether $C_{MSB}$ is greater than 1.

Greater-Than-Two Flag:

For up to one coefficient with greater-than-one map value 1 (the one nearest the end of the group), this indicates whether $C_{MSB}$ is greater than 2.

Fixed Bits:

For each coefficient in the group, the value of $C_{LSB}$ is coded as bypass data using equiprobable CABAC bins.

Sign Bits:

For all non-zero coefficients, sign bits are coded as equiprobable CABAC bins, with the last sign bit (in reverse scan order) possibly being instead inferred from parity when sign bit hiding is used.

Escape Codes:

For any coefficient whose magnitude was not completely described by an earlier syntax element, the remainder is coded as an escape code.

However, where the significant-coefficient-group flag is a 0, then the following syntax elements pertaining to the group are coded immediately following it:

Fixed Bits:

For each coefficient in the group, the value of $C_{LSB}$ is coded as equiprobable CABAC bins.

Sign Bits:

For all non-zero coefficients, sign bits are coded as equiprobable CABAC bins, with the last sign bit (in reverse scan order) possibly being instead inferred from parity when sign bit hiding is used.

The generation of one or more of these maps and flags provides an example of generating one or more data sets indicative of positions, relative to the array of the values, of most-significant data portions of predetermined magnitudes. The encoding of one or more maps using CABAC provides an example of encoding the data sets to an output data stream using binary encoding. The encoding of other data using equiprobable CABAC bins provides an example of including data defining the less-significant portions in the output data stream, or (using other terminology) an example of including data defining the less-significant data portions in the output data stream comprises encoding the least-significant data portions using arithmetic coding in which symbols representing the least-significant data portions are encoded according to respective proportions of a coding value range, in which the respective proportions of the coding value range for each of the symbols that describe the least-significant data portion are of equal size. As an alternative to equiprobable CABAC encoding, however, the step of including data defining the less-significant portions in the output data stream can comprise directly including the least-significant data portions in the output data stream as raw data.

An embodiment of this disclosure changes the interpretation of the significant coefficient group flag to indicate whether any of the coefficients are non-zero (not just their $C_{MSB}$ counterparts). In this case, the coefficient group containing the last coefficient in the reverse scan order would not need to be indicated (as it would be 1), and additional syntax elements would not needed to be coded when the significant-coefficient-group flag is a 0. This provides an example of which the significance map comprising a data flag indicative of the position, according to a predetermined ordering of the array of values, of the last of the most-significant data portions having a non-zero value.

Figure 30:
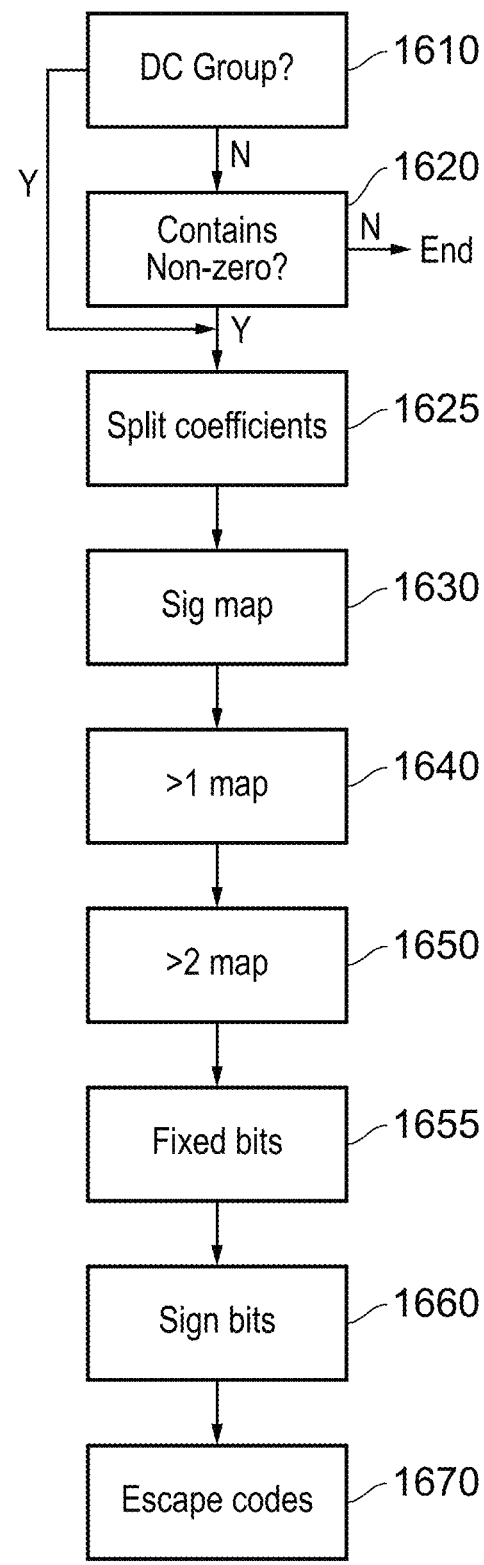

This latter arrangement is illustrated schematically in FIG. 30 which corresponds in many respects to FIG. 29. Comparing the two drawings, it will be seen that FIG. 30 has no equivalent of the step 1500 of FIG. 29, corresponding to the fact that the process takes place even for the group containing the last significant coefficient. Steps 1610 and 1620 generally correspond to the steps 1510 and 1520 of FIG. 29. At a newly introduced step 1625, the coefficients are split into MSB and LSB portions as discussed above. Steps 1630, 1640 and 1650 generally correspond to respective steps 1530, 1540 and 1550 of FIG. 29 except that they act only on the MSB portion of the split coefficients. A newly introduced step 1655 involves encoding the LSB portions of the split coefficients as fixed bits as discussed above. Steps 1660 and 1670 generally correspond to the steps 1560 and 1570 of FIG. 29.

This modification can effectively produce a system where the CABAC entropy coder is operating at the original bitDepth for which it was designed, by selecting $B_F$ so that a number of MSBs equal to the design bit depth of the encoder is passed through the CABAC encoding, with the higher bit depth's LSBs (which are the least predictable and therefore least compressible) being bypass-coded. For example, if the encoder is an 8 or 10 bit depth encoder, $B_F$ could equal 8 or 10. This provides an example of a system in which the sequence of data values represent image data having an image data bit depth; and the method comprises setting the number of bits to be used as the plurality of most significant bits in each most-significant data portion to be equal to the image data bit depth.

Figure 27:
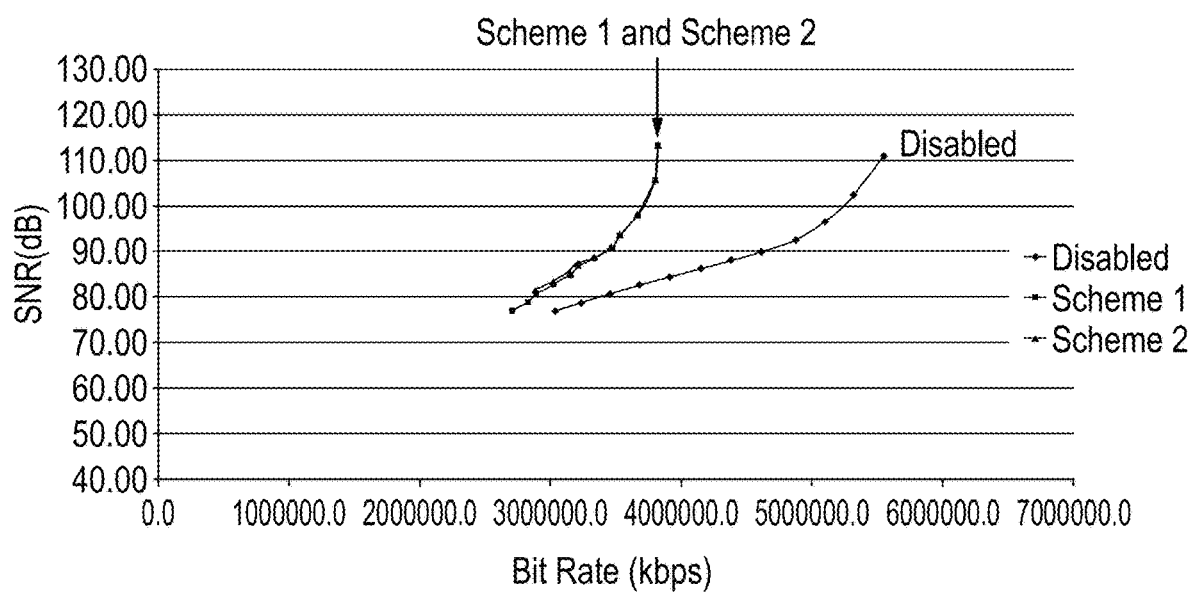
FIG. 27 is a graph of PSNR against bit rate for one test sequence showing the use of bypass fixed-bit encoding.

As discussed, the techniques may (in some embodiments) be applied to arrangements in which the sequence of data values comprises a sequence of frequency transformed image coefficients. However, other types of data (such as audio or simply numerical data) could be used. The results for this proposal can be seen in FIG. 27, which is a graph of PSNR against QP for one test sequence with the DCT matrix precision and MAX_TR_DYNAMIC_RANGE set according to bit depth, showing equivalent operations with (the curve 1680) and without (the curve 1690) bypass fixed-bit encoding. The saving in bit rate for the system with fixed bits (relative to the system without fixed bits) varies from 5% at QP 0 up to 37% at QP −48. The best value of $B_F$ will be sequence dependent. An example of $B_F$ is 8 or 10 as discussed above.

Entropy Coding Embodiment 2

A similar scheme under other embodiments applies many of the same processing steps, but retains the original functionality of the significance map—where a flag value of 0 indicates a coefficient value of 0 (rather than—as in the Entropy Coding Embodiment 1—a value of 0 for the MSB portion of the coefficient). This may be more useful when considering (typically smooth) computer generated video (where zeros are expected to be more common). This Entropy Coding Embodiment comprises the following processing steps for a number of fixed bits $B_F$ less than bitDepth:

The location of the last significant coefficient (in scan order) in the TU is coded.

For each 4×4 coefficient group (groups are processed in reverse scan order), a significant-coefficient-group flag is coded, indicating whether or not the group contains non-zero coefficients. This is not required for the group containing the last significant coefficient and is assumed to be 1 for the top-left group (containing the DC coefficient). If the flag is 1, then each coefficient C is split into a most-significant part $C_{MSB}$ and a least-significant part $C_{LSB}$, where $$C_{MSB}=(\text{abs}(C)-1)>>B_F$$

and $$C_{LSB}=(\text{abs}(C)-1)-(C_{MSB}<<B_F)$$

The generation of $C_{MSB}$ and $C_{LSB}$ as discussed provide an example (in respect of a technique for encoding a sequence of data values) of generating, from the input data values, respective complementary most-significant data portions and least-significant data portions, such that the most-significant data portion of a value represents a plurality of most significant bits of that value, and the respective least-significant data portion represents the remaining least significant bits of that value.

The following syntax elements pertaining to the group are coded immediately following it: Significance map:

For each coefficient in the group, a flag is coded indicating whether or not the coefficient C is significant (has a non-zero value). No flag is necessary for the coefficient indicated by the last-significant position.

Greater-Than-One Map:

For up to eight coefficients with significance map value 1 (counted backwards from the end of the group), this indicates whether $C_{MSB}$ is greater than or equal to 1.

Greater-Than-Two Flag:

For up to one coefficient with greater-than-one map value 1 (the one nearest the end of the group), this indicates whether $C_{MSB}$ is greater than or equal to 2.

Sign Bits:

For all non-zero coefficients, sign bits are coded as equiprobable CABAC bins, with the last sign bit (in reverse scan order) possibly being instead inferred from parity when sign bit hiding is used.

Fixed Bits:

For each non-zero coefficient in the group, the value of $C_{LSB}$ is coded.

Escape Codes:

For any coefficient whose magnitude was not completely described by an earlier syntax element, the remainder is coded as an escape code.

The generation of one or more of these maps and flags provides an example of generating one or more data sets indicative of positions, relative to the array of the values, of most-significant data portions of predetermined magnitudes. The encoding of one or more maps using CABAC provides an example of encoding the data sets to an output data stream using binary encoding. The encoding of other data using equiprobable CABAC bins provides an example of including data defining the less-significant portions in the output data stream.

Note that there are various options for the order of these various components of the data in the output stream. For example, with reference to the sign bits, fixed bits and escape codes, the order for a group of (say) n coefficients (where n might be 16, for example) could be:

n×sign bits, then n×sets of fixed bits, then n×escape codes; or n×sign bits, then n×(escape code and fixed bites for one coefficient).

Figure 31:
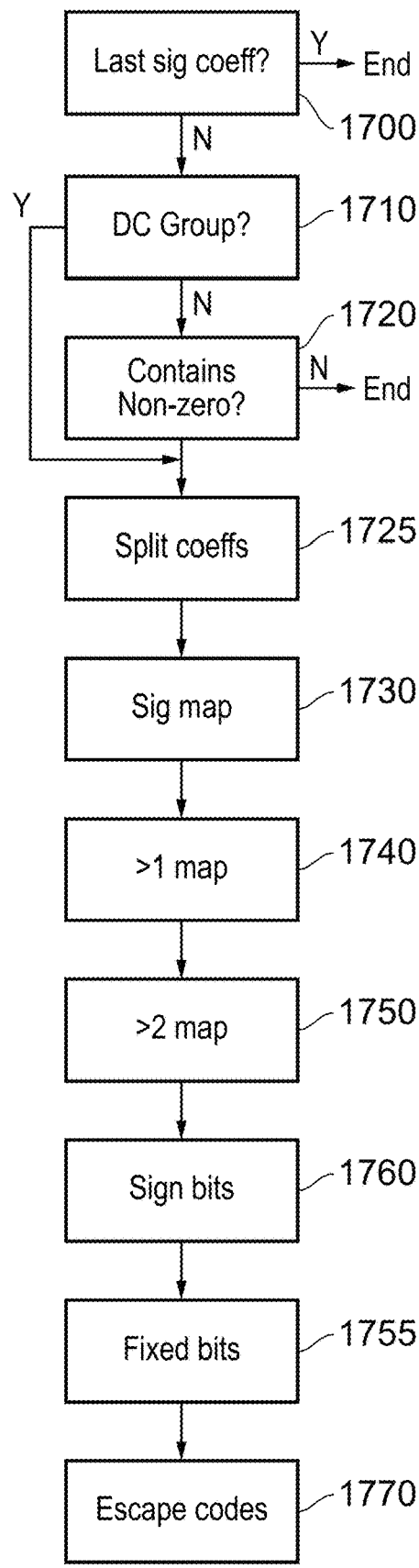

This arrangement is schematically illustrated in the flowchart of FIG. 31. Here, the steps 1700 . . . 1770 correspond to respective steps of FIGS. 31 and 32 in the following way, unless a difference is identified. Note that the step 1755 follows the step 1760 in FIG. 31 (the similar step 1655 preceded the step 1660 in FIG. 30).

The step 1700 corresponds generally to the step 1500 of FIG. 29. If this is not the group containing the last significant coefficient, control passes to the step 1710. The steps 1710 and 1720 correspond to the steps 1610 and 1620 of FIG. 30. The coefficients are split at the steps 1725 corresponding to the step 1625 of FIG. 30. However, at the steps 1730, in contrast to the arrangement of the step 1630 discussed earlier, the whole coefficient (ignoring, for the time being, the split executed in the step 1725) is used in the derivation of the significance map. The steps 1740 and 1750 act on only the MSB portions of the split coefficients and correspond in function to the steps 1640 and 1650. Apart from the fact that the ordering of the steps is illustrated (by way of example) slightly differently between FIGS. 32 and 33, the steps 1755, 1760 and 1770 correspond to the functionality of the steps 1655, 1660 and 1670.

Results comparing these two Entropy Coding Embodiments can be seen in FIG. 28. FIG. 28 is a graph illustrating, for each of six test sequences, a bit rate percentage improvement for the Entropy Coding Embodiment 2 relative to the results achieved (with otherwise identical parameters) for the Entropy Coding Embodiment 1.

The Entropy Coding Embodiment 2 has been shown to be 1% less efficient on average for some source material than the Entropy Coding Embodiment 1 for negative QPs, rising to approximately 3% for positive QPs. However, for some softer source material, the opposite is observed, due to the increased presence of zeros in the coefficients. In an embodiment, the encoder would be able to choose either entropy coding method and signal to the decoder the choice.

Since the saving for positive QPs is small compared to the saving for negative QPs, the entropy coding modifications could be enabled only when QP is negative. Considering that the Entropy Coding Embodiment 1 shows bit savings of up to 37% for negative QPs, there is little difference between the two Entropy Coding Embodiments at these operating points when compared to a system with no entropy coding modifications.

Accordingly, in example embodiments in which the frequency-transformed input image coefficients are quantised frequency-transformed input image coefficients according to a variable quantisation parameter selected from a range of available quantisation parameters, the techniques can comprise encoding the array of frequency-transformed input image coefficients according to the most-significant data portions and the least-significant data portions for coefficients produced using a quantisation parameter in a first predetermined sub-range of the range of available quantisation parameters; and for coefficients produced using a quantisation parameter not in the first predetermined sub-range of the range of available quantisation parameters, encoding the array of frequency-transformed input image coefficients such that the number of bits in each most-significant data portion equals the number of bits of that coefficient and the respective least-significant data portion contains no bits.

Since the quantity of data being coded is somewhat higher than observed for standard HEVC version 1 operating points, an additional stage is or may be applicable to both proposed systems, and indeed a system where the previously proposed systems cannot be or are not enabled will now be discussed in connection with further embodiments of the disclosure.

This additional stage causes the CABAC stream to be bit-aligned prior to coding the bypass data for each coefficient group. This allows quicker (and in-parallel) decoding of the bypass data, since the values can now be read directly out of the stream, removing the requirement for long-division when decoding bypass bins.

One mechanism to achieve this is to apply the CABAC termination method previously presented above.

However, in the embodiment now described, instead of terminating the bit-stream, the CABAC state is aligned to a bit boundary.

In embodiments, the set of CABAC code values comprises values from 0 to an upper value defined by the range variable, the upper value being between the predetermined minimum size (for example, 256) and a second predetermined value (for example, 510).

To bit-align the stream, m_Range is simply set to 256 in both the encoder and decoder. This significantly simplifies the encoding and decoding process, allowing the binary data to be read directly out of m_Value in raw form, and therefore many bits at a time can simultaneously be processed by the decoder.

Note that the act of setting m_Range to 256 incurs a loss of, on average, 0.5 bits (if m_Range was already 256, there is no loss; if m_Range was 510, then approximately 1 bit will be lost; the average over all valid values of m_Range is therefore 0.5 bits).

Figure 33:
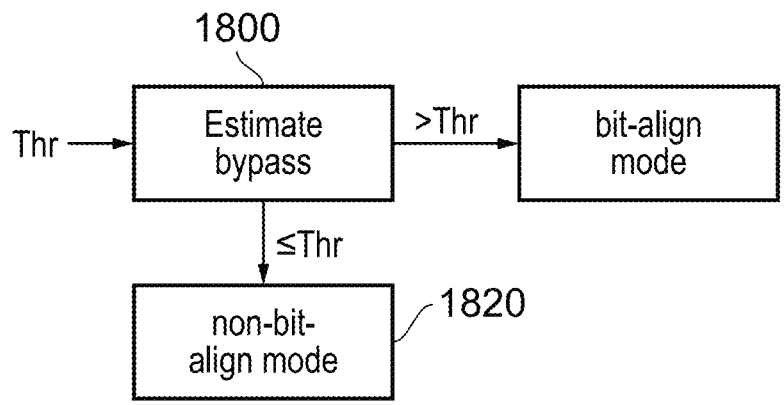
FIGS. 33 to 35 are schematic flowcharts respectively illustrating versions of a termination stage of a CABAC process.
Figure 34:
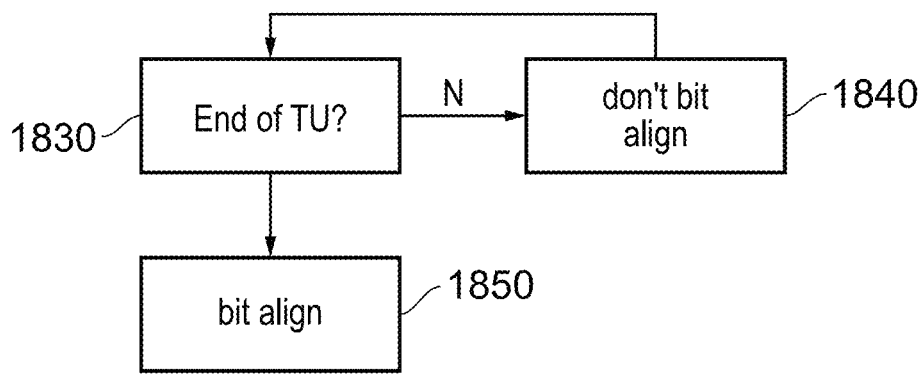
Figure 35:
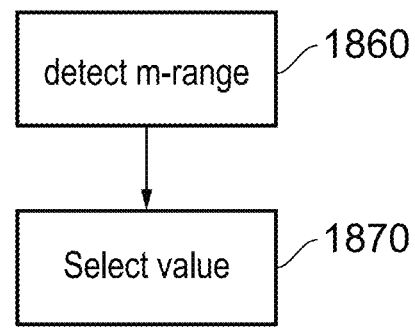

A number of methods can be used to mitigate the loss, or potential cost, incurred by these techniques. FIGS. 33 to 35 are schematic flowcharts respectively illustrating versions of a termination stage of a CABAC process as carried out by the CABAC encoder.

According to FIG. 33, whether or not to bit-align could be selected depending on an estimate of the expected quantity of bypass-coded data (for example, based on the number of greater-than-one flags equal to 1). If few bypass-coded data are expected, bit-aligning is costly (as it wastes on average 0.5 bits per alignment), and also unnecessary since the bit-rate is likely to be lower. Accordingly, in FIG. 33, a step 1800 involves detecting the estimated quantity of bypass-encoded data by detecting the number of >1 flags which have been set, and comparing that number to a threshold value Thr. If the estimate exceeds the threshold Thr then control passes to a step 1810 at which the bit align mode is selected. Otherwise, control passes to a step 1820 at which the non-bit-align mode is selected. The steps of FIG. 33 can be repeated each sub-group in each TU, for example. This provides an example of encoding data representing coefficients which are not represented a data set as bypass data; detecting the quantity of bypass data associated with a current array; and applying the setting step if the quantity of bypass data exceeds a threshold amount, but not applying the setting step otherwise.

Referring to FIG. 34, rather than coding bypass data at the end of each coefficient group, all the bypass data for a TU can be coded together after the CABAC bin data for the TU. The loss is therefore 0.5 bits per coded TU, rather than 0.5 bits per coefficient group. Accordingly, at a step 1830 in FIG. 34, a test is applied to detect whether the current group is at the end of encoding a TU. If not, then bit alignment is not applied (indicated schematically as a step 1840) and control returns to the step 1830. But if so, then bit alignment is applied at a step 1850. This provides an example of an arrangement in which the input data values represent image data; and in which the image data are encoded as transform units comprising a plurality of arrays of coefficients, the method comprising applying the setting step at the end of encoding a transform unit.

This alignment mechanism may also be used prior to other or all data in the stream that are coded with a equiprobable mechanism, which although it may decrease the efficiency, may simplify the coding of the stream.

As an alternative alignment, referring to FIG. 35, m_Range can be set to one of a number N of predetermined values rather than simply 256 (384, for example, would align to a half-bit). Since the aligning value must be less than or equal to the original value of m_Range (as range cannot be increased other than through renormalisation), the loss-per-alignment is then (0.5/N) for regularly spaced values. This method would still require division for values other than 256, but the denominator would be known in advance and so the division could be evaluated using a look-up table. Accordingly, at a step 1860 (which applies in a bit alignment situation) the value of m_range is detected, and at a step 1870 an aligned value is selected according to m_range for use in the bit alignment process.

As a further refinement to this alternative alignment method, the bin (or bins) immediately following the alignment can be coded using (unequal) symbol ranges that are powers of two. In this way, all requirements for division for subsequent bins can be removed without any further loss over (0.5/N) in bit efficiency.

For example, when aligning to 384, the symbol ranges for [0,1] for the subsequent bin can be [256,128]:

If a 0 is coded, m_Range is set to 256, making the cost to encode the bin 0.5 bits.

If a 1 is coded, m_Range is set to 128 (and 256 is added to m_Value) and the system is renormalised (again, m_Range becomes 256), making the cost to encode the bin 1.5 bits.

Since 0 and 1 are expected with equal probability, the average cost to encode the bin immediately following alignment is still 1 bit. For the case where N=2, and the two alignment points are 256 and 384, the method would be to pick the largest alignment point that is less than or equal to the current m_Range. If that alignment point is 256, then m_Range is just set to 256 to align the CABAC engine; if the alignment point is 384, then the above process is required, which would require the coding of one symbol.

Figure 32A:
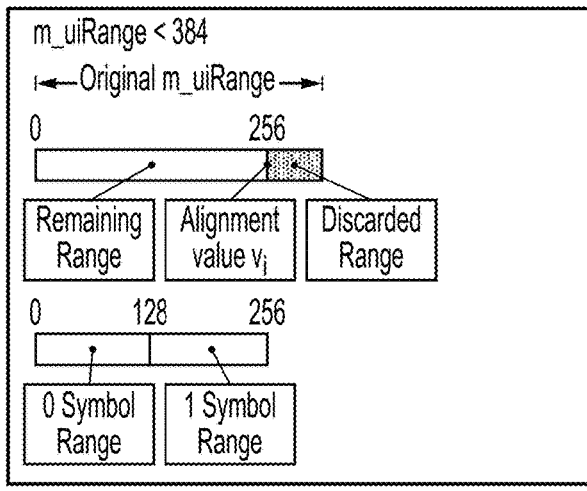
FIGS. 32A-F are schematic diagrams illustrating different CABAC alignment schemes.
Figure 32B:
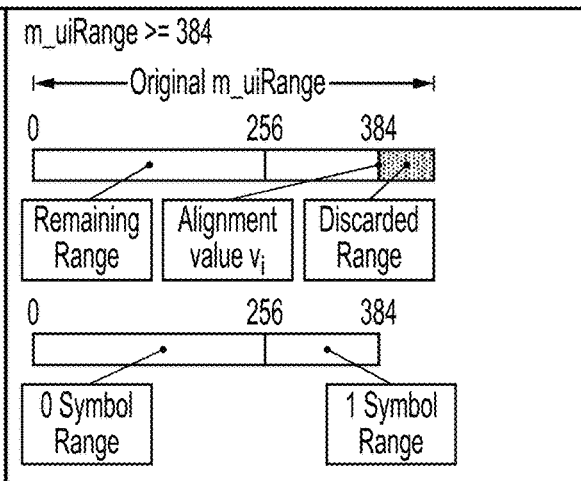
Figure 32C:
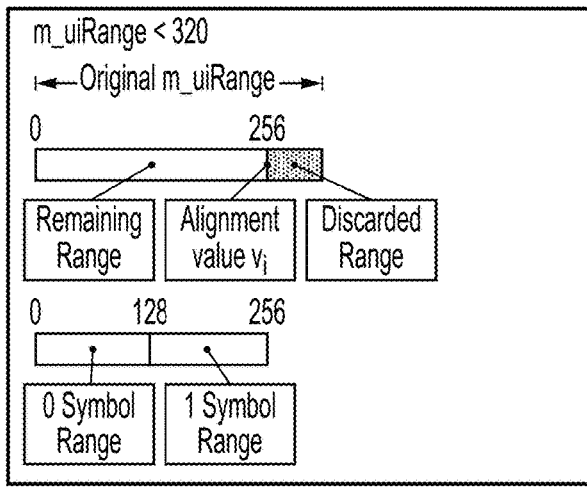
Figure 32D:
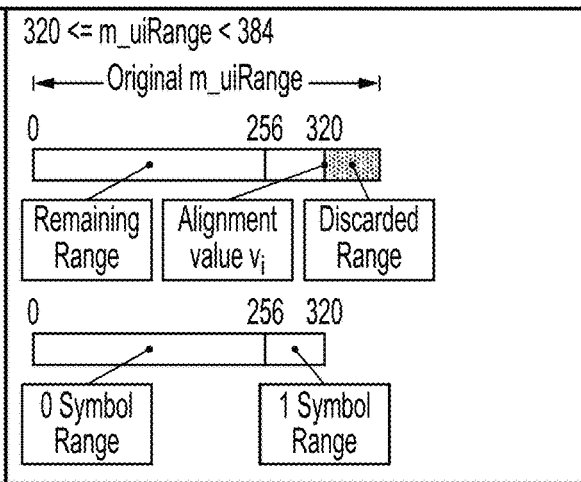
Figure 32E:
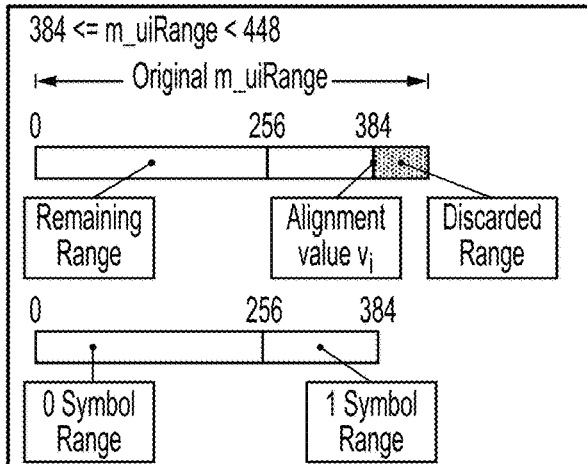
Figure 32F:
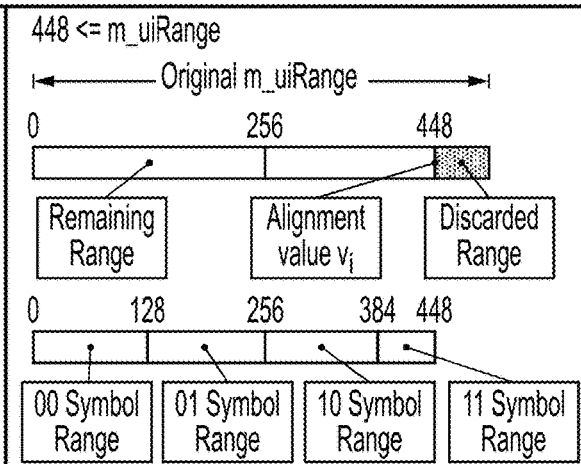

This is shown in FIGS. 32A and B, and a further example with N=4 is shown in FIGS. 32C to 32F.

To illustrate the advantages of aligning the CABAC engine, the method to decode an equiprobable (EP) bin without this alignment stage might be expressed as follows:
if (m_Value>=m_Range/2)
    the decoded EP value is a 1. Decrement m_Value by
        m_Range/2
else
    the decoded EP value is a 0.
then, read next bit from the bit-stream:
m_Value=(m_Value*2)+next_bit_in_stream
A worked example of this is then:
let m_Range=458 and m_Value=303 and assume the next
    two bits in the bitstream are 1
cycle 1:
    m_Value>=229, so the next coded EP value is 1.
        m_Value=74
    then, read next bit from the bit-stream:
        m_Value=74*2+1=149 cycle 2:
    m_Value<229, so the EP value is 0 (m_Value
        unchanged)
    then, read next bit from the bit-stream:
        m_Value=149*2+1=299

The decoded equiprobable bins are equivalent to one stage of long division, and arithmetic would be required to test the inequality. To decode two bins, then this example process would be used twice, implementing a two-stage long division process.

However, if the alignment stage is applied, resulting in m_Range being the largest valid power of 2 (such as 256 for the 9-bit HEVC CABAC entropy coder), then the above process is simplified
    the coded EP value is the most significant bit of m_Value.
    Update m_Value, by treating it as a shift register, shifting
        in the next bit in the stream into the least significant
        position.
Hence, m_Value essentially becomes a shift register, and the EP bins are read from the most significant position, whilst the bit-stream is shifted into the least significant position. Therefore multiple EP bits can be read by simply shifting more bits off the top of m_Value.

A worked example of this aligned case is:
Let m_Range=256, m_Value=189 and the next two bits in the bitstream are 1
cycle 1:
   Next coded EP value is bit 7 of m_Value, which is a 1.
   Update m_Value by shifting out bit 7, and shifting in 1 from the bit stream into the least significant position: m_Value becomes 123.
cycle 2:
   Next coded EP value is bit 7 of m_Value, which is a 0.
   Update m_Value by shifting out bit 7, and shifting in 1 from the bit stream into the least significant position: m_Value becomes 247.

The number of alignment points, N, that are selected can be seen as a trade-off between complexity of implementation and the bit-cost of alignment. For an operating point where there are many EP bins per alignment point, then the wastage is less significant, and an alignment system with fewer points may suffice. Conversely, for an operating point where there are fewer EP bins per alignment point, then the wastage is more significant, and an alignment system with more points may be preferable; for some operating points disabling the alignment algorithm entirely may be preferable. The encoder, and therefore bit-stream, could indicate the number of alignment points that are to be used by the decoder, which may be chosen according to the operating point for that section of the data stream. This number indicated may alternatively be inferred from other information present in the bit-stream, such as a profile or level.

Using multiple alignment positions, in a simple case, where the alignment positions are just 256 and 384:

```
To align,
    if m_Range < 384, just set m_Range=256, and see
        above worked example for decoding.
    else
        set m_Range=384, and the following process is
        used for coding the next EP bin:
m_Range=384=256+128.
Assign the symbol range of 256 to the value of 0
and 128 to the value of 1 for the next EP bin to
be coded.
If m_Value >= 256, then        (a MSB bit test operation)
    the next EP value is a 1.
    m_Value-=256        (actually is a bit-clear operation)
    m_Range=128.
    Renormalise (because m_Range<256):
        m_Range=256
        m_Value=(m_Value*2) + next_bit_in_stream
else
    the next EP value is a 0.
    m_Range=256.
Then, m_Range=256, and the above simple process
can be used for all subsequent EP bins.
```

The results for Entropy Coding Embodiment 1 with the CABAC bit-alignment mechanisms just discussed are shown in FIG. 29, which is a graph of bit rate difference against QP for six sequences with and without the bit alignment mechanisms for N=1. A positive bit rate difference (on the vertical axis) indicates that the system with bit alignment generates a higher bit rate than the scheme without the bit alignment mechanism. The bit rate difference for each sequence is approximately 0.5 times the number of thousand coefficient groups per second (Traffic is 2560× 1600 30p=11520, all others are 1920×1080 50p=9720).

The alignment techniques discussed above are examples of: after encoding a group of input data values, setting the range variable to a value selected from a predetermined subset of available range variable values, each value in the subset having at least one least significant bit equal to zero. The subset may include the minimum size (example, 256). The subset may comprise two or more values between the predetermined minimum size (such as 256) and the second predetermined value (such as 510). A value may be selected from the according to a current value of the range variable. Embodiments involve selecting a particular value from the subset if the current value of the range variable is between that particular value and one less than a next-higher value in the subset (as shown, for example, in FIGS. 32A-32F). In a particular example, the subset of available values comprises a set consisting of 256, 320, 384 and 448; the step of setting the range variable comprises selecting a value from the subset according to a current value of the range variable, so that the range variable is set to 256 if the current value of the range variable is between 256 and 319, the range variable is set to 320 if the current value of the range variable is between 320 and 383,the range variable is set to 384 if the current value of the range variable is between 384 and 447, and the range variable is set to 448 if the current value of the range variable is between 448 and 510. In another example, the step of setting the range variable comprises selecting a value from the subset according to a current value of the range variable, so that the range variable is set to 256 if the current value of the range variable is between 256 and 383, and the range variable is set to 384 if the current value of the range variable is between 384 and 510.

The options set out in FIG. 30 are proposed as profiles.

If the High profile(s) are only required to support bit-Depths of up to 14, then the transform matrix coefficient precision, MAX_TR_DYNAMIC_RANGE and ENTROPY_CODING_DYNAMIC_RANGE are proposed to be set to 12, 19 and 20 respectively.

In addition to these profiles, intra-only Main/Extended profiles could be defined, but since an intra-only decoder is significantly less complex than an intra/inter decoder, only a High intra profile has been described here.

In a similar vein, Extended/High profiles for coding still pictures in various chroma formats could be defined.

Lower profiles could need to use the same matrix Precision, MAX_TR_DYNAMIC_RANGE and ENTROPY_CODING_DYNAMIC_RANGE as used by the higher profiles else the bit-streams produced by the two Profiles would not match.

Various options will now be discussed:
Option 1

| | | 16 | 15 | 14 | 13 | 12 | 11 | 10 | |
|---|---|---|---|---|---|---|---|---|---|
| High 4:4:4 | Bit Depth | 16 | 15 | 14 | 13 | 12 | 11 | 10 | ... |
| | Transform Matrix Precision | 14 | 13 | 12 | 11 | 10 | 9 | 8 | ... |
| | MAX_TR_DYNAMIC_RANGE | 21 | 20 | 19 | 18 | 17 | 16 | 15 | ... |
| | ENTROPY_CODING_DYNAMIC_RANGE | 22 | 21 | 20 | 19 | 18 | 17 | 16 | ... |
| Extended 4:4:4 | Bit Depth | — | — | — | — | 12 | 11 | 10 | ... |
| | Transform Matrix Precision | — | — | — | — | 10 | 9 | 8 | ... |
| | MAX_TR_DYNAMIC_RANGE | — | — | — | — | 17 | 16 | 15 | ... |
| | ENTROPY_CODING_DYNAMIC_RANGE | — | — | — | — | 18 | 17 | 16 | ... |

In this option, the bit depth will dictate the transform matrix precision, MAX_TR_DYNAMIC_RANGE and ENTROPY_CODING_DYNAMIC_RANGE. This means that a decoder that would need to support bit depths up to 16 would need to process 13 bit data with a different set of matrices, and the internal accuracy would be limited to just 18 bits for MAX_TR_DYNAMIC_RANGE, although the decoder would have the ability to support up to 21. However, 12 bit data encoded using the high profile could be decoded by a decoder compliant at a lower profile.

Option 2

| | | | | | | | | | |
|---|---|---|---|---|---|---|---|---|---|
| High 4:4:4 | Bit Depth | 16 | 15 | 14 | 13 | 12 | 11 | 10 | ... |
| | Transform Matrix Precision | 14 | 14 | 14 | 14 | 10 | 10 | 10 | ... |
| | MAX_TR_DYNAMIC_RANGE | 21 | 21 | 21 | 21 | 17 | 17 | 17 | ... |
| | ENTROPY_CODING_DYNAMIC_RANGE | 22 | 22 | 22 | 22 | 18 | 18 | 18 | ... |
| Extended 4:4:4 | Bit Depth | — | — | — | — | 12 | 11 | 10 | ... |
| | Transform Matrix Precision | — | — | — | — | 10 | 10 | 10 | ... |
| | MAX_TR_DYNAMIC_RANGE | — | — | — | — | 17 | 17 | 17 | ... |
| | ENTROPY_CODING_DYNAMIC_RANGE | — | — | — | — | 18 | 18 | 18 | ... |

In this option, the bit parameters for the overlapping bit depths are determined by the lower profile, thereby making decoding 12-bit data encoded using the high profile decodable using a decoder compliant to the extended profile. In addition, the internal accuracy of 13 bit data would be the same as for the 16 bit data. In addition, few matrix precisions would need to be supported than in Option 1.

In the present context, a single set of transform matrix values could be stored, and all other values derived from this.

Note that if the transform matrices have an initial precision of 14 bits, generally the lower precisions could be derived by divide by two and rounding.

Using this general rule to derive the lower-precision matrices from higher precision matrices would lead to:

EXAMPLE 1

Option 1: High 4:4:4 Define transform matrix precision=14
    Derive transform matrix precision=13 ... from 14
Ext 4:4:4 Define transform matrix precision=14
    Derive transform matrix precision=10 ... from 14
i.e. Store at "High" precision.

EXAMPLE 2

Option 1: High 4:4:4 Define transform matrix precision=10
    Derive transform matrix precision=14 ... from 10
Ext 4:4:4 Define transform matrix precision=10
    Derive transform matrix precision=10 ... from 14
i.e. Store at "Extended" precision.

For better quality "Example 1" is preferred. However Example 2 can lead to reduced storage requirements.

Note—An alternative is of course to store a transform matrix set for each precision. "Example 1" and "Example 2" rules can also be used for "Option 2".

As an aim is to increase quality and also split into profiles, there will be scaling errors if each transform matrix set is derived from a single set at one precision.

In the case of "Example 1" the system is down-scaling the transform matrices from 14 bits, and in the case of "Example 2" the system is up-scaling and down-scaling the transform matrices from 10 bits.

Option 3

| | | | | | | | | | |
|---|---|---|---|---|---|---|---|---|---|
| High 4:4:4 | Bit Depth | 16 | 15 | 14 | 13 | 12 | 11 | 10 | ... |
| | Transform Matrix Precision | 14 | 14 | 14 | 14 | 14 | 14 | 14 | ... |
| | MAX_TR_DYNAMIC_RANGE | 21 | 21 | 21 | 21 | 21 | 21 | 21 | ... |
| | ENTROPY_CODING_DYNAMIC_RANGE | 22 | 22 | 22 | 22 | 22 | 22 | 22 | ... |
| Extended 4:4:4 | Bit Depth | — | — | — | — | 12 | 11 | 10 | ... |
| | Transform Matrix Precision | — | — | — | — | 10 | 10 | 10 | ... |
| | MAX_TR_DYNAMIC_RANGE | — | — | — | — | 17 | 17 | 17 | ... |
| | ENTROPY_CODING_DYNAMIC_RANGE | — | — | — | — | 18 | 18 | 18 | ... | i.e. Bit Depths of 12 bit Video can be encoded either as "High 4:4:4" or "Ext 4:4:4", although only a high 4:4:4 decoder would be able to decode streams encoded using the high 4:4:4 scheme.

Option 4

| High 4:4:4 | Bit Depth | 16 | 15 | 14 | 13 | 12 | 11 | 10 | ... |
|---|---|---|---|---|---|---|---|---|---|
| | Transform Matrix Precision | 14 | 14 | 14 | 14 | — | — | — | ... |
| | MAX_TR_DYNAMIC_RANGE | 21 | 21 | 21 | 21 | — | — | — | ... |
| | ENTROPY_CODING_DYNAMIC_RANGE | 22 | 22 | 22 | 22 | — | — | — | ... |
| Extended 4:4:4 | Bit Depth | — | — | — | — | 12 | 11 | 10 | ... |
| | Transform Matrix Precision | — | — | — | — | 10 | 10 | 10 | ... |
| | MAX_TR_DYNAMIC_RANGE | — | — | — | — | 17 | 17 | 17 | ... |
| | ENTROPY_CODING_DYNAMIC_RANGE | — | — | — | — | 18 | 18 | 18 | ... | i.e. "High 4:4:4" Profile has to support the lower "Ext 4:4:4 Profile", with this "Option 4" there is only one choice on how to code 12-bit video.

Option 5

| High 4:4:4 | Bit Depth | 16 | 15 | 14 | 13 | 12 | 11 | 10 | ... |
|---|---|---|---|---|---|---|---|---|---|
| | Transform Matrix Precision | 14 | 14 | 14 | 14 | 14 | 14 | 14 | ... |
| | MAX_TR_DYNAMIC_RANGE | 21 | 20 | 19 | 18 | 17 | 16 | 15 | ... |
| | ENTROPY_CODING_DYNAMIC_RANGE | 22 | 21 | 20 | 19 | 18 | 17 | 16 | ... |
| Extended 4:4:4 | Bit Depth | — | — | — | — | 12 | 11 | 10 | ... |
| | Transform Matrix Precision | — | — | — | — | 10 | 10 | 10 | ... |
| | MAX_TR_DYNAMIC_RANGE | — | — | — | — | 17 | 16 | 15 | ... |
| | ENTROPY_CODING_DYNAMIC_RANGE | — | — | — | — | 18 | 17 | 16 | ... |

In this option, the matrix precisions are limited to just 1 value per profile, reducing the overhead for an encoder. In addition, MAX_TR_DYNAMIC_RANGE and ENTROPY_CODING_DYNAMIC_RANGE are dictated by the bit depth, and therefore an encoder that only requires coding 13 bit data would not need to include the implementation overhead of using additional internal calculation accuracy.

Option 6

| High 4:4:4 | Bit Depth | 16 | 15 | 14 | 13 | — | — | — | ... |
|---|---|---|---|---|---|---|---|---|---|
| | Transform Matrix Precision | 14 | 14 | 14 | 14 | — | — | — | ... |
| | MAX_TR_DYNAMIC_RANGE | 21 | 20 | 19 | 18 | — | — | — | ... |
| | ENTROPY_CODING_DYNAMIC_RANGE | 22 | 21 | 20 | 19 | — | — | — | ... |
| Extended 4:4:4 | Bit Depth | — | — | — | — | 12 | 11 | 10 | ... |
| | Transform Matrix Precision | — | — | — | — | 10 | 10 | 10 | ... |
| | MAX_TR_DYNAMIC_RANGE | — | — | — | — | 17 | 16 | 15 | ... |
| | ENTROPY_CODING_DYNAMIC_RANGE | — | — | — | — | 18 | 17 | 16 | ... |

Option 6 is similar to Option 5, but where only the extended profiles are defined for coding 12 bit data.

In summary, the proposed changes according to various embodiments of the present disclosure are:

Use at least one additional transform matrix set for higher accuracy.

It is preferable to have a single set for all higher accuracies, to simplify multi-profile encoders/decoders.

Proposed transform matrices are provided for transform matrix precisions 7 to 14—see the description below.

It is suggested to use the 14-bit accuracy transform matrices as these will fit within 16-bit data types for software, and will provide sufficient accuracy to allow future extension to 16-bit video.

The choice of transform matrix precision could be configured by the bit depth of the input data and the profile, or alternately determined by parameters specified at the sequence, picture or slice level.

MAX_TR_DYNAMIC_RANGE and ENTROPY_CODING_DYNAMIC_RANGE can be changed (that is to say, one or both of them) for higher accuracy.

Multiple values of MAX_TR_DYNAMIC_RANGE and ENTROPY_CODING_DYNAMIC_RANGE should not present a problem for multi-profile encoders/decoders.

It is suggested to derive MAX_TR_DYNAMIC_RANGE=bitDepth+5 and ENTROPY_CODING_DYNAMIC_RANGE=bitDepth+6.

The use of MAX_TR_DYNAMIC_RANGE=bitDepth+5 can be appropriate for many situations and types of video material. However, a possible need for a variation of this will now be discussed.

Empirical tests have shown that in some instances, for a subset of video sequences, particularly some video sequences having a low noise content, the use of MAX_TR_DYNAMIC_RANGE=bitDepth+5 gives rise to a response curve (giving the relationship between output bitrate and quantisation parameter) is not monotonic.

Normally such a response curve is monotonic as between output bitrate and quantisation parameter, so that a harsher quantisation gives a lower output bitrate, and a less harsh quantisation gives a higher output bitrate. This monotonic relationship forms the basis of rate control algorithms, so that the rate control system adjusts the quantisation parameter to keep the output bitrate within a desired range or under a desired threshold.

But in some instances of the use of MAX_TR_DYNAMIC_RANGE=bitDepth+5, the monotonic relationship has been found to break down, so that, for example, a change to a less harsh quantisation can in fact give rise to a lower output bitrate, or even that there can be two possible values of picture SNR for a particular output bitrate. These aberrations can cause the rate control algorithm to struggle or even fail to arrive at a desired bitrate.

In empirical tests it has been found that such problems can be overcome by using MAX_TR_DYNAMIC_RANGE=bitDepth+6. Accordingly, in some embodiments, this relationship between MAX_TR_DYNAMIC_RANGE and bitDepth is used.

In a particular example of a 32×32 DCT matrix, the DCT process will tend to require $\log_2(32)$ bits of accuracy over bitDepth, which is how the value of bitDepth+5 is derived.

However, the quantising process may add the equivalent of another bit of accuracy. Significantly better results can be obtained, at least for some video material, if this additional bit is provided as extra accuracy in the DCT process.

However, it has also been found in empirical tests that this problem, and accordingly the solution of using MAX_TR_DYNAMIC_RANGE=bitDepth+6, are relevant only to larger DCT matrix sizes. An advantage of allowing different relationships between MAX_TR_DYNAMIC_RANGE and bitDepth can be that this avoids unnecessary processing overhead in instances where the additional accuracy is not required.

In particular, in the present examples, the problem outlined above, and the proposed solution, are particularly relevant to 32×32 DCT matrix sizes. For smaller matrices, the relationship MAX_TR_DYNAMIC_RANGE=bitDepth+5 can be used.

More generally, an adaptive variation of the relationship between MAX_TR_DYNAMIC_RANGE and bitDepth can be used, so that the offset (the value which is added to bitDepth to generate MAX_TR_DYNAMIC_RANGE) is varied according to the matrix size. So, MAX_TR_DYNAMIC_RANGE=bitDepth+offset, where offset is a function of matrix size. In an example, the offset values could be selected as follows:

| Matrix size | Offset |
| --- | --- |
| 32 × 32 | +6 |
| all others below 32 × 32 | +5 |

In another example, a progressive relationship could be used so as to recognise the need for more accuracy with higher matrix sizes, while a lower accuracy can be used with a smaller matrix size:

| Matrix size | Offset |
| --- | --- |
| 32 × 32 | +6 |
| 16 × 16 | +5 |
| 8 × 8 | +4 |

The relationship between offset and matrix size should be the same, as between the reverse (decoding) path of the encoder, and the decoding path of a decoder. There is therefore a need to establish or communicate the relationship, as between these three areas of the technology.

In an example, the relationship can be established as a predetermined, hard-coded relationship at the encoder and decoder.

In another example, the relationship can be explicitly communicated as part of (or in association with the encoded video data.

In another example, the relationship can be inferred at both the encoder and decoder from the identity of a "profile" associated with the encoded vide data. Here, as discussed elsewhere in this description, a profile is an identification of a set of parameters used for encoding or decoding the video data. The mapping between a profile identification and the actual parameters set by that profile identification is pre-stored at both encoder and decoder. The profile identification can be carried as part of the encoded data, for example.

In general, however, the value offset (referred to in some examples as a second offset) is dependent upon the matrix size of the transform matrices.

As with the transform matrix precision, the choice of MAX_TR_DYNAMIC_RANGE and/or ENTROPY_CODING_DYNAMIC_RANGE could be configured by the bit depth of the input data and the profile, or alternately determined by parameters specified at the sequence, picture or slice level (possibly the same parameters as those that select the DCT matrices).

These arrangements provide examples of frequency-transforming input image data to generate an array of frequency-transformed input image coefficients by a matrix-multiplication process, according to a maximum dynamic range of the transformed data and using transform matrices having a data precision; and selecting the maximum dynamic range and/or the data precision of the transform matrices according to the bit depth of the input image data.

In embodiments, the data precision of the transform matrices can be set to a first offset number of bits (such as 2) less than the bit depth of the input image data; and the maximum dynamic range of the transformed data can be set to a second offset number of bits (such as 5) greater than the bit depth of the input image data.

The entropy coding can be changed to include some fixed-bit processing (see Entropy Coding Embodiments 1 and 2) to increase compression at low QPs.

The presence of fixed bits could be configured at the sequence level.

The number of fixed bits $B_F$ could be configured at the sequence, picture (although this is difficult since the picture parameter set does not know of sequence level settings), slice or CU level (possibly by signalling a delta from the number of fixed bits for the previous sequence/picture/slice/CU, parent entity or profile definition).

The entropy coding can be changed to include CABAC bit-alignment to allow bypass bits to be extracted from the stream without the use of long division (it may also be preferable to apply one or more of the aforementioned bit-loss mitigation methods).

Embodiments of the present disclosure therefore provide that internal accuracies be increased to accommodate the requirement in the Range Extensions mandate to allow for higher bit depths through HEVC. The various sources of error have been studied and recommendations have been made. In addition, changes to improve coding efficiency have been presented, and changes to improve throughput have also been presented.

Increased-Precision Transform Matrices

This part of the description details the transform matrices at various levels of precision.

4×4 DST

The transform matrix is of the form:

$$\begin{vmatrix} a & b & c & d \\ c & c & e & -c \\ d & -a & -c & b \\ b & -d & c & -a \end{vmatrix}$$

where the values in the grid are defined by the matrix coefficient precision according to the following table (6-bit HEVC version 1 matrix values included for comparison):

|   | 6-bit | 7-bit | 8-bit | 9-bit | 10-bit | 11-bit | 12-bit | 13-bit | 14-bit |
|---|---|---|---|---|---|---|---|---|---|
| a | 29 | 58 | 117 | 233 | 467 | 934 | 1868 | 3736 | 7472 |
| b | 54 | 110 | 219 | 439 | 878 | 1755 | 3510 | 7021 | 14042 |
| c | 73 | 148 | 296 | 591 | 1182 | 2365 | 4730 | 9459 | 18919 |
| d | 83 | 168 | 336 | 672 | 1345 | 2689 | 5378 | 10757 | 21513 |
| e | 0 | 0 | 0 | 0 | 0 | 0 | 0 | 0 | 0 |

Combined DCT Matrix

For ease of implementation, a single 32×32 DCT matrix $M_{32}$ can be described, from which each smaller N×N DCT matrix $M_N$ is derived through subsampling (as an example of deriving transform matrices at a required data precision from respective source transform matrices at a different data precision) according to the following:

$M_N[x][y]=M_{32}[x][(2^{(5-log2(N))})y]$ for $x,y=0 \ldots (N-1)$.

The combined matrix $M_{32}$ is of the form:

| a | a | -p | h | -q | d | -r | i | -s | b | -t | j | -u | e | -v | k | -w | a | -x | l | -y | f | -z | m | -A | c | -B | n | -C | g | -D | o | -E |
|---|---|---|---|---|---|---|---|---|---|---|---|---|---|---|---|---|---|---|---|---|---|---|---|---|---|---|---|---|---|---|---| with the values in the grid defined by the matrix coefficient precision according to the following table (6-bit HEVC version 1 matrix values included for comparison):

|   | 6-bit | 7-bit | 8-bit | 9-bit | 10-bit | 11-bit | 12-bit | 13-bit | 14-bit |
|---|-------|-------|-------|-------|--------|--------|--------|--------|--------|
| a | 64 | 128 | 256 | 512 | 1024 | 2048 | 4096 | 8192 | 16384 |
| b | 83 | 167 | 334 | 669 | 1338 | 2676 | 5352 | 10703 | 21407 |
| c | 36 | 69 | 139 | 277 | 554 | 1108 | 2217 | 4433 | 8867 |
| d | 89 | 178 | 355 | 710 | 1420 | 2841 | 5681 | 11363 | 22725 |
| e | 75 | 151 | 301 | 602 | 1204 | 2408 | 4816 | 9633 | 19266 |
| f | 50 | 101 | 201 | 402 | 805 | 1609 | 3218 | 6436 | 12873 |
| g | 18 | 35 | 71 | 141 | 283 | 565 | 1130 | 2260 | 4520 |
| h | 90 | 180 | 360 | 721 | 1441 | 2882 | 5765 | 11529 | 23059 |
| i | 87 | 173 | 346 | 693 | 1386 | 2772 | 5543 | 11086 | 22173 |
| j | 80 | 160 | 319 | 639 | 1277 | 2554 | 5109 | 10217 | 20435 |
| k | 70 | 140 | 280 | 560 | 1119 | 2239 | 4478 | 8956 | 17911 |
| l | 57 | 115 | 230 | 459 | 919 | 1837 | 3675 | 7350 | 14699 |
| m | 43 | 85 | 171 | 341 | 683 | 1365 | 2731 | 5461 | 10922 |
| n | 25 | 53 | 105 | 210 | 420 | 841 | 1682 | 3363 | 6726 |
| o | 9 | 18 | 35 | 71 | 142 | 284 | 568 | 1136 | 2271 |
| p | 90 | 181 | 362 | 723 | 1446 | 2893 | 5786 | 11571 | 23143 |
| q | 90 | 179 | 358 | 716 | 1432 | 2865 | 5730 | 11460 | 22920 |
| r | 88 | 176 | 351 | 702 | 1405 | 2810 | 5619 | 11238 | 22476 |
| s | 85 | 170 | 341 | 682 | 1364 | 2727 | 5454 | 10908 | 21816 |
| t | 82 | 164 | 327 | 655 | 1309 | 2618 | 5236 | 10473 | 20946 |
| u | 78 | 155 | 311 | 621 | 1242 | 2484 | 4968 | 9937 | 19874 |
| v | 73 | 145 | 291 | 582 | 1163 | 2326 | 4653 | 9305 | 18611 |
| w | 67 | 134 | 268 | 537 | 1073 | 2146 | 4292 | 8584 | 17168 |
| x | 61 | 122 | 243 | 486 | 973 | 1945 | 3890 | 7780 | 15560 |
| y | 54 | 108 | 216 | 431 | 863 | 1725 | 3451 | 6901 | 13803 |
| z | 46 | 93 | 186 | 372 | 745 | 1489 | 2978 | 5956 | 11912 |
| A | 38 | 77 | 155 | 310 | 619 | 1238 | 2477 | 4953 | 9907 |

-continued

|   | 6-bit | 7-bit | 8-bit | 9-bit | 10-bit | 11-bit | 12-bit | 13-bit | 14-bit |
|---|-------|-------|-------|-------|--------|--------|--------|--------|--------|
| B | 31 | 61 | 122 | 244 | 488 | 976 | 1951 | 3903 | 7806 |
| C | 22 | 44 | 88 | 176 | 352 | 704 | 1407 | 2815 | 5630 |
| D | 13 | 27 | 53 | 106 | 212 | 425 | 850 | 1700 | 3400 |
| E | 4 | 9 | 18 | 36 | 71 | 142 | 284 | 568 | 1137 |

For information, the smaller DCT matrices derived from the 32×32 matrix are presented here. The values in each grid are defined by the matrix coefficient precision according to the above table.

4×4 DCT

The matrix $M_4$ is defined as the first 4 coefficients of every $8^{th}$ row of the combined matrix $M_{32}$.

$$\begin{vmatrix} a & a & a & a \\ b & c & -c & -b \\ a & -a & -a & a \\ c & -b & b & -c \end{vmatrix}$$

8×8 DCT

The matrix $M_8$ is defined as the first 8 coefficients of every $4^{th}$ row of the combined matrix $M_{32}$.

$$\begin{vmatrix} a & a & a & a & a & a & a & a \\ d & e & f & g & -g & -f & -e & -d \\ b & c & -c & -b & -b & -c & c & b \\ e & -g & -d & -f & f & d & g & -e \\ a & -a & -a & a & a & -a & -a & a \\ f & -d & g & e & -e & -g & d & -f \\ c & -b & b & -c & -c & b & -b & c \\ g & -f & e & -d & d & -e & f & -g \end{vmatrix}$$

16×16 DCT

The matrix $M_{16}$ is defined as the first 16 coefficients of every even row of the combined matrix $M_{32}$.

$$\begin{vmatrix} a & a & a & a & a & a & a & a & a & a & a & a & a & a & a & a \\ h & i & j & k & l & m & n & o & -o & -n & -m & -l & -k & -j & -i & -h \\ d & e & f & g & -g & -f & -e & -d & -d & -e & -f & -g & g & f & e & d \\ i & l & o & -m & -j & -h & -k & -n & n & k & h & j & m & -o & -l & -i \\ b & c & -c & -b & -b & -c & c & b & b & c & -c & -b & -b & -c & c & b \\ j & o & -k & -i & -n & l & h & m & -m & -h & -l & n & i & k & -o & -j \\ e & -g & -d & -f & f & d & g & -e & -e & g & d & f & -f & -d & -g & e \\ k & -m & -i & o & h & n & -j & -l & l & j & -n & -h & -o & i & m & -k \\ a & -a & -a & a & a & -a & -a & a & a & -a & -a & a & a & -a & -a & a \\ l & -j & -n & h & -o & -i & m & k & -k & -m & i & o & -h & n & j & -l \\ f & -d & g & e & -e & -g & d & -f & -f & d & -g & -e & e & g & -d & f \\ m & -h & l & n & -i & k & o & -j & j & -o & -k & i & -n & -l & h & -m \\ c & -b & b & -c & -c & b & -b & c & c & -b & b & -c & -c & b & -b & c \\ n & -k & h & -j & m & o & -l & i & -i & l & -o & -m & j & -h & k & -n \\ g & -f & e & -d & d & -e & f & -g & -g & f & -e & d & -d & e & -f & g \\ o & -n & m & -l & k & -j & i & -h & h & -i & j & -k & l & -m & n & -o \end{vmatrix}$$

Further techniques relating to embodiments of fixed bit encoding or related techniques will be discussed with reference to FIGS. 36 and 37.

First, however, techniques used to encode escape codes will be discussed.

So-called Golomb-Rice coding encodes a value, v, as a unary encoded prefix (a variable number of 1s followed by a 0, or vice versa) followed by k bits of suffix.

Let prefix_length be the total number of 1s in the unary encoded prefix. Let K be the value of the least significant k bits.

$$v=(\text{prefix\_length}<<k)+K$$

(where <<n signifies a left shift by n bits; a similar notation >>n represents a right shift by n bits)

The total number of bits equals prefix_length+1+k.

Next, so-called exponential Golomb order-k codes will be discussed. In such codes, a number to be encoded is split into a variable length unary-encoded prefix and a variable length suffix. The number of suffix bits=prefix_length+k. Here, prefix_length is once again the number of 1s in the unary code.

The total number of bits in the code=prefix_length+1+prefix_length+k.

Let K be the value of the last k bits.

When prefix_length is 0, v will be equal to K.

When prefix_length is 1, v will be between $(1<<k)+K$ and $(3<<k)+K$ and (exclusive)

When prefix_length is 2, v will be between $(3<<k)+K$ and $(7<<k)+K$ and (exclusive)

When prefix_length is 3, v will be between $(7<<k)+K$ and $(15<<k)+K$ and (exclusive)

Therefore $v=((2^{\text{prefix\_length}})-1)<<k)+\text{suffix}$

In HEVC, both Golomb-Rice and Exponential Golomb codes are used. If prefix_length is less than three, the code is interpreted as a Golomb-Rice code. However, if the prefix_length is greater than or equal to 3, the code is interpreted as an exponential Golomb code of order k.

The prefix (in either system) is an example of a unary code. The suffix is an example of a non-unary code. The two systems are examples of a two-part variable length code.

In this case, the value of prefix_length used to decode the exponential Golomb code is reduced by 3, and the value resulting from the decoding operation is increased by $(3<<k)$, since this is the smallest value that cannot be represented using the Golomb-Rice code.

The value "k" used for the HEVC Escape and Escape-Escape codes varies. For each group of 16 coefficients, the value k start at 0, and is increased whenever the magnitude of a coefficient value is greater than $3<<k$. In response to this situation, k is incremented (that is to say, in response to a magnitude of a current data value), to a maximum of 4. Note that the discussion relates to coefficient magnitudes, as a sign bit representing the sign of a coefficient is sent separately.

Figure 36:
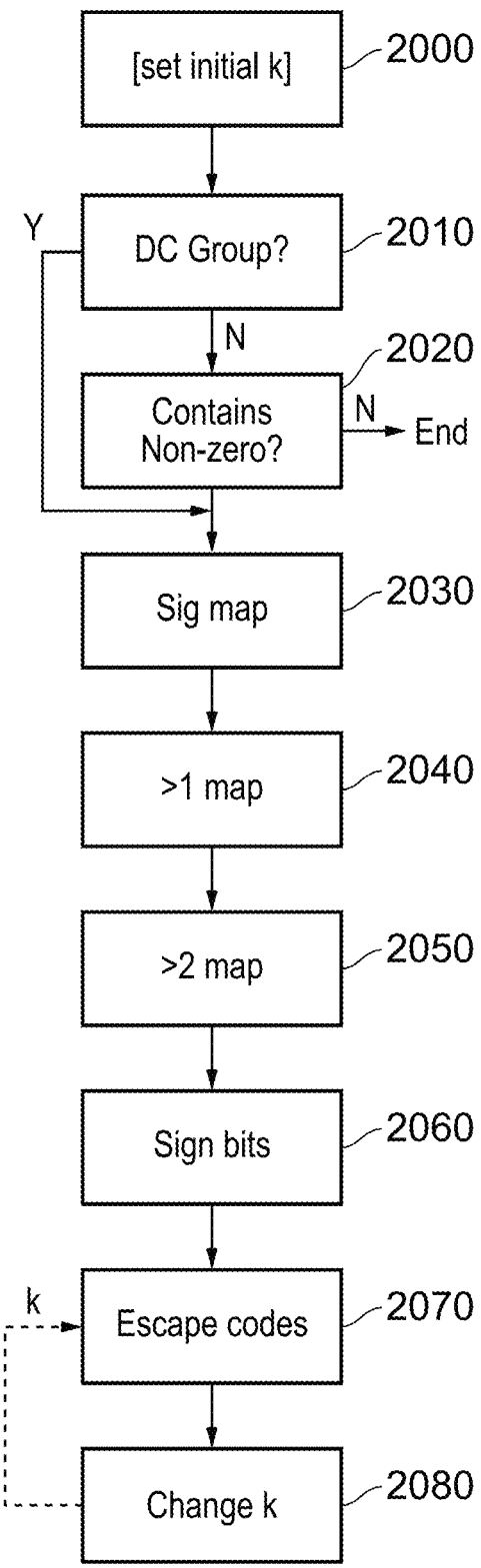
FIG. 36 is a flowchart schematically illustrating a coding technique.

FIG. 36 is a schematic flowchart illustrating a process to generate escape codes as discussed above. Several of the flowchart steps are similar to those discussed previously and will not be described again in detail.

The method is operable with respect to a group of data values comprising (for example) a sequence of frequency transformed image coefficients, or the non-zero constituents of that sequence or the non-zero constituents of that sequence where the magnitude of each data value has been reduced by 1 (in this last case, a significance map may be generated first, so that each coefficient is reduced by 1 before further processing because the significance map accounts for the value of 1).

At a step 2000, an initial value of k is set. In a normal HEVC system, k is initially set to 0. Steps 2010, 2020, 2030, 2040, 2050 and 2060 corresponds to similar steps in the flowcharts of FIGS. 29-31 and will not be discussed further here. Note that in FIGS. 29-31 as well as in FIG. 36, in some example implementations of HEVC, not all of the maps need to be generated for each coefficient. For example, within a group of (say) 16 coefficients, there may be one or more coefficients for which some maps are not generated.

At a step 2070, if an escape code is needed, it is generated based on a current value of k using the techniques just described. In particular, a coefficient which requires the use of an escape code is first handled using the significance map and optionally one or more of the other maps. Note that in the case of a coefficient which needs escape coding, any of the significance, >1 and >2 maps that are used will be flagged as "1". This is because any coefficient which requires escape coding is by definition greater than a value which can be encoded using whichever maps are available in respect of that coefficient.

An escape code is needed if the current data value has not been fully encoded. Here, the term "fully" encoded means that the data value, less the values already encoded (by the maps, or the maps plus the fixed bits, for example) is zero. In other words, a data value is fully encoded by components already generated if the residual amount of that data value, taking those components into account, is zero.

So, assuming that for an example coefficient, a significance map and >1 and >2 maps are available, each of these will be flagged as "significant", ">1" and ">2" in respect of that coefficient.

This means (in this example) that the coefficient must be at least 3.

Therefore, the value of 3 can be subtracted from the coefficient before escape coding, with no loss of information. The value of 3 (or more generally, a variable base_level which indicates the numerical range which is defined by the maps which apply to that coefficient) is reinstated at decoding.

Taking a coefficient value of 15 decimal (1111 binary) as an example, the significance map is "1", the >1 map is "1" and the >2 map is "1". The value base_level is 3. Base_level is subtracted from the coefficient value to give a value of 12 decimal (1100 binary) which is passed for escape coding.

The value k (see above) now defines the number of suffix bits. the suffix bits are taken from the least significant bits of the coefficient value after the subtraction of base_level. If (for example) k=2, then the two least significant bits of the remaining value 1100 are treated as suffix bits, which is to say that the suffix bits in this example are 00. The remaining bits (11 in this example) are handled encoded as a prefix.

So in summary, the processing associated with an escape code involves:

generating one or more maps defining one or more least significant bits of a coefficient so that (if an escape code is required) the coefficient must have a value of at least base_level;

subtracting base_level from the coefficient;

encoding the least significant k bits of the remaining part of the coefficient as suffix bits; and encoding the remaining most significant bits of the remaining part of the coefficient as a prefix.

Then, using the test described above, if the value of k needs to be changed, the change is implemented at a step 2080 and the new value of k is provided for the next operation of the step 2070.

A modification to the escape code technique which can provide a similar effect to the user of fixed bits (FIGS. 30 and 31) is to apply an offset to the value k defining the number of suffix bits used in an escape code.

For example, the value k in a HEVC system has a range of 0 to 4, and the transition (in respect of a group of coefficients) from a starting point of 0 up to a maximum value of 4. In embodiments of the present technique, an offset is added to this value of k. For example, the offset may be predetermined as a value param_offset, such as 3, so that the existing technique for varying k in the course of coding a group of coefficients will, instead of varying k from k=0 to k=4, vary it from k=param_offset to k=4+param_offset.

The value param_offset can be predetermined as between encoder and decoder.

Or the value param_offset can be communicated from the encoder and decoder, for example as part of a stream, picture, slice or block (such as TU) header.

Or the value param_offset can be derived at the encoder and the decoder as a predetermined function of the bit depth of the video data, such as (for example):

for bit_depth≤10, param_offset=0
for bit_depth>10, param_offset=bit_depth−10

Or the value param_offset can be derived at the encoder and the decoder as a predetermined function of the degree of quantisation (Qp) applicable to a block or group of coefficients;

Or the value param_offset can be dependent (for example, in a predetermined manner) upon one or more of which video component is being encoded, on block size, on mode (for example, lossless or lossy), on picture type and so on.

Or the value param_offset can be derived at the encoder and the decoder on an adaptive basis, taking a predetermined starting point, or a starting point communicated in a header, or a starting point derived from (for example) bit_depth. An example of such an adaptive process will be discussed below with reference to FIG. 37.

Or more than one of these criteria could apply. In particular, where the value param_offset is dependent upon another parameter (such as block size) and is adaptively varied as in FIG. 37 below, then the adaptive variation could be applied separately to each possible value of param_offset (that is, separately for each block size).

Note that any or all of these dependencies could apply in respect of the number of fixed bits used in the arrangements of FIGS. 30 and 31.

Comparing this modified technique and the fixed bits techniques discussed above with relation to FIGS. 30 and 31, it can be seen that:

(a) in the fixed bits technique of FIGS. 30 and 31, a coefficient is split into more significant and less significant portions before the generation of any of the maps, one or more maps are then generated from the more significant portion, and the less significant portion is directly encoded (or otherwise treated as discussed above); but (b) in the generation of escape codes using param_offset, the one or more maps are generated first, and then the remaining part of the coefficient value (less the value base_level) is handled either as a suffix or a prefix, with the boundary between suffix and prefix depending on k+param_offset, and with the suffix representing the least significant bit(s) of the remaining portion.

In either instance, the parameter(s) associated with the fixed bit encoding, or the value param_offset, can be varied in an adaptive manner. An example of how this can be achieved will now be discussed with reference to FIG. 37. In FIG. 37, similar techniques can apply to either the number of fixed bits (referred to as "NFB" in FIG. 37, and denoting the number of bits of the least significant portion derived at the step 1625 or 1725 of FIGS. 30 and 31 respectively) or the value param_offset (shortened to "offset" in FIG. 37) from the discussion above.

In the following discussion of an example arrangement, it is assumed that the adaptation of the offset or NFB value is carried out on a slice-by-slice basis. Note that a slice can be defined within the HEVC family of systems as anything from one LCU up to a whole picture, but a fundamental feature of a slice is that its encoding is independent of the encoding applies to any other slice, so that an individual slice can be decoded without reference to another slice. Of course, however, the adaptation could take place on a block-by-block or a picture-by-picture basis.

Figure 37:
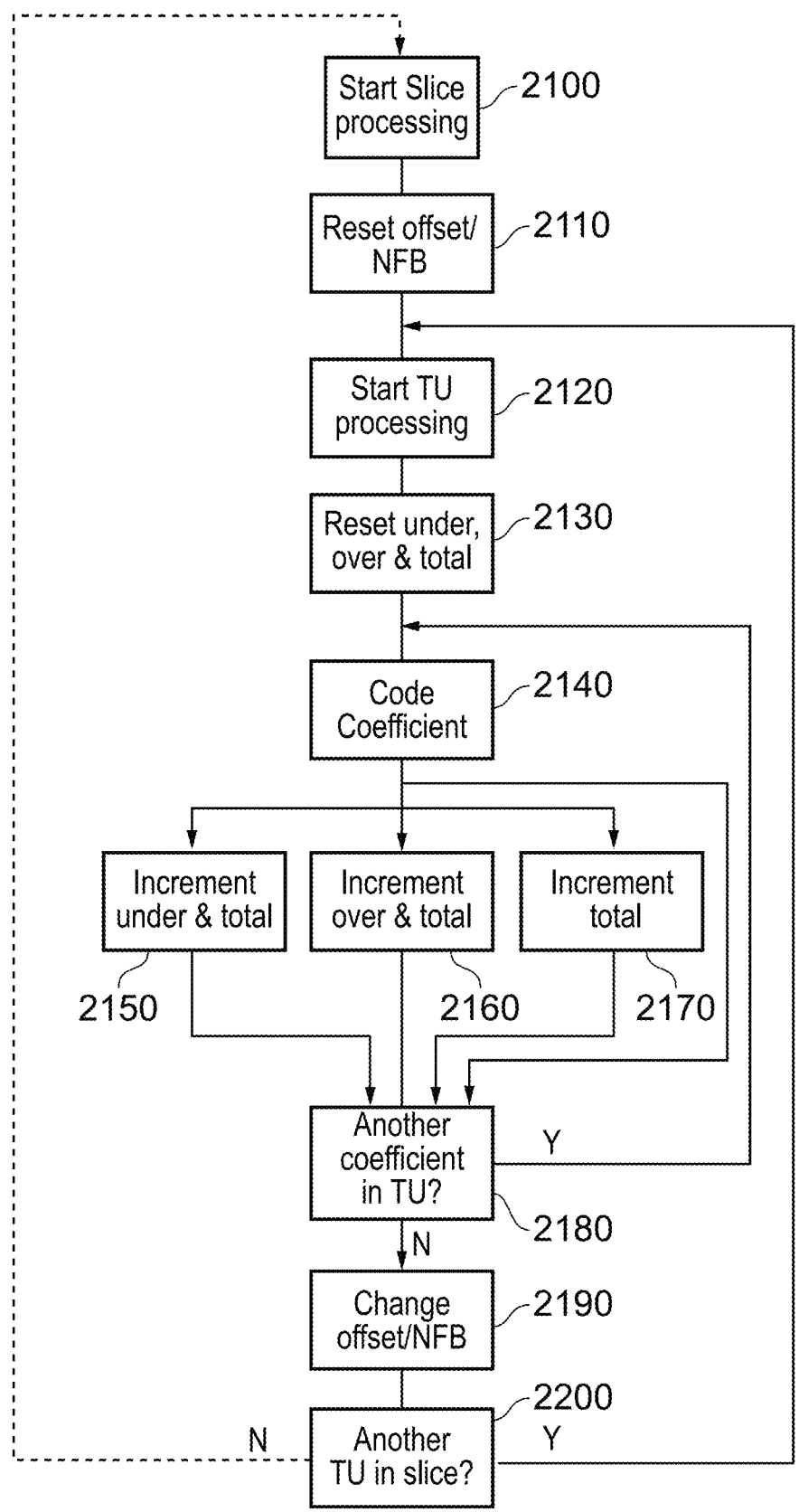
FIG. 37 is a flowchart schematically illustrating an adaptation technique.

Note that the process of FIG. 37 takes place at the encoder and also, in a complimentary decoding form, takes place at the decoder, so that the value of the offset/NFB variable tracks identically as between the encoder and the decoder.

At a step 2100, the processing of a slice is commenced.

At a step 2110, the offset/NFB value is reset. This could involve resetting the value to a fixed value such as 0. In an alternative arrangement, the value could be reset to a starting value derived from the final value of the offset/NFB variable in respect of one or more previous slices. In such a case, in order to maintain the ability to decode each slice independently, embodiments of the present technology provide an indication of the starting value of the offset/NFB variable in the slice header. Note that various different techniques for obtaining such a starting value are available. For example, the starting value of the offset/NFB variable could be set to 0 if the final value of that variable for the previous slice did not exceed 2, and could be set to 1 otherwise. A similar arrangement could be applied to an average final value of the variable obtained from all slices relating to a preceding picture. The skilled person will appreciate that various other possibilities are available. Of course, if a predetermined starting value is used, then either this can be agreed in advance by a standard definition applicable to the encoder and the decoder, or the predetermined starting value can be specified in a stream or picture header.

With regards to header data, a flag may be included within a stream, picture or slice header to indicate whether the adaptation process of FIG. 37 is to take place in respect of that stream, picture or slice.

At a step 2120, processing of the first transform unit (TU) is started. The processing of a slice proceeds on a TU by TU basis as discussed earlier.

At a step 2130 three more variables are reset, this time to 0. These variables are referred to as under, over and total. The purpose of these variables will be discussed below.

Within a TU, each coefficient is encoded in turn. At a step 2140, a next coefficient is encoded. The encoding of the coefficient may follow the flow chart of FIGS. 30/31 or the flowchart of FIG. 36, in each case making use of the offset or NFB value applicable at that stage in the process. Of course, for the first coefficient to be encoded, the offset/NFB value is equal to that set at the step 2110. For later coefficients, the current value of offset/NFB is used.

A test is applied in respect of the outcome of the encoding of the step 2140. Depending on the outcome of the test, control passes to a step 2150, 2160 or 2170 or directly to a step 2180. First, the test will be described. Note that the test is slightly different depending on whether the fixed bits system of FIGS. 30/31 or the param_offset system of FIG. 37 and accompanying discussion is used.

Fixed Bits Test

In the case of the fixed bits system, whenever a set of fixed bits is encoded (whenever the step 1655 or the step 1755 is executed), then the variable "total" is incremented. Accordingly, the variable "total" refers to the number of occasions, since the variable was last reset, at which fixed bits have been encoded.

The test then derives a variable remaining_magnitude, which is defined as the part of the coefficient magnitude that is not being encoded as fixed bits, so that:

$$\text{remaining\_magnitude}=(\text{magnitude}-1)\text{>>NFB}$$

Another value, base_level, is defined (as discussed above) as the highest magnitude that could be described without the use of an escape code. Here, it is noted that a particular coefficient may have one, two or three flags or map entries encoded in respect of that coefficient. So:

if the coefficient had a >2 flag, base_level=3; else
if the coefficient had a >1 flag, base_level=2; else
base_level=1

The value remaining_magnitude is then tested against base_level.

If ((remaining_magnitude>>1)≥base_level) then the variable "under" is incremented. In FIG. 37, this corresponds to the step 2150. The underlying meaning of this step is that a so-called undershoot has been detected such that the number of fixed bits (NFB) was not enough to encode the current coefficient. The significance of the right shift (>>1) in the test is that the undershoot is only flagged as a noteworthy undershoot if the variable NFB is insufficient by two or more bits.

Similarly, if ((NFB>0) AND ((remaining_magnitude<<1) ≤0)), then the variable "over" is incremented. In FIG. 37, this corresponds to the step 2160. The underlying meaning of this step is that an overshoot is detected if, even with one fewer fixed bit (detected by the <<1 shift in the expression given above), the fixed bit component would have been capable of encoding the entire magnitude of the coefficient. In other words, the number of fixed bits is significantly in excess of the number required to encode that coefficient.

It will be understood that the various parameters used in these tests, in particular the number of bit shifts applied, can be varied according to the design skill of the notional skilled person.

If neither the undershoot nor the overshoot test is fulfilled, but fixed bits are encoded, then control passes to the step 2170 at which only the variable total is incremented.

For completeness, it is noted that control passes directly to the step 2180 of FIG. 37 where fixed bit operation is not enabled, so that no changes made to any of the variables: under, over and total.

Param_Offset Test

In the case of a system based on param_offset, the underlying principles are similar but some of the details are little different to those discussed above.

The variable "total" is incremented whenever an escape value is encoded.

The coefficient value is tested against the parameter k which, as discussed above, is defined so as to take into account the effect of the offset param_offset.

If (coefficient>(3<<k)) then the variable "under" is incremented. This corresponds to the step 2150 of FIG. 37 and indicates an undershoot situation as discussed above. In other words, the variable k, taking into account param_offset, was insufficient to encode the escape code as a suffix.

Otherwise, if ((coefficient*3)<(1<<k)) then the variable "over" is incremented. This corresponds to the step 2160 of FIG. 37. This represents an overshoot situation in which the variable k, taking into account param_offset, provided more suffix bits that were required to encode the escape code.

If neither the undershoot nor the overshoot test is fulfilled, but an escape code is encoded, then control passes to the step 2170 at which only the variable total is incremented.

Again, it is noted that control passes directly to the step 2180 of FIG. 37 where an escape code is not encoded, so that no changes made to any of the variables: under, over and total.

Note that in either set of tests, it is checked whether the undershoot or overshoot is significant by checking whether the undershoot or overshoot would have happened if NFB or param_offset had been even higher or even lower respectively. But this extra margin is not required—the tests could simply be "did an under (over) shoot happen?"

At a step 2180, if there is another coefficient available for encoding in that TU, then control returns to the step 2140. Otherwise, control passes to a step 2190 which is performed at the end of each TU, but before the next TU is encoded. At this step 2190, the variable offset/NFB is potentially adaptively changed according to the variables under, over and total. Here, the same adaptation applies to either the offset value or the NFB value, so that:

if ((under*4)>total, the offset/NFB value is incremented (by 1); and
if ((over*2)>total, the offset/NFB value is decremented (by 1)subject to a minimum value of 0.

Note that if both tests are passed in respect of a single TU, then the value of NFB or param_offset will remain the same.

Note that the division by slices and then by TUs is not essential—any group of values (which may even not be video data values) can be treated in this way, and subdivided into subsets in place of the TU division in this description.

This is equivalent to incrementing the offset/NFB if more than 25% of undershoots are experienced, but decrementing the offset/NFB value if there are more than 50% of overshoots. So the proportion used for the test of undershoots is lower than the proportion used for the test of overshoots. A reason for this asymmetry is that undershoots generate more inefficiency than overshoots because of the nature of the escape coding methods used in the case of undershoots. It will be appreciated however that the same thresholds could be used, or different values could be used.

Finally, at a step 2200, if there is another TU in the slice then control returns to the step 2120. If there are no further TUs in the slice then control returns to the step 2100. Note that, as discussed above, optionally the starting point for offset/NFB could be set (for use in the next instance of the step 2120, for the next or a future slice) based on the results obtained during the encoding process which has just completed.

Complementary steps are carried out at the decoding side (or at the decoding path of an encoder). For example, a decoding method can comprise decoding a first portion of each data value from one or more data sets indicative of first portions of predetermined magnitude ranges and encoded to an input data stream using binary encoding; decoding a second portion of at least those data values not fully encoded by the data sets, the number of bits of the second portion depending upon a value n, where n is an integer, data defining the second portion being included in the input data stream and, if a data value has not been fully decoded by the respective first and second portions, decoding a remaining third portion of the data value from the input data stream; detecting, for a subset of two or more of the data values, (i) a number of instances of data values for which a third portion has been encoded and would still have been required had a higher value of n been used, and (ii) a number of instances of data values for which a second portion has been encoded but the value of n was such that the data value could have been fully encoded by first and second portions using a lower value of n; and after decoding the subset of the data values, varying n for use in respect of subsequent data values according to the results of the detecting step.

The steps described above can be carried out by the entropy encoder 370 and the entropy decoder 410 (in the case of an encoding process) or just by the entropy decoder 410 (in the case of a decoding process). The processes may be implemented in hardware, software, programmable hardware or the like. Note that the entropy encoder 370 can therefore act as an encoder, a generator, a detector and a processor to implement the encoding techniques. The entropy decoder 410 can accordingly act as one or more decoders, a detector, and a processor to implement the decoding techniques described here.

Accordingly, the arrangements described above represent examples of a data decoding method for decoding a group (for example, a slice) of data values (for example, image data), the method comprising the steps of:

decoding a first portion of each data value from one or more data sets (for example, maps) indicative of first portions of predetermined magnitude ranges and encoded to an input data stream using binary encoding;

decoding a second portion of at least those data values not fully encoded by the data sets, the number of bits of the second portion depending upon a value n, where n is an integer, data defining the second portion being included in the input data stream and, if a data value has not been fully decoded by the respective first and second portions, decoding a remaining third portion of the data value from the input data stream (here, for example, the second portion may represent the fixed bits or a suffix portion; the value n can represent the number of fixed bits or the suffix length (in Golomb-Rice encoding) or the order of the exponential Golomb encoding as discussed above; the third portion can represent a prefix in the Golomb-Rice or exponential Golomb systems, or an escape code in the fixed bits example);

detecting, for a subset of two or more of the data values, (i) a number (for example, the variable "under") of instances of data values for which a third portion has been encoded and would still have been required had a higher value of n been used, and (ii) a number (for example, the variable "under") of instances of data values for which a second portion has been encoded but the value of n was such that the data value could have been fully encoded by first and second portions using a lower value of n; and after decoding the subset of the data values, varying (for example, incrementing or decrementing) n for use in respect of subsequent data values according to the results of the detecting step.

The variable "total" represents an example of a detected total number of instances, in respect of that subset of data values, for which a second portion was encoded.

The above embodiments also represent an example of a data encoding method for encoding an array of data values as data sets and escape codes for values not encoded by the data sets, an escape code comprising a unary coded portion and a non-unary coded portion, the method comprising the steps of:

setting a coding parameter (param_offset, for example) defining a minimum number of bits of a non-unary coded portion (in Golomb-Rice or exponential Golomb, k defines a minimum suffix length or order), the coding parameter being between 0 and a predetermined upper limit;

adding an offset value (param_offset in the examples) of 1 or more to the coding parameter so as to define a minimum least significant data portion size;

generating one or more data sets (for example, the significance map, >1, >2 sets) indicative of positions, relative to the array of data values, of data values of predetermined magnitude ranges, so as to encode the value of at least one least significant bit of each data value;

generating, from at least the part of each data value not encoded by the one or more data sets, respective complementary most-significant data portions and least-significant data portions, such that the most-significant data portion of a value represents zero or more most significant bits of that portion, and the respective least-significant data portion is dependent upon a number of least significant bits of that part, the number of least significant bits being greater than or equal to the minimum least significant data portion size;

encoding the data sets to an output data stream (for example, as binary encoded data);

encoding the most significant data portions to the output data stream (for example, as a prefix); and encoding the least-significant portions to the output data stream (for example, as a suffix).

Note that the above processes can be carried out (in some embodiments) after the generation of the significance map, so that the data values (on which the process is performed) may be generated from respective input values by: generating a further data set, the further data set being a significance map indicative of positions, relative to the array of input values, of non-zero input values; and subtracting 1 from each input value to generate a respective data value.

Figure 38:
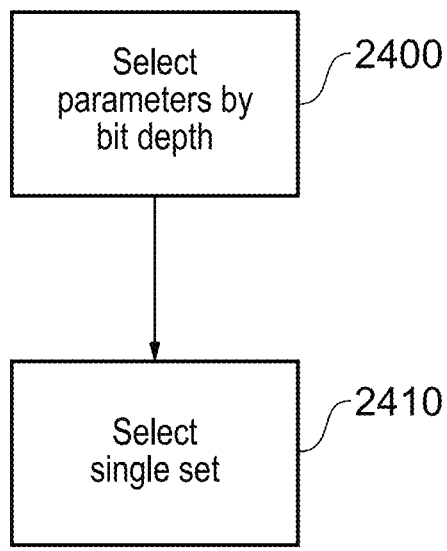
FIGS. 38 and 39 are schematic flowcharts illustrating a process for selecting transform dynamic range and data precision parameters.
Figure 39:
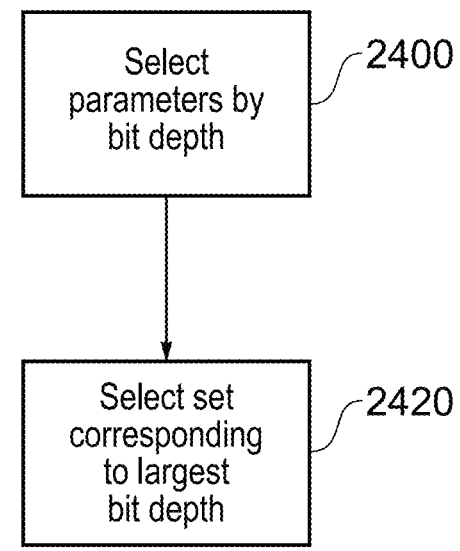

FIGS. 38 and 39 are schematic flowcharts illustrating a process for selecting transform dynamic range and data precision parameters.

Referring to FIG. 38, and as described above, at a step 2410 parameters such as the maximum dynamic range and/or the data precision of the transform matrices are selected according to the bit depth of each image or video component. At a step 2410, for input or output image data having image or video components of different bit depths, a single set of the maximum dynamic range and/or the data precision of the transform matrices is selected for use with all of the image or video components.

Referring to FIG. 39, a step 2420 is similar to the step 2410 but includes the further features that the single set of the maximum dynamic range and/or the data precision of the transform matrices is selected as those values relating to that one of the image or video components having the greatest bit depth.

Embodiments of the disclosure may operate with respect to a sequence of input data values dependent upon an array of frequency-transformed input image coefficients.

Embodiments as discussed above are defined by the following numbered clauses:

1. A data encoding method for encoding a sequence of data values, the method comprising the steps of:

generating, from the input data values, respective complementary most-significant data portions and least-significant data portions, such that the most-significant data portion of a value represents a plurality of most significant bits of that value, and the respective least-significant data portion represents the remaining least significant bits of that value;

generating one or more data sets indicative of positions, relative to the array of the values, of most-significant data portions of predetermined magnitudes;

encoding the data sets to an output data stream using binary encoding; and including data defining the less-significant portions in the output data stream.

2. A method according to clause 1, in which one of the data sets is a significance map indicative of positions, relative to an array of the data values, of most-significant data portions which are non-zero.

3. A method according to clause 2, in which the significance map comprises a data flag indicative of the position, according to a predetermined ordering of the array of values, of the last of the most-significant data portions having a non-zero value.

4. A method according to clause 2 or clause 3, in which the data sets comprise:
   a greater-than-one map indicative of positions, relative to the array of the values, of most-significant data portions which are greater than 1; and
   a greater-than-two map indicative of positions, relative to the array of the values, of most-significant data portions which are greater than 2.
5. A method according to clause 1, in which the data sets comprise:
   a greater-than-one map indicative of positions, relative to an array of the values, of most-significant data portions which are greater than or equal to 1; and
   a greater-than-two map indicative of positions, relative to the array of the values, of most-significant data portions which are greater than or equal to 2.
6. A method according to clause 5, comprising the step of generating a further data set, the further data set being a significance map indicative of positions, relative to the array of the values, of non-zero values.
7. A method according to clause 6, in which the significance map comprises a data flag indicative of the position, according to a predetermined ordering of the array of values, of the last of the values having a non-zero value.
8. A method according to any one of the preceding clauses, in which the step of including data defining the less-significant data portions in the output data stream comprises encoding the least-significant data portions using arithmetic coding in which symbols representing the least-significant data portions are encoded according to respective proportions of a coding value range, in which the respective proportions of the coding value range for each of the symbols that describe the least-significant data portion are of equal size.
9. A method according to any one clauses 1 to 7, in which the step of including data defining the less-significant portions in the output data stream comprises directly including the least-significant data portions in the output data stream as raw data.
10. A method according to any one of the preceding clauses, in which:
   the sequence of data values represent image data having an image data bit depth; and
   the method comprises setting the number of bits to be used as the plurality of most significant bits in each most-significant data portion to be equal to the image data bit depth.
11. A method according to any one of the preceding clauses, in which the sequence of data values comprises a sequence of frequency transformed image coefficients.
12. A method according to clause 11, in which the frequency-transformed input image coefficients are quantised frequency-transformed input image coefficients according to a variable quantisation parameter selected from a range of available quantisation parameters, the method comprising:
   encoding the array of frequency-transformed input image coefficients according to the most-significant data portions and the least-significant data portions for coefficients produced using a quantisation parameter in a first predetermined sub-range of the range of available quantisation parameters; and
   for coefficients produced using a quantisation parameter not in the first predetermined sub-range of the range of available quantisation parameters, encoding the array of frequency-transformed input image coefficients such that the number of bits in each most-significant data portion equals the number of bits of that coefficient and the respective least-significant data portion contains no bits.
13. A method according to clause 11 or clause 12, comprising the steps of:
   frequency-transforming input image data to generate an array of frequency-transformed input image coefficients by a matrix-multiplication process, according to a maximum dynamic range of the transformed data and using transform matrices having a data precision; and
   selecting the maximum dynamic range and/or the data precision of the transform matrices according to the bit depth of the input image data.
14. A method according to clause 13, in which the selecting step comprises:
   setting the data precision of the transform matrices to a first offset number of bits less than the bit depth of the input image data; and
   setting the maximum dynamic range of the transformed data to a second offset number of bits greater than the bit depth of the input image data.
15. A method according to clause 14, in which the first offset number of bits is equal to 2 and the second offset number of bits is equal to 5.
16. A method according to any one of clauses 13 to 15, comprising the step of:
   deriving transform matrices at a required data precision from respective source transform matrices at a different data precision.
17. A method according to any one of the preceding clauses, in which the encoding step comprises:
   selecting one of a plurality of complementary sub-ranges of a set of code values according to the value of a current input data value of a data set for encoding, the set of code values being defined by a range variable;
   assigning the current input data value to a code value within the selected sub-range;
   modifying the set of code values in dependence upon the assigned code value and the size of the selected sub-range;
   detecting whether the range variable defining the set of code values is less than a predetermined minimum size and if so, successively increasing the range variable so as to increase the size of the set of code values until it has at least the predetermined minimum size; and outputting an encoded data bit in response to each such size-increasing operation; and
   after encoding a group of input data values, setting the range variable to a value selected from a predetermined subset of available range variable values, each value in the subset having at least one least significant bit equal to zero.
18. A method according to clause 17, in which:
   the proportions of the sub-ranges relative to the set of code values are defined by a context variable associated with the input data value.
19. A method according to clause 18, comprising the step of:
   following the coding of a data value, modifying the context variable, for use in respect of a next input data value, so as to increase the proportion of the set of code values in the sub-range that was selected for the current data value.
20. A method according to any one of clauses 17 to 19, in which:
   the set of code values comprises values from 0 to an upper value defined by the range variable, the upper value being between 256 and 510.
21. A method according to clause 20, in which: the subset of available values of the range variable comprises the value 256.

22. A method according to clause 20, in which:
the subset of available values comprises a set consisting of 256 and 384;
the step of setting the range variable comprises selecting a value from the subset according to a current value of the range variable, so that the range variable is set to 256 if the current value of the range variable is between 256 and 383, and the range variable is set to 384 if the current value of the range variable is between 384 and 510.

23. A method according to clause 20, in which:
the subset of available values comprises a set consisting of 256, 320, 384 and 448;
the step of setting the range variable comprises selecting a value from the subset according to a current value of the range variable, so that the range variable is set to 256 if the current value of the range variable is between 256 and 319, the range variable is set to 320 if the current value of the range variable is between 320 and 383,the range variable is set to 384 if the current value of the range variable is between 384 and 447, and the range variable is set to 448 if the current value of the range variable is between 448 and 510.

24. A method according to any one of clauses 17 to 23, comprising:
encoding data representing values which are not represented in a data set as bypass data;
detecting the quantity of bypass data associated with a current array; and
applying the setting step if the quantity of bypass data exceeds a threshold amount, but not applying the setting step otherwise.

25. A method according to any one of clauses 17 to 24, in which the data are encoded as transform units comprising a plurality of arrays of data values, the method comprising applying the setting step at the end of encoding a transform unit.

26. A method of encoding image data, comprising the steps of:
frequency-transforming input image data to generate an array of frequency-transformed input image coefficients by a matrix-multiplication process, according to a maximum dynamic range of the transformed data and using transform matrices having a data precision; and
selecting the maximum dynamic range and/or the data precision of the transform matrices according to the bit depth of the input image data.

27. Image data encoded by the encoding method of any one of the preceding clauses.

28. A data carrier storing video data according to clause 17.

29. A data decoding method for decoding data to provide an array of data values, the method comprising the steps of:
separating, from an input data stream, least-significant data portions of the data values and one or more encoded data sets;
decoding the data sets to generate most-significant data portions of the data values using binary decoding; and
combining the most-significant data portions and the least-significant data portions to form the data values, such that, for a data value, the respective most-significant data portion represent a plurality of most significant bits of that data value, and the respective least-significant data portion represents the remaining least significant bits of that data value.

30. A method of decoding image data, comprising the steps of:
frequency-transforming input frequency-transformed image data to generate array of output image data by a matrix-multiplication process, according to a maximum dynamic range of the transformed data and using transform matrices having a data precision; and
selecting the maximum dynamic range and/or the data precision of the transform matrices according to the bit depth of the output image data.

31. Computer software which, when executed by a computer, causes the computer to carry out the method of any one of the preceding clauses.

32. A non-transitory machine-readable storage medium on which computer software according to clause 31 is stored.

33. Data encoding apparatus for encoding a sequence of data values, the apparatus comprising:
a generator configured to generate, from the input data values, respective complementary most-significant data portions and least-significant data portions, such that the most-significant data portion of a value represents a plurality of most significant bits of that value, and the respective least-significant data portion represents the remaining least significant bits of that value and configured to generate one or more data sets indicative of positions, relative to the array of the values, of most-significant data portions of predetermined magnitudes; and
an encoder configured to encode the data sets to an output data stream using binary encoding and to include data defining the less-significant portions in the output data stream.

34. Data encoding apparatus for encoding image data, the apparatus comprising:
a frequency transformer configured to frequency-transform input image data to generate an array of frequency-transformed input image coefficients by a matrix-multiplication process, according to a maximum dynamic range of the transformed data and using transform matrices having a data precision; and
a selector configured to select the maximum dynamic range and/or the data precision of the transform matrices according to the bit depth of the input image data.

35. Data decoding apparatus for decoding data to provide an array of data values, the apparatus comprising the steps of:
a data separator configured to separate, from an input data stream, least-significant data portions of the data values and one or more encoded data sets;
a decoder configured to decode the data sets to generate most-significant data portions of the data values using binary decoding; and
a combiner configured to combine the most-significant data portions and the least-significant data portions to form the data values, such that, for a data value, the respective most-significant data portion represent a plurality of most significant bits of that data value, and the respective least-significant data portion represents the remaining least significant bits of that data value.

36. Image data decoding apparatus comprising:
a frequency transformed configured to frequency-transform input frequency-transformed image data to generate array of output image data by a matrix-multiplication process, according to a maximum dynamic range of the transformed data and using transform matrices having a data precision; and
a selector configured to select the maximum dynamic range and/or the data precision of the transform matrices according to the bit depth of the output image data.

37. Video data capture, transmission, display and/or storage apparatus comprising apparatus according to any one of clauses 33 to 36.

Further embodiments are defined by the following numbered clauses:

1. A method of data encoding input data values of a data set for encoding, the method comprising the steps of:

selecting one of a plurality of complementary sub-ranges of a set of code values according to the value of a current input data value, the set of code values being defined by a range variable;

assigning the current input data value to a code value within the selected sub-range;

modifying the set of code values in dependence upon the assigned code value and the size of the selected sub-range;

detecting whether the range variable defining the set of code values is less than a predetermined minimum size and if so, successively increasing the range variable so as to increase the size of the set of code values until it has at least the predetermined minimum size; and outputting an encoded data bit in response to each such size-increasing operation; and after encoding a group of input data values, setting the range variable to a value selected from a predetermined subset of available range variable values, each value in the subset having at least one least significant bit equal to zero.

2. A method according to clause 1, in which:

the proportions of the sub-ranges relative to the set of code values are defined by a context variable associated with the input data value.

3. A method according to clause 2, comprising the step of:

following the coding of an input data value, modifying the context variable, for use in respect of a next input data value, so as to increase the proportion of the set of code values in the sub-range that was selected for the current input data value.

4. A method according to any one of clauses 1 to 3, in which:

the set of code values comprises values from 0 to an upper value defined by the range variable, the upper value being between the predetermined minimum size and a second predetermined values.

5. A method according to clause 4, in which the predetermined minimum size is 256 and the second predetermined value is 510.

6. A method according to any one of clauses 1 to 5, in which; the subset of available values of the range variable comprises the predetermined minimum size.

7. A method according to any one of clauses 1 to 5, in which the subset comprises two or more values between the predetermined minimum size and the second predetermined value.

8. A method according to clause 7, in which the setting step comprises selecting a value from the subset according to a current value of the range variable.

9. A method according to clause 8, in which the setting step comprises selecting a particular value from the subset if the current value of the range variable is between that particular value and one less than a next-higher value in the subset.

10. A method according to any one of the preceding clauses, comprising:

encoding data representing coefficients which are not represented a data set as bypass data;

detecting the quantity of bypass data associated with a current array; and applying the setting step if the quantity of bypass data exceeds a threshold amount, but not applying the setting step otherwise.

11. A method according to any one of the preceding clauses, in which:

the input data values represent image data;

the image data are encoded as transform units comprising a plurality of arrays of coefficients, the method comprising applying the setting step at the end of encoding a transform unit.

12. Data encoded by the encoding method of any one of the preceding clauses.

13. A data carrier storing video data according to clause 12.

14. Data encoding apparatus for encoding input data values of a data set for encoding, the apparatus comprising:

a selector configured to select one of a plurality of complementary sub-ranges of a set of code values according to the value of a current input data value, the set of code values being defined by a range variable and to assign the current input data value to a code value within the selected sub-range;

a modifier configured to modify the set of code values in dependence upon the assigned code value and the size of the selected sub-range;

a detector configured to detect whether the range variable defining the set of code values is less than a predetermined minimum size and if so, to successively increase the range variable so as to increase the size of the set of code values until it has at least the predetermined minimum size; and outputting an encoded data bit in response to each such size-increasing operation; and a range variable setter configured, after encoding a group of input data values, to set the range variable to a value selected from a predetermined subset of available range variable values, each value in the subset having at least one least significant bit equal to zero.

15. Video data capture, transmission and/or storage apparatus comprising apparatus according to clause 14.

Further embodiments are defined by the following numbered clauses:

1. A data encoding method for encoding an array of data values, the method comprising the steps of:

generating, from the input data values, respective complementary most-significant data portions and least-significant data portions, such that the most-significant data portion of a value represents a plurality of most significant bits of that value, and the respective least-significant data portion is dependent upon the remaining least significant bits of that value;

generating one or more data sets indicative of positions, relative to the array of the values, of most-significant data portions of predetermined magnitude ranges;

encoding the data sets to an output data stream using binary encoding; and including data defining the least-significant portions in the output data stream.

2. A method according to clause 1, in which one of the data sets is a significance map indicative of positions, relative to an array of the data values, of most-significant data portions which are non-zero.

3. A method according to clause 2, in which the significance map comprises a data flag indicative of the position, according to a predetermined ordering of the array of data values, of the last of the most-significant data portions having a non-zero value.

4. A method according to clause 2 or clause 3, in which the data sets comprise:

a greater-than-one map indicative of positions, relative to the array of the data values, of most-significant data portions which are greater than 1; and a greater-than-two map indicative of positions, relative to the array of the data values, of most-significant data portions which are greater than 2.

5. A method according to clause 1, in which the data sets comprise:

a greater-than-one map indicative of positions, relative to an array of the data values, of most-significant data portions which are greater than or equal to 1; and a greater-than-two map indicative of positions, relative to the array of the data values, of most-significant data portions which are greater than or equal to 2.

6. A method according to clause 5, comprising the step of generating the data values from respective input values by:

generating a further data set, the further data set being a significance map indicative of positions, relative to the array of input values, of non-zero input values; and subtracting 1 from each input value to generate a respective data value.

7. A method according to clause 5 or clause 6, in which the significance map comprises a data flag indicative of the position, according to a predetermined ordering of the array of input values, of the last of the input values having a non-zero value.

8. A method according to any one of the preceding clauses, in which the step of including data defining the least-significant data portions in the output data stream comprises encoding the least-significant data portions using arithmetic coding in which symbols representing the least-significant data portions are encoded according to respective proportions of a coding value range, in which the respective proportions of the coding value range for each of the symbols that describe the least-significant data portion are of equal size.

9. A method according to any one of clauses 1 to 8, in which the step of including data defining the least-significant portions in the output data stream comprises directly including the least-significant data portions in the output data stream as raw data.

10. A method according to any one of the preceding clauses, in which:

the sequence of data values represent image data having an image data bit depth; and the method comprises setting the number of bits to be used as the plurality of most significant bits in each most-significant data portion to be equal to the image data bit depth.

11. A method according to any one of the preceding clauses, in which the sequence of data values represents a sequence of frequency transformed image coefficients.

12. A method according to clause 11, in which the frequency-transformed input image coefficients are quantised frequency-transformed input image coefficients according to a variable quantisation parameter selected from a range of available quantisation parameters, the method comprising:

encoding the array of frequency-transformed input image coefficients according to the most-significant data portions and the least-significant data portions for coefficients produced using a quantisation parameter in a first predetermined sub-range of the range of available quantisation parameters; and for coefficients produced using a quantisation parameter not in the first predetermined sub-range of the range of available quantisation parameters, encoding the array of frequency-transformed input image coefficients such that the number of bits in each most-significant data portion equals the number of bits of that coefficient and the respective least-significant data portion contains no bits.

13. A method according to clause 11, comprising the steps of:

frequency-transforming input image data to generate an array of frequency-transformed input image coefficients by a matrix-multiplication process, according to a maximum dynamic range of the transformed data and using transform matrices having a data precision; and selecting the maximum dynamic range and/or the data precision of the transform matrices according to the bit depth of the input image data.

14. A method according to clause 13, in which the selecting step comprises:

setting the data precision of the transform matrices to a first offset number of bits less than the bit depth of the input image data; and setting the maximum dynamic range of the transformed data to a second offset number of bits greater than the bit depth of the input image data.

15. A method according to clause 14, in which the first offset number of bits is equal to 2 and the second offset number of bits is equal to 5.

16. A method according to clause 14, in which the first offset number of bits is equal to 2 and the second offset number of bits is equal to 6.

17. A method according to clause 14, in which the second offset number is dependent upon the matrix size of the transform matrices.

18. A method according to any one of clauses 13 to 17, comprising the step of:

deriving transform matrices at a required data precision from respective source transform matrices at a different data precision.

19. A data encoding method for encoding an array of data values as data sets and escape codes for values not encoded by the data sets, an escape code comprising a unary coded portion and a non-unary coded portion, the method comprising the steps of:

setting a coding parameter defining a minimum number of bits of a non-unary coded portion, the coding parameter being between 0 and a predetermined upper limit;

adding an offset value of 1 or more to the coding parameter so as to define a minimum least significant data portion size;

generating one or more data sets indicative of positions, relative to the array of data values, of data values of predetermined magnitude ranges, so as to encode the value of at least one least significant bit of each data value;

generating, from at least the part of each data value not encoded by the one or more data sets, respective complementary most-significant data portions and least-significant data portions, such that the most-significant data portion of a value represents zero or more most significant bits of that portion, and the respective least-significant data portion represents a number of least significant bits of that part, the number of least significant bits being greater than or equal to the minimum least significant data portion size;

encoding the data sets to an output data stream;

encoding the most significant data portions to the output data stream; and encoding the least-significant portions to the output data stream.

20. A method according to clause 19, in which:
the step of encoding the most significant data portions to the output data stream comprises encoding the most significant data portions to the output data stream using a unary code; and
the step of encoding the least-significant portions to the output data stream comprises encoding the least-significant portions to the output data stream using a non-unary code.

21. A method according to clause 19 or clause 20, in which the step of encoding the data sets to an output data stream comprises encoding the data sets to an output data stream using a binary code.

22. A method according to any one of clauses 19 to 21, in which the setting step comprises incrementing the coding parameter in dependence upon the magnitude of a current data value in the array.

23. A method according to any one of clauses 20 to 22, in which the steps of encoding the most significant data portion and the least significant data portion comprise encoding the encoding the most significant data portion and the least significant data portion using a Golomb-Rice code or an exponential Golomb code.

24. A method according to clause 23, in which:
the suffix length of the Golomb-Rice code is equal to the minimum least significant data portion size; and
the exponential Golomb code has an order equal to the minimum least significant data portion size.

25. A method according to any one of clauses 19 to 24, comprising the step of generating the offset value in dependence upon a parameter of the array of data values.

26. A method according to clause 25, in which the parameter of the array of data values comprises one or more selected from the list consisting of:
the number of data values in the array;
a type of data represented by the data values;
a quantisation parameter applicable to the array of data values; and
an encoding mode.

27. A method according to any one of clauses 19 to 26, comprising the step of including data in a data header defining the offset value.

28. A method according to clause 1, in which the encoding step comprises:
selecting one of a plurality of complementary sub-ranges of a set of code values according to the value of a current input data value of a data set for encoding, the set of code values being defined by a range variable;
assigning the current input data value to a code value within the selected sub-range;
modifying the set of code values in dependence upon the assigned code value and the size of the selected sub-range;
detecting whether the range variable defining the set of code values is less than a predetermined minimum size and if so, successively increasing the range variable so as to increase the size of the set of code values until it has at least the predetermined minimum size; and outputting an encoded data bit in response to each such size-increasing operation; and
after encoding a group of input data values, setting the range variable to a value selected from a predetermined subset of available range variable values, each value in the subset having at least one least significant bit equal to zero.

29. A method according to clause 28, in which:
the proportions of the sub-ranges relative to the set of code values are defined by a context variable associated with the input data value.

30. A method according to clause 29, comprising the step of:
following the coding of a data value, modifying the context variable, for use in respect of a next input data value, so as to increase the proportion of the set of code values in the sub-range that was selected for the current data value.

31. A method according to any one of clauses 28 to 30, in which:
the set of code values comprises values from 0 to an upper value defined by the range variable, the upper value being between 256 and 510.

32. A method according to clause 31, in which:
the subset of available values of the range variable comprises the value 256.

33. A method according to clause 31, in which:
the subset of available values comprises a set consisting of 256 and 384;
the step of setting the range variable comprises selecting a value from the subset according to a current value of the range variable, so that the range variable is set to 256 if the current value of the range variable is between 256 and 383, and the range variable is set to 384 if the current value of the range variable is between 384 and 510.

34. A method according to clause 31, in which:
the subset of available values comprises a set consisting of 256, 320, 384 and 448;
the step of setting the range variable comprises selecting a value from the subset according to a current value of the range variable, so that the range variable is set to 256 if the current value of the range variable is between 256 and 319, the range variable is set to 320 if the current value of the range variable is between 320 and 383, the range variable is set to 384 if the current value of the range variable is between 384 and 447, and the range variable is set to 448 if the current value of the range variable is between 448 and 510.

35. A method according to any one of clauses 28 to 34, comprising:
encoding data representing values which are not represented in a data set as bypass data;
detecting the quantity of bypass data associated with a current array; and
applying the setting step if the quantity of bypass data exceeds a threshold amount, but not applying the setting step otherwise.

36. A method according to any one of clauses 28 to 35, in which the data are encoded as transform units comprising a plurality of arrays of data values, the method comprising applying the setting step at the end of encoding a transform unit.

37. A method of encoding image data, comprising the steps of:
frequency-transforming input image data to generate an array of frequency-transformed input image coefficients by a matrix-multiplication process, according to a maximum dynamic range of the transformed data and using transform matrices having a data precision; and
selecting the maximum dynamic range and/or the data precision of the transform matrices according to the bit depth of the input image data.

38. A method according to clause 37, in which, for input image data having image components of different bit depths, the selecting step comprises selecting a single set of the maximum dynamic range and/or the data precision of the transform matrices for use with all of the image components.

39. A method according to clause 38, in which the selecting step comprises selecting, as the single set of the maximum dynamic range and/or the data precision of the transform matrices, those values relating to that one of the image components having the greatest bit depth.

40. Image data encoded by the encoding method of any one of the preceding clauses.

41. A data carrier storing image data according to clause 40.

42. A data decoding method for decoding data to provide an array of data values, the method comprising the steps of:
separating, from an input data stream, least-significant data portions of the data values and one or more encoded data sets;
decoding the data sets to generate most-significant data portions of the data values using binary decoding; and
combining the most-significant data portions and the least-significant data portions to form the data values, such that, for a data value, the respective most-significant data portion represent a plurality of most significant bits of that data value, and the respective least-significant data portion is dependent upon the remaining least significant bits of that data value.

43. A data decoding method for decoding input data to provide an array of data values, the input data being encoded as data sets and escape codes for values not encoded by the data sets, an escape code comprising a unary coded portion and a non-unary coded portion, the method comprising the steps of:
setting a coding parameter defining a minimum number of bits of a non-unary coded portion, the coding parameter being between 0 and a predetermined upper limit;
adding an offset value of 1 or more to the coding parameter so as to define a minimum least significant data portion size;
decoding one or more data sets indicative of positions, relative to the array of data values, of data values of predetermined magnitude ranges, so as to decode the value of at least one least significant bit of each data value;
decoding at least the part of each data value not encoded by the one or more data sets from the unary coded portion and the non-unary coded portion respective complementary most-significant data portions and least-significant data portions, such that the most-significant data portion of a value represents zero or more most significant bits of that portion, and the respective least-significant data portion represents a number of least significant bits of that part, the number of least significant bits being greater than or equal to the minimum least significant data portion size.

44. A method of decoding image data, comprising the steps of:
frequency-transforming input frequency-transformed image data to generate array of output image data by a matrix-multiplication process, according to a maximum dynamic range of the transformed data and using transform matrices having a data precision; and
selecting the maximum dynamic range and/or the data precision of the transform matrices according to the bit depth of the output image data.

45. A method according to clause 44, in which, for input image data having image components of different bit depths, the selecting step comprises selecting a single set of the maximum dynamic range and/or the data precision of the transform matrices for use with all of the image components.

46. A method according to clause 45, in which the selecting step comprises selecting, as the single set of the maximum dynamic range and/or the data precision of the transform matrices, those values relating to that one of the image components having the greatest bit depth.47.

Computer software which, when executed by a computer, causes the computer to carry out the method of any one of clauses 1 to 39 and 42 to 46.

48. A non-transitory machine-readable storage medium on which computer software according to clause 47 is stored.

49. Data encoding apparatus for encoding a sequence of data values, the apparatus comprising:
a generator configured to generate, from the input data values, respective complementary most-significant data portions and least-significant data portions, such that the most-significant data portion of a value represents a plurality of most significant bits of that value, and the respective least-significant data portion is dependent upon the remaining least significant bits of that value and configured to generate one or more data sets indicative of positions, relative to the array of the values, of most-significant data portions of predetermined magnitude ranges; and
an encoder configured to encoding the data sets to an output data stream using binary encoding and to include data defining the least-significant portions in the output data stream.

50. Data encoding apparatus for encoding an array of data values as data sets and escape codes for values not encoded by the data sets, an escape code comprising a unary coded portion and a non-unary coded portion, the apparatus comprising:
a processor configured to:
set a coding parameter defining a minimum number of bits of a non-unary coded portion, the coding parameter being between 0 and a predetermined upper limit;
add an offset value of 1 or more to the coding parameter so as to define a minimum least significant data portion size;
generate one or more data sets indicative of positions, relative to the array of data values, of data values of predetermined magnitude ranges, so as to encode the value of at least one least significant bit of each data value; and
generate, from at least the part of each data value not encoded by the one or more data sets, respective complementary most-significant data portions and least-significant data portions, such that the most-significant data portion of a value represents zero or more most significant bits of that portion, and the respective least-significant data portion represents a number of least significant bits of that part, the number of least significant bits being greater than or equal to the minimum least significant data portion size;
and an encoder configured to:
encode the data sets to an output data stream;
encode the most significant data portions to the output data stream; and
encode the least-significant portions to the output data stream.

51. Data encoding apparatus for encoding image data, the apparatus comprising:
a frequency transformer configured to frequency-transform input image data to generate an array of frequency-transformed input image coefficients by a matrix-multiplication process, according to a maximum dynamic range of the transformed data and using transform matrices having a data precision; and
a selector configured to select the maximum dynamic range and/or the data precision of the transform matrices according to the bit depth of the input image data.

52. Apparatus according to clause 51, in which, for input image data having image components of different bit depths, the selector is configured to select a single set of the maximum dynamic range and/or the data precision of the transform matrices for use with all of the image components.

53. Apparatus according to clause 52, in which the selector is configured to select, as the single set of the maximum dynamic range and/or the data precision of the transform matrices, those values relating to that one of the image components having the greatest bit depth.

54. Data decoding apparatus for decoding data to provide an array of data values, the apparatus comprising the steps of:
a data separator configured to separate, from an input data stream, least-significant data portions of the data values and one or more encoded data sets;
a decoder configured to decode the data sets to generate most-significant data portions of the data values using binary decoding; and
a combiner configured to combine the most-significant data portions and the least-significant data portions to form the data values, such that, for a data value, the respective most-significant data portion represent a plurality of most significant bits of that data value, and the respective least-significant data portion represents the remaining least significant bits of that data value.

55. Data decoding apparatus for decoding input data to provide an array of data values, the input data being encoded as data sets and escape codes for values not encoded by the data sets, an escape code comprising a unary coded portion and a non-unary coded portion, the apparatus comprising:
a processor operable to set a coding parameter defining a minimum number of bits of a non-unary coded portion, the coding parameter being between 0 and a predetermined upper limit; to add an offset value of 1 or more to the coding parameter so as to define a minimum least significant data portion size; to decode one or more data sets indicative of positions, relative to the array of data values, of data values of predetermined magnitude ranges, so as to decode the value of at least one least significant bit of each data value; and to decode at least the part of each data value not encoded by the one or more data sets from the unary coded portion and the non-unary coded portion respective complementary most-significant data portions and least-significant data portions, such that the most-significant data portion of a value represents zero or more most significant bits of that portion, and the respective least-significant data portion represents a number of least significant bits of that part, the number of least significant bits being greater than or equal to the minimum least significant data portion size.

56. Image data decoding apparatus comprising:
a frequency transformed configured to frequency-transform input frequency-transformed image data to generate array of output image data by a matrix-multiplication process, according to a maximum dynamic range of the transformed data and using transform matrices having a data precision; and
a selector configured to select the maximum dynamic range and/or the data precision of the transform matrices according to the bit depth of the output image data.

57. Apparatus according to clause 56, in which, for input image data having image components of different bit depths, the selector is configured to select a single set of the maximum dynamic range and/or the data precision of the transform matrices for use with all of the image components.

58. Apparatus according to clause 57, in which the selector is configured to select, as the single set of the maximum dynamic range and/or the data precision of the transform matrices, those values relating to that one of the image components having the greatest bit depth.

59. Video data capture, transmission, display and/or storage apparatus comprising apparatus according to any one of clauses 49 to 58.

As discussed earlier, it will be appreciated that apparatus features of the above clause may be implemented by respective features of the encoder or decoder as discussed earlier.

The invention claimed is:

1. A method of encoding image data, comprising:
frequency-transforming input image data to generate an array of frequency-transformed image coefficients by a matrix-multiplication process based on a maximum dynamic range of frequency-transformed data;
selecting, based on an encoding profile for the input image data, the maximum dynamic range of the transformed data by an offset number added, by circuitry, to the bit depth of the image data, the bit depth corresponding to the encoding profile; and
encoding the image data based on the maximum dynamic range,
wherein the offset number has a number of bits which is less than the bit depth of the image data before the offset number is added to the bit depth of the image data.

2. The method as claimed in claim 1, the offset number causing the maximum dynamic range to increase beyond 16.

3. The method as claimed in claim 2, further comprising using the increasing of the maximum dynamic range beyond 16 as an increased internal accuracy for encoding circuitry.

4. The method as claimed in claim 1, wherein the offset number is 5.

5. The method as claimed in claim 1, wherein the offset number is 6.

6. The method as claimed in claim 1, wherein the maximum dynamic range is different as between luminance samples and chrominance samples.

7. The method as claimed in claim 1, further comprising using a frequency transform matrix with a precision of 14 bits for an encoding profile having a bit depth of 16 bits.

8. The method as claimed in claim 2, wherein for at least one encoding profile the maximum dynamic range is capped at a threshold number and for at least one other encoding profile, the maximum dynamic range is increased beyond the threshold by the offset number.

9. A non-transitory storage medium including computer program instructions, which when executed by a computer causes the computer to perform the method of claim 8.

10. A data encoding apparatus for encoding image data, comprising circuitry configured to:
frequency-transform input image data to generate an array of frequency-transformed image coefficients by a matrix-multiplication process based on a maximum dynamic ranged of frequency-transformed data,
select, based on an encoding profile for the input image data, the maximum dynamic range of the transformed data by an offset number added to the bit depth of the image data, the bit depth corresponding to the encoding profile, and
encode the image data based on the maximum dynamic range,
wherein the offset number has a number of bits which is less than the bit depth of the image data before the offset number is added to the bit depth of the image data.

11. A method of decoding image data, comprising:

frequency-transforming input frequency-transformed image data to generate an array of output image data by a matrix-multiplication process based on a maximum dynamic range of frequency-transformed data;

selecting, based on an encoding profile for the input image data, the maximum dynamic range of the transformed data by an offset number added, by circuitry, to the bit depth of the image data, the bit depth corresponding to the encoding profile; and decoding the image data using the maximum dynamic range, wherein the offset number has a number of bits which is less than the bit depth of the image data before the offset number is added to the bit depth of the image data.

12. The data encoding apparatus as claimed in claim 11, wherein the circuitry is configured for at least one encoding profile to cap the maximum dynamic range at a threshold number and for at least one other encoding profile, to increase the maximum dynamic range beyond the threshold by the offset number.

13. The method as claimed in claim 11, the offset number causing the maximum dynamic range to increase beyond 16.

14. The method as claimed in claim 13, further comprising using the increasing of the maximum dynamic range beyond 16 as an increased internal accuracy for decoding circuitry.

15. The method as claimed in claim 11, wherein the offset number is 5.

16. The method as claimed in claim 11, wherein the offset number is 6.

17. The method as claimed in claim 11, wherein the maximum dynamic range is different as between luminance samples and chrominance samples.

18. The method as claimed in claim 11, wherein, for at least one encoding profile, the maximum dynamic range is capped at a threshold number and, for at least one other encoding profile, the dynamic range is increased beyond the threshold by the offset number.

19. A non-transitory storage medium including computer program instructions, which when executed by a computer causes the computer to perform the method of claim 11.

20. A data decoding apparatus for decoding image data, comprising circuitry configured to:

frequency-transform input frequency-transformed image data to generate an array of output image data by a matrix-multiplication process based on a maximum dynamic range of frequency-transformed data, select, based on an encoding profile for the input image data, the maximum dynamic range of the transformed data by an offset number added, by circuitry, to the bit depth of the image data, the bit depth corresponding to the encoding profile, and decode the image data using the maximum dynamic range, wherein the offset number has a number of bits which is less than the bit depth of the image data before the offset number is added to the bit depth of the image data.

21. The data decoding apparatus as claimed in claim 20, wherein the offset number is one of 5 or 6.

22. The data decoding apparatus as claimed in 20, wherein for at least one encoding profile the circuitry is configured to cap the maximum dynamic range at a threshold number and for at least one other encoding profile; the circuitry is configured increase the maximum dynamic range beyond the threshold by the offset number.

23. An image data receiving apparatus comprising an interface for receiving frequency transformed image data and comprising the data decoding apparatus as claimed claim 20.

* * * * *